(12) United States Patent
Yoshino

(10) Patent No.: US 11,181,820 B2
(45) Date of Patent: Nov. 23, 2021

(54) ACTINIC RAY-SENSITIVE OR RADIATION-SENSITIVE RESIN COMPOSITION, PATTERN FORMING METHOD, AND METHOD FOR MANUFACTURING ELECTRONIC DEVICE

(71) Applicant: FUJIFILM Corporation, Tokyo (JP)

(72) Inventor: Fumihiro Yoshino, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 380 days.

(21) Appl. No.: 15/968,366

(22) Filed: May 1, 2018

(65) Prior Publication Data

US 2018/0246406 A1 Aug. 30, 2018

Related U.S. Application Data

(63) Continuation of application No. PCT/JP2016/082497, filed on Nov. 1, 2016.

(30) Foreign Application Priority Data

Nov. 5, 2015 (JP) ............................. JP2015-217806

(51) Int. Cl.
| | |
|---|---|
| *G03F 7/004* | (2006.01) |
| *G03F 7/039* | (2006.01) |
| *G03F 7/038* | (2006.01) |
| *G03F 7/16* | (2006.01) |
| *G03F 7/20* | (2006.01) |
| *G03F 7/32* | (2006.01) |
| *G03F 7/38* | (2006.01) |
| *G03F 7/40* | (2006.01) |

(52) U.S. Cl.
CPC .......... *G03F 7/0045* (2013.01); *G03F 7/0046* (2013.01); *G03F 7/038* (2013.01); *G03F 7/039* (2013.01); *G03F 7/0392* (2013.01); *G03F 7/0397* (2013.01); *G03F 7/162* (2013.01); *G03F 7/168* (2013.01); *G03F 7/2006* (2013.01); *G03F 7/322* (2013.01); *G03F 7/38* (2013.01); *G03F 7/40* (2013.01)

(58) Field of Classification Search
None
See application file for complete search history.

(56) References Cited

U.S. PATENT DOCUMENTS

| | | | | |
|---|---|---|---|---|
| 5,338,641 A | * | 8/1994 | Pawlowski | G03F 7/0163 430/165 |
| 5,569,784 A | * | 10/1996 | Watanabe | C07C 381/12 564/430 |
| 5,624,787 A | * | 4/1997 | Watanabe | G03F 7/0045 430/270.1 |
| 2003/0194636 A1 | * | 10/2003 | Wanat | G03F 7/0048 430/191 |
| 2003/0224288 A1 | | 12/2003 | Kodama | |
| 2004/0234888 A1 | | 11/2004 | Lamanna | |
| 2006/0194140 A1 | | 8/2006 | Shimbori | |
| 2008/0248273 A1 | | 10/2008 | Aiki et al. | |
| 2009/0023102 A1 | | 1/2009 | Shimbori et al. | |
| 2011/0081612 A1 | | 4/2011 | Fujii et al. | |
| 2014/0120473 A1 | | 5/2014 | Aoyagi | |
| 2014/0248556 A1 | | 9/2014 | Kato et al. | |
| 2015/0048051 A1 | | 2/2015 | Katsura et al. | |
| 2015/0329735 A1 | | 11/2015 | Nakamura et al. | |
| 2016/0266489 A1 | | 9/2016 | Katsura et al. | |

FOREIGN PATENT DOCUMENTS

| | | |
|---|---|---|
| CN | 1802607 A | 7/2006 |
| CN | 101068853 A | 11/2007 |
| CN | 103608704 A | 2/2014 |
| CN | 104067174 A | 9/2014 |
| CN | 104955850 A | 9/2015 |
| JP | 2004-139014 A | 5/2004 |
| JP | 2004-302434 A | 10/2004 |
| JP | 2007-206425 A | 8/2007 |
| JP | 2009-265609 A | 11/2009 |
| JP | 2012-137686 A | 7/2012 |

(Continued)

OTHER PUBLICATIONS

Crivello, James V. "Highlight: The Discovery and Development of Onium Salt Cationic Photoinitiators", Journal of Polymer Science: Part A: Polymer Chemistry, vol. 37, pp. 4241-4254, year 1999. (Year: 1999).*

English translation of JP 2012-137686 A generated from One Portal Dossier (OPD) J=PlatPat [JPP], 113 pages, generated Jun. 9, 2020. (Year: 2020).*

Communication dated Aug. 6, 2019, issued by the Japanese Patent Office in counterpart Japanese Machine Application No. 2017-548783.

Communication dated Feb. 12, 2020, issued by the Taiwanese Patent Office in counterpart Taiwanese Application No. 105135634.

Office Action dated Jul. 15, 2019 by the Korean Intellectual Property Office in counterpart Korean Patent Machine Application No. 10-2018-7011881.

(Continued)

*Primary Examiner* — Cynthia Hamilton

(74) *Attorney, Agent, or Firm* — Sughrue Mion, PLLC

(57) ABSTRACT

Provided are an actinic ray-sensitive or radiation-sensitive resin composition, used for forming an actinic ray-sensitive or radiation-sensitive film having a film thickness of 1 μm or more, and for being exposed to actinic rays having a wavelength of 200 to 300 nm or radiation, in which the transmittance, with respect to light at a wavelength of 248 nm, of an actinic ray-sensitive or radiation-sensitive film having a film thickness of 12 μm, which is formed using the actinic ray-sensitive or radiation-sensitive resin composition, is 5% or more, and a pattern having an excellent sensitivity as well as an excellent cross-sectional shape can be formed by the actinic ray-sensitive or radiation-sensitive resin composition in a case where an actinic ray-sensitive or radiation-sensitive film having a film thickness of 1 μm or more is exposed to light at a wavelength of 200 to 300 nm.

7 Claims, No Drawings

(56) References Cited

FOREIGN PATENT DOCUMENTS

| | | |
|---|---|---|
| JP | 2015-57638 A | 3/2015 |
| JP | 2016-133743 A | 7/2016 |
| KR | 10-2004-0002488 A | 1/2004 |
| KR | 10-2008-0081370 A | 9/2008 |
| TW | 200307177 A | 12/2003 |
| TW | 200745757 A | 12/2007 |
| WO | 2004/092831 A2 | 10/2004 |
| WO | 2007/088884 A1 | 8/2007 |
| WO | WO-2013047911 A1 * 4/2013 ........... G03F 7/0397 |

OTHER PUBLICATIONS

Search Report dated Jan. 24, 2017, issued by the International Searching Authority in counterpart International Patent Application No. PCT/JP2016/082497 (PCT/ISA/210).
Written Opinion dated Jan. 24, 2017, issued by the International Searching Authority in counterpart International Patent Application No. PCT/JP2016/082497 (PCT/ISA/237).
IPRP dated May 8, 2018, issued by the International Searching Authority in counterpart International Patent Application No. PCT/JP2016/082497 (PCT/IB/373).
Communication dated Mar. 19, 2019, issued by the Japanese Patent Office in counterpart Japanese Application No. 2017-548783.
Communication dated Jan. 7, 2020, issued by the Korean Intellectual Property Office in corresponding Korean Application No. 10-2018-7011881.
Office Action dated Sep. 15, 2020 by the State Intellectual Property Office of P.R. China in counterpart Chinese Patent Application No. 201680062519.X.
Office Action dated Jan. 14, 2021, issued by the Taiwanese Patent Office in counterpart Taiwanese English Patent Application No. 109124495.
Office Action dated Apr. 26, 2021, from The China National Intellectual Property Administration in Chinese Application No. 201680062519.X.
Office Action dated Aug. 19, 2021 by the State Intellectual Property Office of P.R. China in counterpart Chinese Patent Application No. 201680062519.X.

* cited by examiner

ACTINIC RAY-SENSITIVE OR RADIATION-SENSITIVE RESIN COMPOSITION, PATTERN FORMING METHOD, AND METHOD FOR MANUFACTURING ELECTRONIC DEVICE

CROSS REFERENCE TO RELATED APPLICATIONS

This is a continuation of International Application No. PCT/JP2016/082497 filed on Nov. 1, 2016 and claims priority from Japanese Patent Application No. 2015-217806 filed on Nov. 5, 2015, the entire disclosures of which are incorporated herein by reference.

BACKGROUND OF THE INVENTION

1. Field of the Invention

The present invention relates to an actinic ray-sensitive or radiation-sensitive resin composition as well as a pattern forming method and a method for manufacturing an electronic device, each using the same. More specifically, the present invention relates to an actinic ray-sensitive or radiation-sensitive resin composition which is used in a process for manufacturing a semiconductor such as an IC, in a process for manufacturing a circuit board for a liquid crystal, a thermal head, or the like, and in other lithographic processes for photofabrication, or in a planographic printing plate or an acid-curable composition, as well as a pattern forming method and a method for manufacturing an electronic device, each using the same.

2. Description of the Related Art

A chemical amplification-type resist composition is a pattern forming material that generates an acid at an exposed area upon exposure to radiation such as far ultraviolet rays, and by a reaction catalyzed by the acid, changes the solubility in a developer in an area irradiated with actinic radiation and an area not irradiated with actinic radiation, thereby forming a pattern on a substrate.

For example, a pattern forming method in which a thick resist film having a film thickness of 1 to 15 μm is formed using a specific positive tone resist composition, and the thick resist film is selectively exposed and then subjected to alkali development to form a resist pattern is known in the related art (see, for example, JP2007-206425A).

SUMMARY OF THE INVENTION

On the other hand, as various electronic devices have recently been requested to have higher functions, there has been a demand for a further improvement in the characteristics of a resist pattern for use in fine processing.

Under these circumstances, the present inventors have investigated a resist composition for forming a thick resist film, and have thus found that there is a demand for a further improvement in the sensitivity and the cross-sectional shape of a pattern in a case of performing exposure with light at a wavelength of 200 to 300 nm.

An object of the present invention is to solve the problems, and thus provide an actinic ray-sensitive or radiation-sensitive resin composition capable of forming a pattern having an excellent sensitivity as well as an excellent cross-sectional shape in a case where an actinic ray-sensitive or radiation-sensitive film having a film thickness of 1 μm or more is exposed to light at a wavelength of 200 to 300 nm, as well as a pattern forming method and a method for manufacturing an electronic device, each using the same.

That is, the present inventors have found that the object can be achieved by the following configurations.

[1] An actinic ray-sensitive or radiation-sensitive resin composition, used for forming an actinic ray-sensitive or radiation-sensitive film having a film thickness of 1 μm or more, and for being exposed to actinic rays having a wavelength of 200 to 300 nm or radiation,
in which the transmittance, with respect to light at a wavelength of 248 nm, of an actinic ray-sensitive or radiation-sensitive film having a film thickness of 12 μm, which is formed using the actinic ray-sensitive or radiation-sensitive resin composition, is 5% or more.

[2] The actinic ray-sensitive or radiation-sensitive resin composition as described in [1], comprising:
a resin (A); and
a compound (B) that generates an acid upon irradiation with actinic rays or radiation,
in which a compound represented by General Formula (ZI-3) is contained as the compound (B),

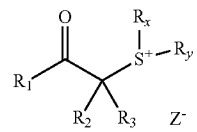

(ZI-3)

in General Formula (ZI-3),
$R_1$ represents an alkyl group, a cycloalkyl group, an alkoxy group, a cycloalkoxy group, an aryl group, or an alkenyl group,
$R_2$ and $R_3$ each independently represent a hydrogen atom, an alkyl group, a cycloalkyl group, or an aryl group, $R_2$ and $R_3$ may be linked to each other to form a ring, and $R_1$ and $R_2$ may be linked to each other to form a ring,
$R_x$ and $R_y$ each independently represent an alkyl group, a cycloalkyl group, an alkenyl group, or an aryl group, $R_x$ and $R_y$ may be linked to each other to form a ring, and this ring structure may include an oxygen atom, a nitrogen atom, a sulfur atom, a ketone group, an ether bond, an ester bond, or an amide bond, and
$Z^-$ represents a non-nucleophilic anion.

[3] The actinic ray-sensitive or radiation-sensitive resin composition as described in [2],
in which $Z^-$ is an anion represented by any one of General Formulae (2) to (4),

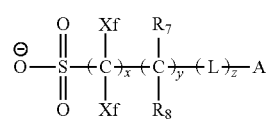

(2)

in the general formula,
Xf's each independently represent a fluorine atom, or an alkyl group substituted with at least one fluorine atom and Xf's that are present in plural numbers may be the same as or different from each other,
$R_7$ and $R_8$ each independently represent a hydrogen atom, fluorine atom, an alkyl group, or an alkyl group substituted with at least one fluorine atom, and in a case where $R_7$'s and $R_8$'s are present in plural numbers, they may be the same as or different from each other, L represents a divalent linking group, and in a case where L's are present in plural numbers, they may be the same as or different from each other, A represents an organic group including a cyclic structure, and x represents an integer of 1 to 20, y represents an integer of 0 to 10, and z represents an integer of 0 to 10,

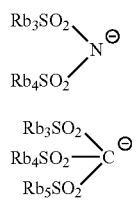

(3)

(4)

in the formulae, $Rb_3$ to $Rb_5$ each independently represent an alkyl group, a cycloalkyl group, or an aryl group, and $Rb_3$ and $Rb_4$ may be bonded to each other to form a ring structure.

[4] The actinic ray-sensitive or radiation-sensitive resin composition as described in any one of [1] to [3], further comprising a resin having a repeating unit represented by General Formula (AI) or (A),

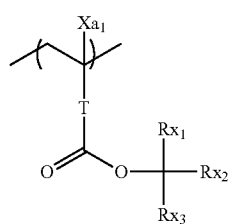

(AI)

in the formula, $Xa_1$ represents a hydrogen atom or an alkyl group,

T represents a single bond or a divalent linking group, $Rx_1$ to $Rx_3$ each independently represent an alkyl group or a cycloalkyl group, and two of $Rx_1$ to $Rx_3$ may be bonded to each other to form a cycloalkyl group,

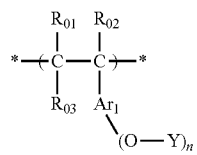

(A)

in the formula. $R_{01}$, $R_{02}$, and $R_{03}$ each independently represent, for example, a hydrogen atom, an alkyl group, a cycloalkyl group, a halogen atom, a cyano group, or an alkoxycarbonyl group, $Ar_1$ represents an aromatic ring group, and $R_{03}$ may represent an alkylene group and be bonded to $Ar_1$ to form a 5- or 6-membered ring together with a —C—C— chain, n Y's each independently represent a hydrogen atom or a group that leaves by the action of an acid, provided that at least one of Y's represents a group that leaves by the action of an acid, and n represents an integer of 1 to 4.

[5] The actinic ray-sensitive or radiation-sensitive resin composition as described in [4], in which the group that leaves by the action of an acid as at least one of Y's is a structure represented by General Formula (B),

(B)

in the formula, $L_1$ and $L_2$ each independently represent a hydrogen atom, an alkyl group, a cycloalkyl group, an aryl group, or an aralkyl group.

M represents a single bond or a divalent linking group,

Q represents an alkyl group, a cycloalkyl group, a cyclic aliphatic group, an aromatic ring group, an amino group, an ammonium group, a mercapto group, a cyano group, or an aldehyde group, and the cyclic aliphatic group and the aromatic ring group may include a heteroatom, and at least two of Q, M, and $L_1$ may be bonded to each other to form a 5- or 6-membered ring.

[6] A pattern forming method comprising:

(i) a step of forming an actinic ray-sensitive or radiation-sensitive film having a film thickness of 1 μm or more on a substrate, using an actinic ray-sensitive or radiation-sensitive resin composition;

(ii) a step of irradiating the actinic ray-sensitive or radiation-sensitive film with actinic rays having a wavelength of 200 to 300 nm or radiation; and (iii) a step of developing the actinic ray-sensitive or radiation-sensitive film irradiated with actinic rays or radiation with a developer, in which the actinic ray-sensitive or radiation-sensitive resin composition is an actinic ray-sensitive or radiation-sensitive resin composition containing a resin (A) and a compound (B) that generates an acid upon irradiation with actinic rays or radiation, and containing a compound represented by General Formula (ZI-3) as the compound (B),

(ZI-3)

in General Formula (ZI-3).

$R_1$ represents an alkyl group, a cycloalkyl group, an alkoxy group, a cycloalkoxy group, an aryl group, or an alkenyl group.

$R_2$ and $R_3$ each independently represent a hydrogen atom, an alkyl group, a cycloalkyl group, or an aryl group, $R_2$ and $R_3$ may be linked to each other to form a ring, and $R_1$ and $R_2$ may be linked to each other to form a ring, $R_x$ and $R_y$ each independently represent an alkyl group, a cycloalkyl group, an alkenyl group, or an aryl group, $R_x$ and $R_y$ may be linked to each other to form a ring, and this ring structure may include an oxygen atom, a nitrogen atom, a sulfur atom, a ketone group, an ether bond, an ester bond, or an amide bond, and $Z^-$ represents a non-nucleophilic anion.

[7] A method for manufacturing an electronic device, comprising the pattern forming method as described in [6].

As shown below, according to the present invention, it is possible to provide an actinic ray-sensitive or radiation-sensitive resin composition capable of forming a pattern having an excellent sensitivity as well as an excellent cross-sectional shape in a case where an actinic ray-sensitive or radiation-sensitive film having a film thickness of 1 µm or more is exposed to light at a wavelength of 200 to 300 nm, as well as a pattern forming method and a method for manufacturing an electronic device, each using the same.

DESCRIPTION OF THE PREFERRED EMBODIMENTS

Hereinafter, embodiments of the present invention will be described in detail.

In citations for a group (atomic group) in the present specification, in a case where the group is denoted without specifying whether it is substituted or unsubstituted, the group includes both a group not having a substituent and a group having a substituent. For example, an "alkyl group" which is not denoted about whether it is substituted or unsubstituted includes not only an alkyl group not having a substituent (unsubstituted alkyl group), but also an alkyl group having a substituent (substituted alkyl group).

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. In addition, in the present invention, light means actinic rays or radiation.

Furthermore, "exposure" in the present specification includes, unless otherwise specified, not only exposure by a mercury lamp, far ultraviolet rays typified by excimer laser, extreme ultraviolet rays, X-rays, EUV light, or the like, but also writing by particle rays such as electron beams and ion beams.

Furthermore, in the present specification, "(a value) to (a value)" means a range including the numerical values described before and after "to" as a lower limit value and an upper limit value, respectively.

In addition, in the present specification, (meth)acrylate represents acrylate and methacrylate, and (meth)acryl represents acryl and methacryl.

In the present specification, the weight-average molecular weight (Mw), the number-average molecular weight (Mn), and the dispersity (Mw/Mn) of a resin are defined as values in terms of polystyrene by means of gel permeation chromatography (GPC) measurement (solvent: tetrahydrofuran, flow amount (amount of a sample injected): 10 µl, columns: TSK gel Multipore HXL-M (×4) manufactured by Tosoh Corporation, column temperature: 40° C., flow rate: 1.0 mL/min, detector: differential refractive index (RI) detector) using a GPC apparatus (HLC-8120GPC manufactured by Tosoh Corporation).

[Actinic Ray-Sensitive or Radiation-Sensitive Resin Composition]

The actinic ray-sensitive or radiation-sensitive resin composition of the present invention (hereinafter also simply referred to as the composition of the present invention) is an actinic ray-sensitive or radiation-sensitive resin composition, used for forming an actinic ray-sensitive or radiation-sensitive film having a film thickness of 1 µm or more, and for being exposed to actinic rays having a wavelength of 200 to 300 nm or radiation, in which the transmittance with respect to light at a wavelength of 248 nm in an actinic ray-sensitive or radiation-sensitive film having a film thickness of 12 µm, which is formed using the actinic ray-sensitive or radiation-sensitive resin composition, is 5% or more.

In the related art, the light transmittance of the resist film in a case of performing exposure with light at a wavelength of 200 to 300 nm has not particularly attracted attention as a factor for improving the performance in a pattern forming method, but currently, the present inventors have focused on the light transmittance of a resist film, taking into consideration a demand for an improvement in performance of a resist composition as the performance of various electronic devices becomes higher. As a result, the present inventors have found that by taking the configurations of the present invention as described above, it is possible to form a pattern having an excellent sensitivity and an excellent cross-sectional shape in a case where an actinic ray-sensitive or radiation-sensitive film having a film thickness of 1 µm or more is exposed to light at a wavelength of 200 to 300 nm.

The reason therefor is not clear, but it is thought that by the configurations of the present invention, the light transmittance is highly improved in a case where an actinic ray-sensitive or radiation-sensitive film having a film thickness of 1 µm or more is exposed to light at a wavelength of 200 to 300 nm. As a result, it is presumed that the reaction in an exposed area sufficiently proceeds along the direction of the film thickness of the film, and thus, the sensitivity and the pattern cross-sectional shape are highly excellent.

As described above, under the circumstances where the light transmittance of a resist film in a case of performing exposure with light at a wavelength of 200 to 300 nm has not attracted attention, the effect obtained by setting the light transmittance within a predetermined range is a remarkable effect.

The transmittance with respect to light at a wavelength of 248 nm in an actinic ray-sensitive or radiation-sensitive film having a film thickness of 12 µm, which is formed using the actinic ray-sensitive or radiation-sensitive resin composition, can be measured, for example, by the following manner. The actinic ray-sensitive or radiation-sensitive resin composition is applied onto a quartz glass substrate by spin coating and baked at 100° C. for 60 seconds to form a film having a film thickness of 12 µm, and the transmittance of the film with respect to light at a wavelength of 248 nm can be measured using UV-2500PC (manufactured by Shimadzu Corp.) or the like.

The actinic ray-sensitive or radiation-sensitive resin composition of the present invention is preferably used for KrF exposure.

The actinic ray-sensitive or radiation-sensitive resin composition of the present invention may be either a negative tone resist composition for organic solvent development or a positive tone resist composition for alkali development. Incidentally, the composition according to the present invention is typically a chemical amplification-type resist composition.

<Resin (A)>

The composition of the present invention contains a resin (A).

The resin (A) is typically a resin whose solubility in a developer changes through decomposition by the action of an acid, and preferably a resin whose solubility in an alkali developer increases by the action of an acid or whose solubility in a developer having an organic solvent as a main component decreases by the action of an acid, and also preferably has a group (hereinafter also referred to as an "acid-decomposable group") that decomposes by the action of an acid in the main chain or a side chain, or both the main chain and the side chain of the resin to generate a polar group.

The acid-decomposable group preferably has a structure in which a polar group is protected with a group that decomposes by the action of an acid to leave.

Examples of the polar group include an acidic group (a group that dissociates in a 2.38%-by-mass aqueous tetramethylammonium hydroxide solution which has been used as a developer in a resist in the related art) such as a phenolic hydroxyl group, a carboxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Preferred examples of the polar group include a carboxyl group, a fluorinated alcohol group (preferably a hexafluoroisopropanol group), and a sulfonic acid group.

A group which is preferable as the acid-decomposable group is a group in which a hydrogen atom of the polar group is substituted with a group that leaves by the action of an acid.

Examples of the group that leaves by the action of an acid include —C($R_{36}$)($R_{37}$)($R_{38}$), —C($R_{36}$)($R_{37}$)(O$R_{39}$), —C($R_{01}$)($R_{02}$)(O$R_{39}$), —C($R_{01}$)($R_{02}$)—C(=O)—O—C($R_6$)($R_{37}$)($R_{38}$), and —CH($R_{36}$)(Ar).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Ar represents an aryl group.

As the alkyl group as $R_{36}$ to $R_{39}$, $R_{01}$, or $R_{02}$, an alkyl group having 1 to 8 carbon atoms is preferable, and examples thereof include a methyl group, an ethyl group, a propyl group, an n-butyl group, a sec-butyl group, a hexyl group, and octyl group.

A cycloalkyl group as $R_{36}$ to $R_{39}$, $R_{01}$, or $R_{02}$ may be a monocyclic cycloalkyl group or a polycyclic cycloalkyl group. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphonyl group, a dicyclopentyl group, an α-pinanyl group, a tricyclodecanyl group, a tetracyclododecyl group, and an androstanyl group. Further, some of the carbon atoms in the cycloalkyl group may be substituted with heteroatoms such as an oxygen atom.

An aryl group as $R_{36}$ to $R_{39}$, $R_{01}$, or $R_{02}$, or Ar is preferably an aryl group having 6 to 10 carbon atoms, and examples thereof include a phenyl group, a naphthyl group, and an anthryl group.

An aralkyl group as $R_{36}$ to $R_{39}$, $R_{01}$, or $R_{02}$ is preferably an aralkyl group with 7 to 12 carbon atoms, and is preferably, for example, a benzyl group, a phenethyl group, and a naphthylmethyl group.

An alkenyl group as $R_{36}$ to $R_{39}$, $R_{01}$, or $R_{02}$ is preferably an alkenyl group with 2 to 8 carbon atoms, and examples thereof include a vinyl group, an allyl group, a butenyl group, and a cyclohexenyl group.

A ring which can be formed by the mutual bonding of $R_{36}$ and $R_{37}$ may be monocyclic or polycyclic. The monocyclic ring is preferably a cycloalkyl structure having 3 to 8 carbon atoms, and examples thereof include a cyclopropane structure, a cyclobutane structure, a cyclopentane structure, a cyclohexane structure, a cycloheptane structure, and a cyclooctane structure. The polycyclic ring is preferably a cycloalkyl structure having 6 to 20 carbon atoms, and examples thereof include an adamantane structure, a norbornane structure, a dicyclopentane structure, a tricyclodecane structure, and a tetracyclododecane structure. Further, a part of carbon atoms in the cycloalkyl structure may be substituted with the heteroatom such as an oxygen atom.

Each of the groups may have a substituent. Examples of the substituent include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group. Theses substituents preferably have 8 or less carbon atoms.

The acid-decomposable group is preferably a cumyl ester group, an enol ester group, an acetal group, an acetal ester group, a tertiary alkyl ester group, or the like, and more preferably a tertiary alkyl ester group.

As the repeating unit having an acid-decomposable group, which can be contained in the resin (A), a repeating unit represented by General Formula (AI) is preferable.

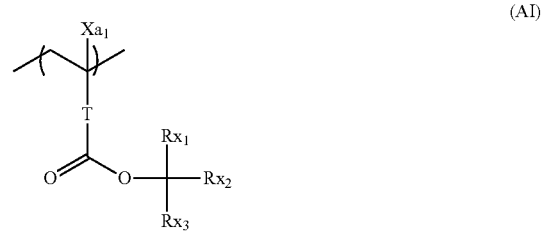

(AI)

In General Formula (AI).

$Xa_1$ represents a hydrogen atom, or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group.

Two of $Rx_1$ to $Rx_3$ may be bonded to each other to form a (monocyclic or polycyclic) cycloalkyl group.

The alkyl group represented by $Xa_1$ may or may not have a substituent, and examples thereof include a methyl group and a group represented by —$CH_2$—$R_{11}$. $R_{11}$ represents a halogen atom (a fluorine atom or the like), a hydroxyl group, or a monovalent organic group, and examples thereof include an alkyl group having 5 or less carbon atoms, and an acyl group having 5 or less carbon atoms. $R_{11}$ is preferably an alkyl group having 3 or less carbon atoms, and more preferably a methyl group. In one aspect, $Xa_1$ is preferably a hydrogen atom, a methyl group, a trifluoromethyl group, a hydroxymethyl group, or the like.

Examples of the divalent linking group of T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

As the alkyl group of $Rx_1$ to $Rx_3$, alkyl groups having 1 to 4 carbon atoms, such as a methyl group, an ethyl group, an n-propyl group, an isopropyl group, an n-butyl group, an isobutyl group, and a t-butyl group are preferable.

As the cycloalkyl group of $Rx_1$ to $Rx_3$, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable.

As the cycloalkyl group formed by the bonding of two of $Rx_1$ to $Rx_3$, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable, and monocyclic cycloalkyl groups having 5 or 6 carbon atoms are particularly preferable.

In the cycloalkyl group formed by the bonding of two of $Rx_1$ to $Rx_3$, for example, one of the methylene groups constituting the ring may be substituted with a heteroatom such as an oxygen atom, or with a group having a heteroatom, such as a carbonyl group.

For the repeating unit represented by General Formula (AI), for example, an aspect in which $Rx_1$ is a methyl group or an ethyl group, and $Rx_2$ and $Rx_3$ are bonded to form the afore-mentioned cycloalkyl group, is preferable.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with the groups having 8 or less carbon atoms being preferable.

Specific preferred examples of the repeating unit having an acid-decomposable group are set forth below, but the present invention is not limited thereto.

In the specific examples, Rx and $Xa_1$ each represent a hydrogen atom, $CH_3$, $CF_3$, or $CH_2OH$. Rxa and Rxb each represent an alkyl group having 1 to 4 carbon atoms. Z represents a substituent containing a polar group, and in a case where Z's are present in plural numbers, they are each independent. p represents 0 or a positive integer. Examples of the substituent containing a polar group, represented by Z, include a linear or branched alkyl group, and a cycloalkyl group, each having a hydroxyl group, a cyano group, an amino group, an alkylamido group, or a sulfonamido group, and preferably an alkyl group having a hydroxyl group. As the branched alkyl group, an isopropyl group is particularly preferable.

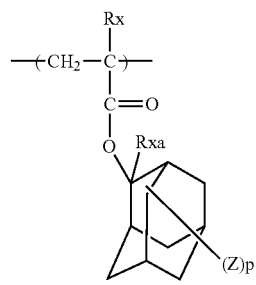

1

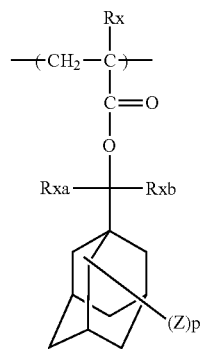

2

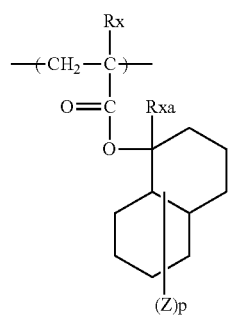

3

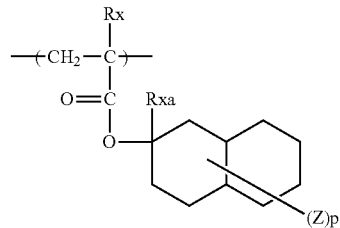

4

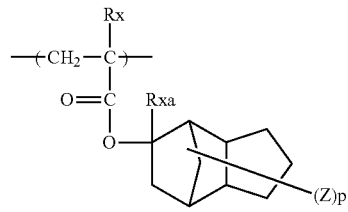

5

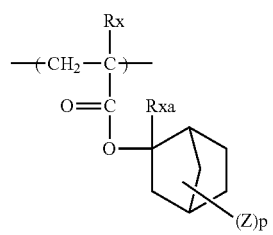

6

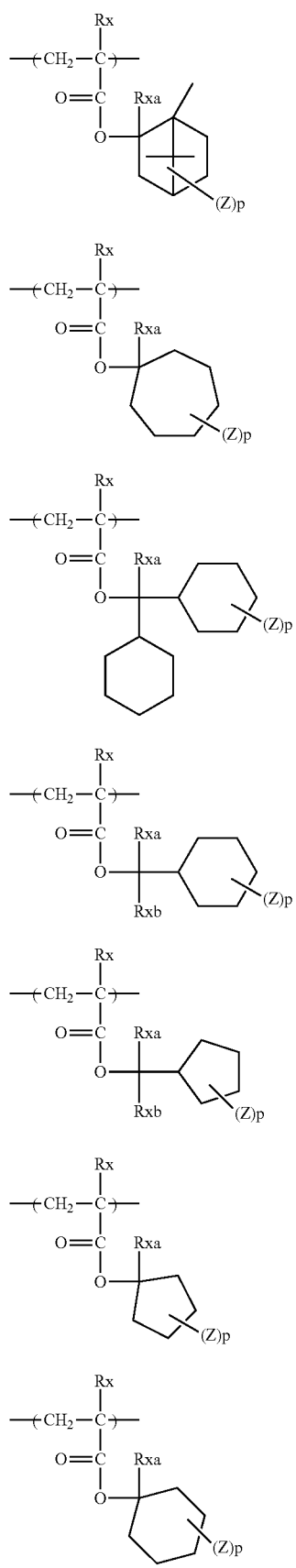

-continued

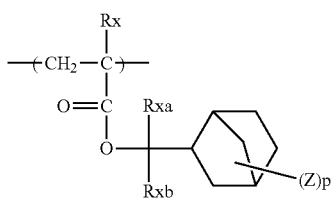

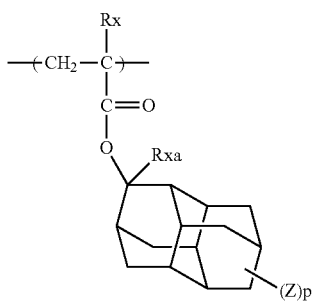

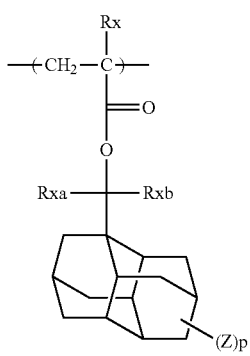

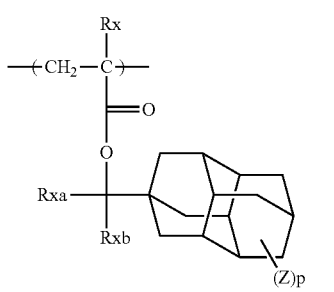

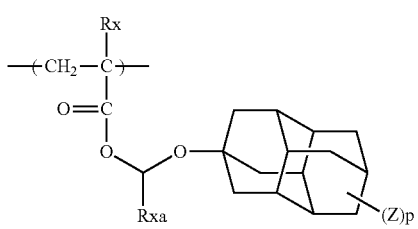

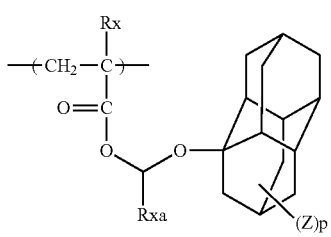

It is preferable that the resin (A) contains, for example, a repeating unit represented by General Formula (3), as the repeating unit represented by General Formula (AI).

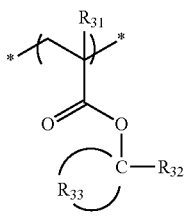

(3)

In General Formula (3), $R_{31}$ represents a hydrogen atom or an alkyl group.

$R_{32}$ represents an alkyl group or a cycloalkyl group, and specific examples thereof include a methyl group, an ethyl group, an n-propyl group, an isopropyl group, an n-butyl group, an isobutyl group, a sec-butyl group, a tert-butyl group, and a cyclohexyl group.

$R_{33}$ represents an atomic group required for forming a monocyclic alicyclic hydrocarbon structure together with a carbon atom to which $R_{32}$ is bonded. In the alicyclic hydrocarbon structure, a part of the carbon atoms constituting the ring may be substituted with a heteroatom or a group having a heteroatom.

The alkyl group of $R_{31}$ may have a substituent, and examples of the substituent include a fluorine atom and a hydroxyl group. $R_{31}$ preferably represents a hydrogen atom, a methyl group, a trifluoromethyl group, or a hydroxymethyl group.

$R_{32}$ is preferably a methyl group, an ethyl group, an n-propyl group, an isopropyl group, a tert-butyl group, or a cyclohexyl group, and more preferably a methyl group, an ethyl group, an isopropyl group, or a tert-butyl group.

The monocyclic alicyclic hydrocarbon structure formed by $R_{33}$ together with a carbon atom is preferably a 3- to 8-membered ring, and more preferably a 5- or 6-membered ring.

In the monocyclic alicyclic hydrocarbon structure formed by $R_{33}$ together with a carbon atom, examples of the heteroatom which can constitute a ring include an oxygen atom and a sulfur atom, and examples of the group having a heteroatom include a carbonyl group. However, it is preferable that the group having a heteroatom is not an ester group (ester bond).

It is preferable that the monocyclic alicyclic hydrocarbon structure formed by $R_{33}$ together with a carbon atom is formed of only carbon atoms and hydrogen atoms.

The repeating unit represented by General Formula (3) is preferably a repeating unit represented by General Formula (3').

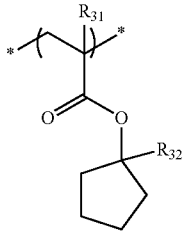

(3')

In General Formula (3'), $R_{31}$ and $R_{32}$ have the same definitions, respectively, as in General Formula (3).
Specific examples of the repeating unit having the structure represented by General Formula (3) include, not limited to, the following repeating units.
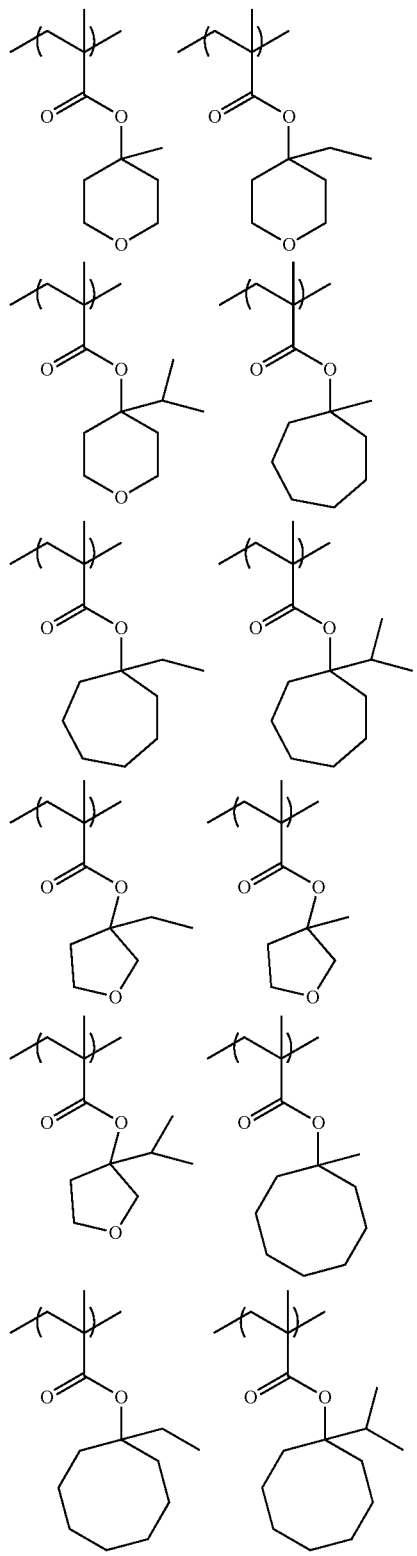
-continued
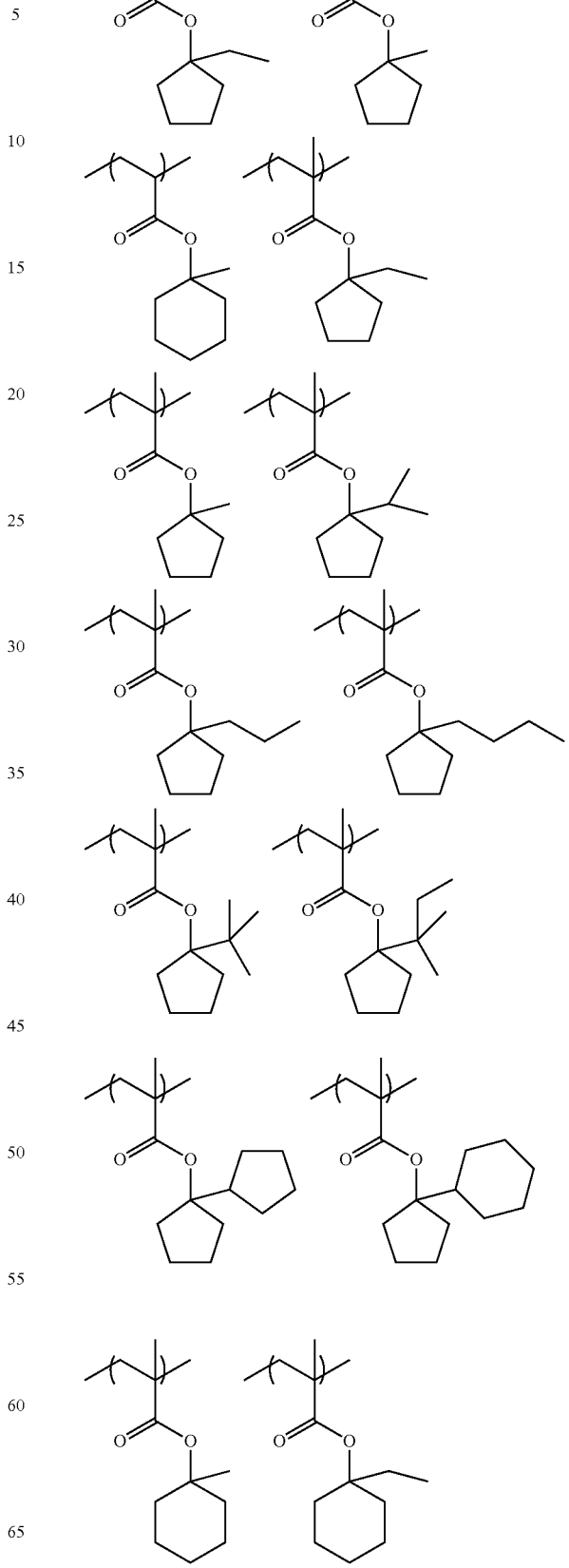

-continued

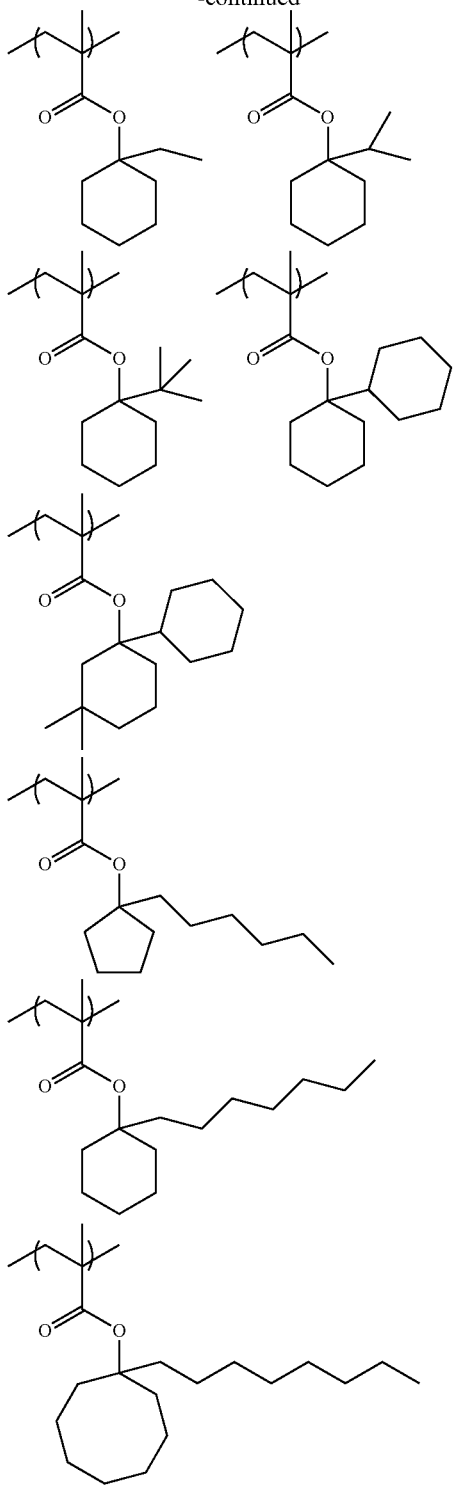

The content of the repeating unit having the structure represented by General Formula (3) is preferably 20% to 80% by mole, more preferably 25% to 75% by mole, and still more preferably 30% to 70% by mole, with respect to all the repeating units in the resin (A).

Furthermore, the repeating unit having an acid-decomposable group is also preferably a repeating unit represented by General Formula (A).

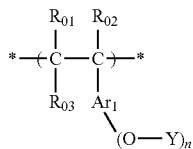
(A)

In the formula, $R_{01}$, $R_{02}$, and $R_{03}$ each independently represent, for example, a hydrogen atom, an alkyl group, a cycloalkyl group, a halogen atom, a cyano group, or an alkoxycarbonyl group. $Ar_1$ represents an aromatic ring group. $R_{03}$ represents an alkylene group or may be bonded to $Ar_1$, together with a —C—C— chain, to form a 5- or 6-membered ring.

n Y's each independently represent a hydrogen atom or a group that leaves by the action of an acid, provided that at least one of Y's represents a group that leaves by the action of an acid.

n represents an integer of 1 to 4, and is preferably 1 or 2, and more preferably 1.

The alkyl group as each of $R_{01}$ to $R_{03}$ is, for example, an alkyl group having 20 or less carbon atoms, preferably a methyl group, an ethyl group, a propyl group, an isopropyl group, an n-butyl group, a sec-butyl group, a hexyl group, a 2-ethylhexyl group, an octyl group, or a dodecyl group. More preferably, these alkyl groups are alkyl groups having 8 or less carbon atoms. Further, these alkyl groups may have a substituent.

The alkyl group included in the alkoxycarbonyl group is preferably the same as the alkyl group in each of $R_{01}$ to $R_{03}$.

The cycloalkyl group may be a monocyclic cycloalkyl group or a polycyclic cycloalkyl group. Preferred examples thereof include a monocyclic cycloalkyl group having 3 to 8 carbon atoms, such as a cyclopropyl group, a cyclopentyl group, and a cyclohexyl group. Further, these cycloalkyl groups may have a substituent.

Examples of the halogen atom include a fluorine atom, a chlorine atom, a bromine atom, and an iodine atom, with the fluorine atom being more preferable.

In a case where $R_{03}$ represents an alkylene group, preferred examples of the alkylene group include ones having 1 to 8 carbon atoms, such as a methylene group, an ethylene group, a propylene group, a butylene group, a hexylene group, and an octylene group.

The aromatic ring group as $Ar_1$ is preferably one having 6 to 14 carbon atoms, and examples thereof include a benzene ring, a toluene ring, and a naphthalene ring. Further, these aromatic ring groups may have a substituent.

Suitable examples of the group that leaves by the action of an acid as at least one of Y's include those described above.

The group that leaves by the action of an acid as at least one of Y's is preferably a structure represented by General Formula (B).

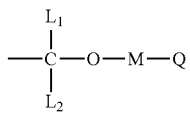
(B)

In the formula, $L_1$ and $L_2$ each independently represent a hydrogen atom, an alkyl group, a cycloalkyl group, an aryl group, or an aralkyl group.

M represents a single bond or a divalent linking group.

Q represents an alkyl group, a cycloalkyl group, a cyclic aliphatic group, an aromatic ring group, an amino group, an ammonium group, a mercapto group, a cyano group, or an aldehyde group. The cyclic aliphatic group and the aromatic ring group may include a heteroatom.

At least two of Q, M, and $L_1$ may be bonded to each other to form a 5- or 6-membered ring.

The alkyl group as each of $L_1$ and $L_2$ is, for example, an alkyl group having 1 to 8 carbon atoms, and specific examples thereof include a methyl group, an ethyl group, a propyl group, an n-butyl group, a sec-butyl group, a hexyl group, and an octyl group.

The cycloalkyl group as each of $L_1$ and $L_2$ is, for example, a cycloalkyl group having 3 to 15 carbon atoms, and specific examples thereof include a cyclopentyl group, a cyclohexyl group, a norbornyl group, and an adamantyl group.

The aryl group as each of $L_1$ and $L_2$ is, for example, an aryl group having 6 to 15 carbon atoms, and specific examples thereof include a phenyl group, a tolyl group, a naphthyl group, and an anthryl group.

The aralkyl group as each of $L_1$ and $L_2$ is, for example, an aralkyl group having 6 to 20 carbon atoms, and specific examples thereof include a benzyl group and a phenethyl group.

Examples of the divalent linking group as M include an alkylene group (for example, a methylene group, an ethylene group, a propylene group, a butylene group, a hexylene group, and an octylene group), a cycloalkylene group (for example, a cyclopentylene group and a cyclohexylene group), an alkenylene group (for example, an ethylene group, a propenylene group, and a butenylene group), an arylene group (for example, a phenylene group, a tolylene group, and a naphthylene group), —S—, —O—, —CO—, —$SO_2$—, —N($R_0$)—, and a combination of two or more thereof. Here, $R_0$ is a hydrogen atom or an alkyl group. The alkyl group as $R_0$ is, for example, an alkyl group having 1 to 8 carbon atoms, and specific examples thereof include a methyl group, an ethyl group, a propyl group, an n-butyl group, a sec-butyl group, a hexyl group, and an octyl group.

Examples of the alkyl group and the cycloalkyl group as Q are the same as those described above for the alkyl group and the cycloalkyl group of each of $L_1$ and $L_2$, respectively.

Examples of the alicyclic group or the aromatic ring group as Q include the above-described cycloalkyl group and aryl group as each of $L_1$ and $L_2$. The cycloalkyl group and the aryl group are each preferably a group having 3 to 15 carbon atoms.

Examples of the heteroatom-containing alicyclic or aromatic ring group as Q include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole, and pyrrolidone, but the ring is not limited thereto as long as it is a ring formed of carbon and a heteroatom or a ring formed of only a heteroatom.

Examples of the ring structure which may be formed by the mutual bonding of at least two of Q, M, or $L_1$ include a 5- or 6-membered ring obtained by forming a propylene group or a butylene group by these members. In addition, this 5- or 6-membered ring structure contains an oxygen atom.

Each of the groups represented by $L_1$, $L_2$, M, and Q in General Formula (B) may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The substituent preferably has 8 or less carbon atoms.

The group represented by -(M-Q) is preferably a group having 1 to 20 carbon atoms, more preferably a group having 1 to 10 carbon atoms, and still more preferably a group having 1 to 8 carbon atoms.

The total content of the repeating units having an acid-decomposable group is preferably 20% to 90% by mole, more preferably 25% to 85% by mole, and still more preferably 30% to 80% by mole, with respect to all the repeating units in the resin (A).

In one aspect, the resin (A) preferably has a repeating unit having a cyclic carbonic acid ester structure. This cyclic carbonic acid ester structure is a structure having a ring including a bond represented by —O—C(=O)—O— as an atomic group constituting the ring. The ring including a bond represented by —O—C(=O)—O— as an atomic group constituting the ring is preferably a 5- to 7-membered ring, and most preferably a 5-membered ring. Such a ring may be fused with another ring to form a fused ring.

Moreover, the resin (A) may contain a repeating unit having a lactone structure or sultone (cyclic sulfonic acid ester) structure.

As the lactone group or the sultone group, any group having a lactone structure or sultone structure can be used, and is preferably a 5- to 7-membered ring lactone structure or sultone structure, with a 5- to 7-membered ring lactone structure or sultone structure to which another ring structure is fused so as to form a bicyclo structure or spiro structure being preferable. The resin (A) more preferably has a repeating unit having a lactone structure or sultone structure represented by any one of General Formulae (LC1-1) to (LC1-17), (SL1-1), and (SL1-2). Further, the lactone structure or the sultone structure may be directly bonded to a main chain. A preferred lactone structure or sultone structure is (LC1-1), (LC1-4), (LC1-5), or (LC1-8), with (LC1-4) being more preferable. By using a specific lactone structure or sultone structure, line width roughness (LWR) and development defects are improved.

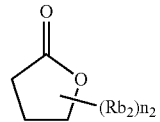

LC1-1

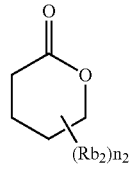

LC1-2

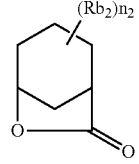

LC1-3

LC1-4
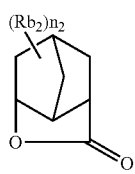
LC1-5
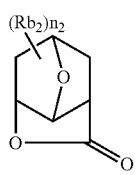
LC1-6
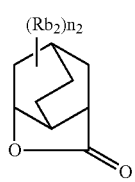
LC1-7
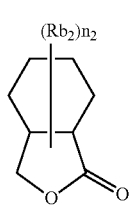
LC1-8
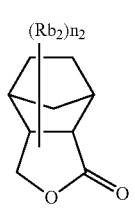
LC1-9
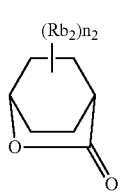
LC1-10
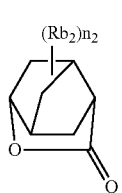
LC1-11
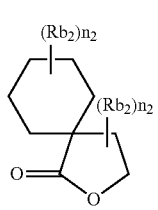
LC1-12
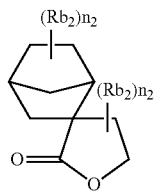
LC1-13
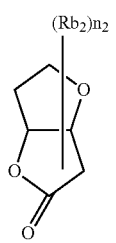
LC1-14
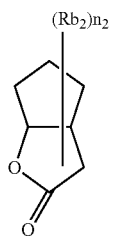
LC1-15
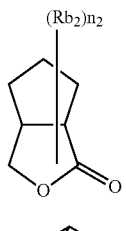
LC1-16
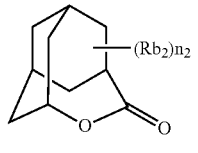
LC1-17
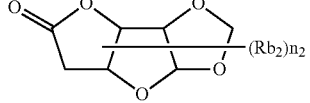
SL1-1
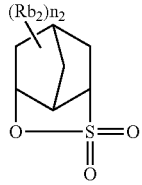
SL1-2
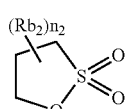
The lactone structure moiety or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. $n_2$ represents an integer of 0 to 4. In a case where $n_2$ is 2 or more, the substituents ($Rb_2$) which are present in plural numbers may be the same as or different from each other, and further, the substituents ($Rb_2$) which are present in plural numbers may be bonded to each other to form a ring.

The repeating unit having a lactone group or a sultone group usually has an optical isomer, and any optical isomer may be used. Further, one kind of optical isomer may be used singly or a plurality of optical isomers may be mixed and used. In a case of mainly using one kind of optical isomer, the optical purity (ee) thereof is preferably 90% or more, and more preferably 95% or more.

The resin (A) may have a repeating unit having a hydroxyl group or a cyano group other than General Formula (AI). Thus, adhesiveness to a substrate and affinity for a developer are improved. The repeating unit having a hydroxyl group or a cyano group is preferably a repeating unit having an alicyclic hydrocarbon structure substituted with a hydroxyl group or a cyano group, and preferably has no acid-decomposable group. In the alicyclic hydrocarbon structure substituted with a hydroxyl group or a cyano group, as the alicyclic hydrocarbon structure, an adamantyl group, a diadamantyl group, and a norbornane group are preferable. As the alicyclic hydrocarbon structure substituted with a hydroxyl group or a cyano group, partial structures represented by General Formulae (VIIa) to (VIId) are preferable.

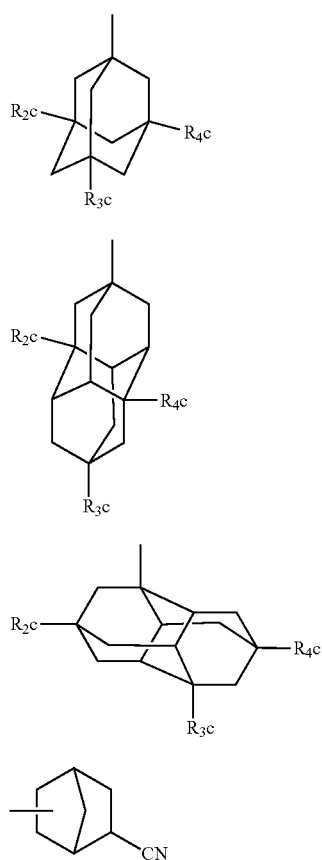

In General Formulae (VIIa) to (VIIc), $R_2c$ to $R_4c$ each independently represent a hydrogen atom, a hydroxyl group, or a cyano group, provided that at least one of $R_2c$, . . . , or $R_4c$ represents a hydroxyl group or a cyano group. Preferably one or two of $R_2c$ to $R_4c$ are a hydroxyl group while the remainder is a hydrogen atom. In General Formula (VIIa), it is more preferable that two of $R_2c$ to $R_4c$ are a hydroxyl group and the remainder is a hydrogen atom.

Examples of the repeating unit having a partial structure represented by each of General Formulae (VIIa) to (VIId) include repeating units represented by General Formulae (AIIa) to (AIId).

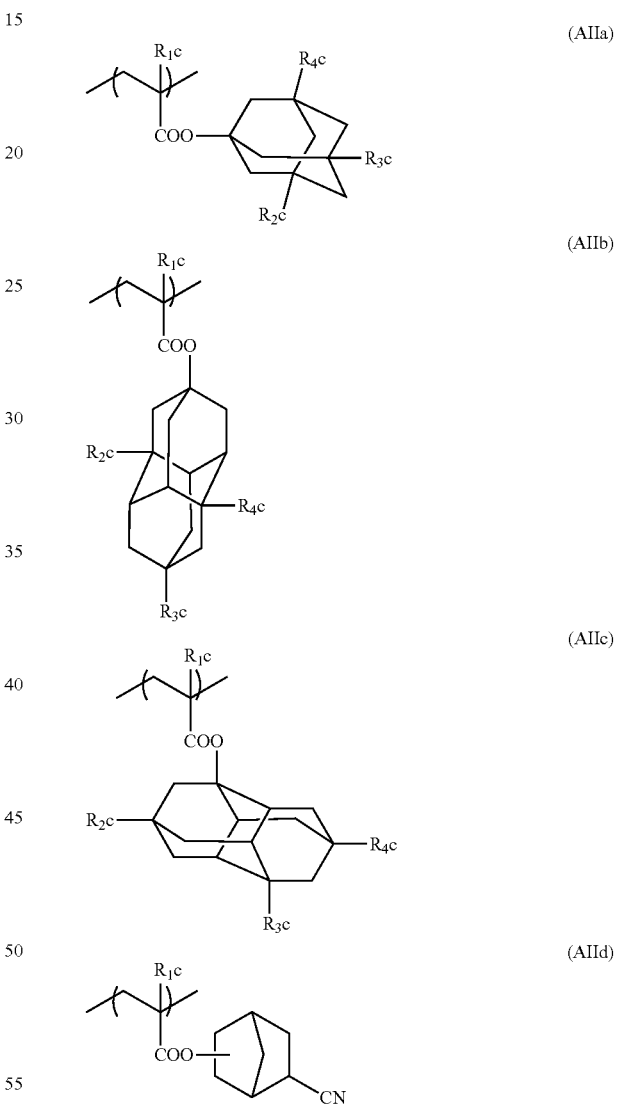

In General Formulae (AIIa) to (AIId), $R_1c$ represents a hydrogen atom, a methyl group, a trifluoromethyl group, or a hydroxymethyl group.

$R_2c$ to $R_4c$ have the same definitions as $R_2c$ to $R_4c$, respectively, in General Formulae (VIIa) to (VIIc).

The content of the repeating unit having a hydroxyl group or a cyano group is preferably 5% to 40% by mole, more preferably 5% to 30% by mole, and still more preferably 10% to 25% by mole, with respect to all the repeating units of the resin (A).

Specific examples of the repeating unit having a hydroxyl group or a cyano group will be shown below, but the present invention is not limited thereto.

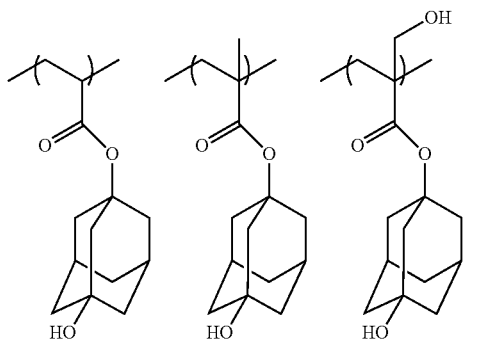

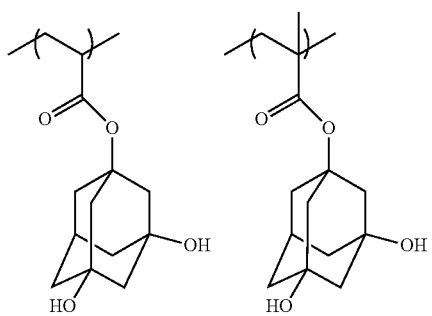

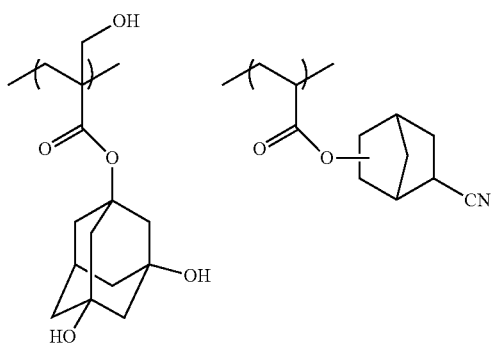

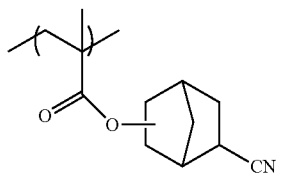

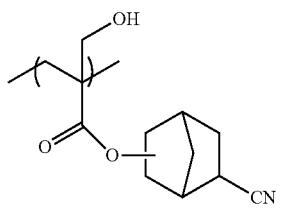

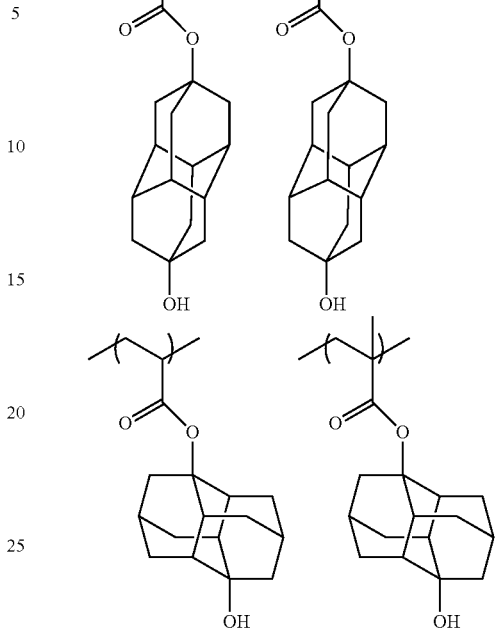

The resin (A) used in the composition of the present invention may have a repeating unit having an acid group. Examples of the acid group include a carboxyl group, a sulfonamido group, a sulfonylimido group, a bissulfonylimido group, and an aliphatic alcohol (for example, a hexafluoroisopropanol group) which is substituted by an electron withdrawing group at an α-position, and more preferably having a repeating unit with a carboxyl group. Due to the resin containing a repeating unit with an alkali soluble group, resolution during formation of contact holes is enhanced. As the repeating unit with an alkali soluble group, any of a repeating unit where an alkali soluble group is bonded directly to the main chain of the resin such as repeating units derived from acrylic acid or methacrylic acid, a repeating unit where an alkali soluble group is bonded to the main chain of the resin via a linking group, or further, introduction of a polymerization initiator or a chain transfer agent which has an alkali soluble group to a terminal of a polymer chain used during polymerization is preferable, and the linking group may have a monocyclic or polycyclic hydrocarbon structure. The repeating unit derived from acrylic acid or methacrylic acid is particularly preferable.

Furthermore, the resin (A) preferably has a repeating unit having a phenolic hydroxyl group as the repeating unit having an acid group.

The phenolic hydroxyl group is a group formed by substituting a hydrogen atom of an aromatic ring group with a hydroxyl group. The aromatic ring is a monocyclic or polycyclic aromatic ring, and examples thereof include aromatic hydrocarbon rings having 6 to 18 carbon atoms, which may have a substituent, such as a benzene ring, a naphthalene ring, an anthracene ring, a fluorene ring, and a phenanthrene ring, or aromatic hetero rings including a hetero ring, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

Among these, from the viewpoint of resolution, the benzene ring or the naphthalene ring is preferable, and the benzene ring is the most preferable.

The content of the repeating unit having an acid group is preferably 30% to 90% by mole, more preferably 35% to 85% by mole, and still more preferably 40% to 80% by mole, with respect to all the repeating units in the resin (A).

Specific examples of the repeating unit having an acid group are set forth below, but the present invention is not limited thereto.

In the specific examples, Rx represents H, $CH_3$, $CH_2OH$, or $CF_3$.

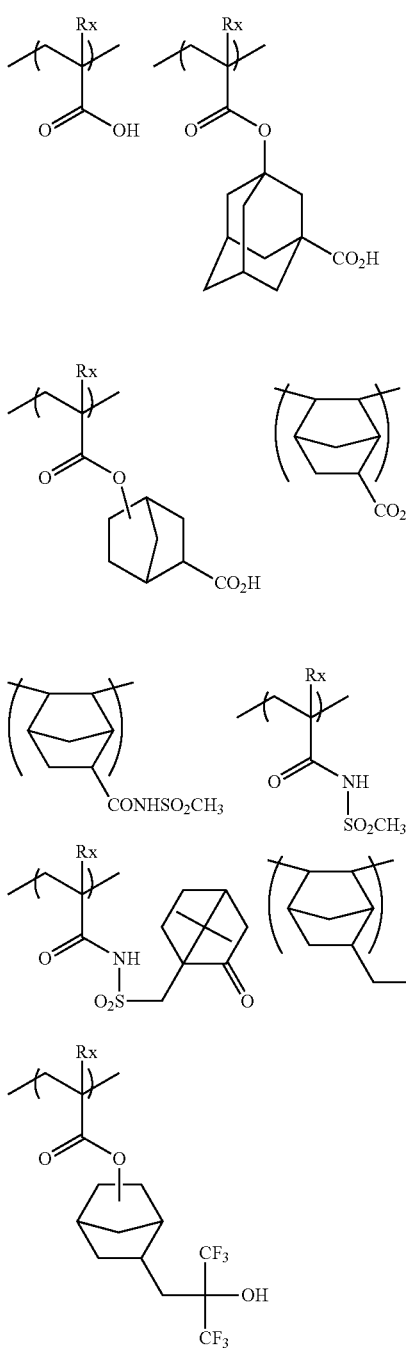

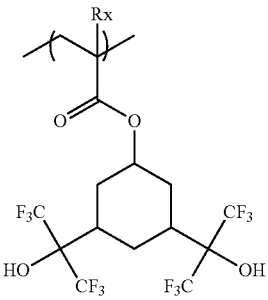

Moreover, in the repeating unit having an acid group, specific examples of the repeating unit having a phenolic hydroxyl group are set forth below, but the present invention is not limited thereto.

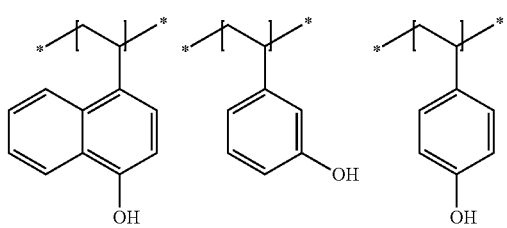

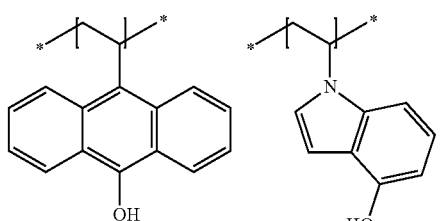

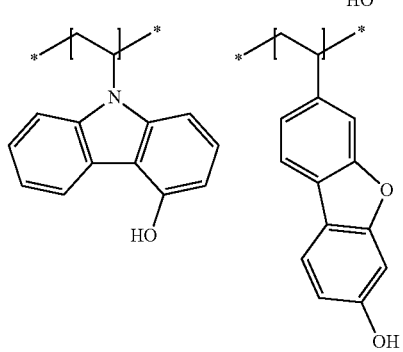

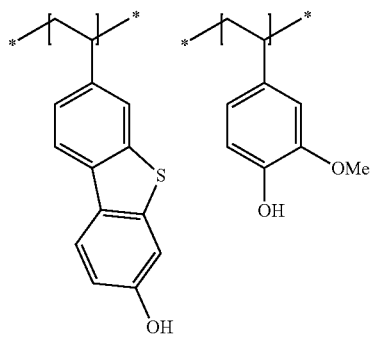

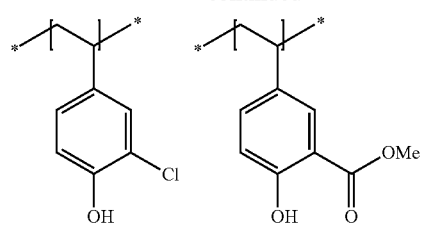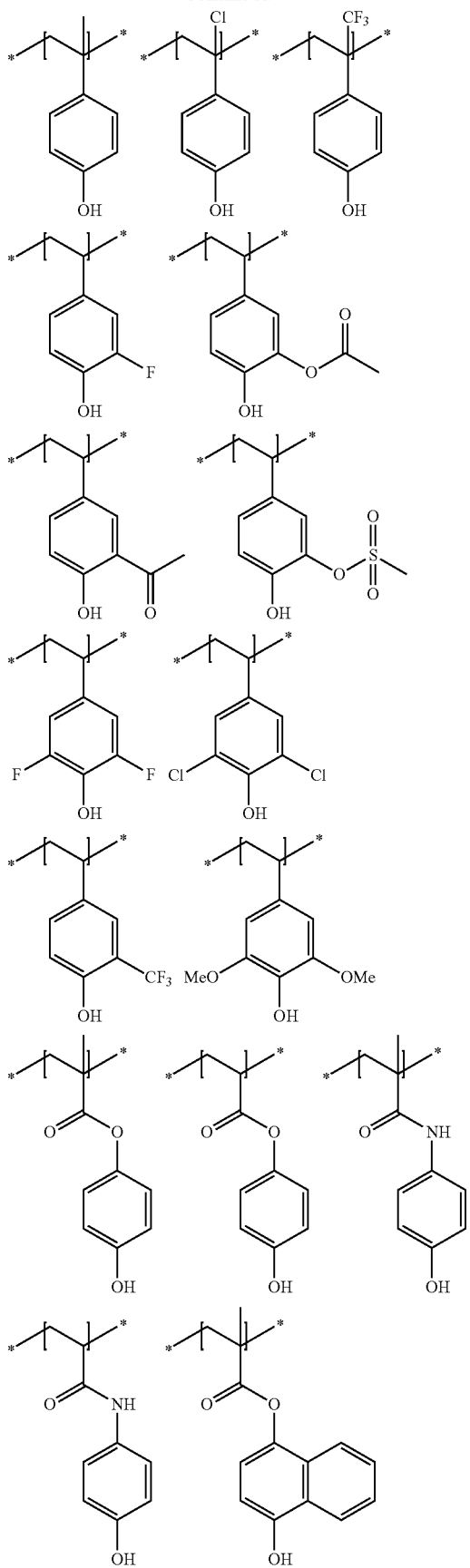

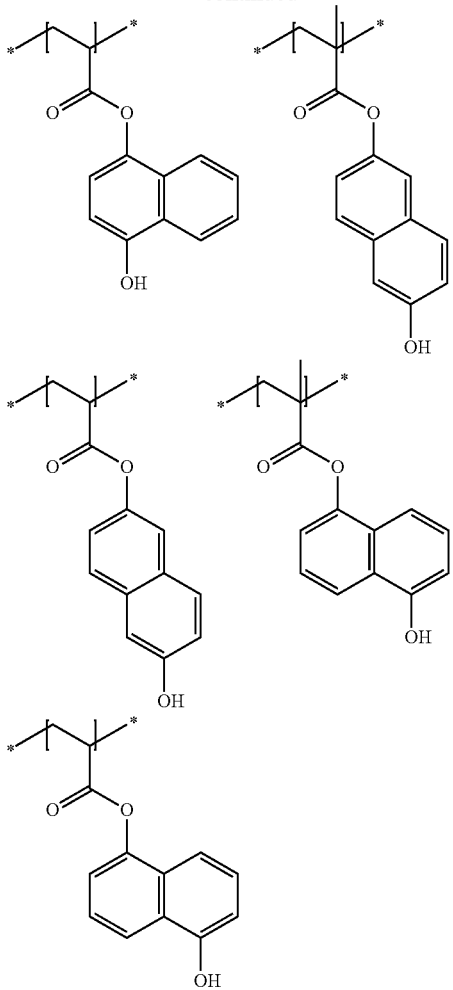

The resin (A) can have a repeating unit having a cyclic hydrocarbon structure having no polar group (for example, and acid group, a hydroxyl group, and a cyano group) and not exhibiting acid decomposability. Examples of such a repeating unit include a repeating unit represented by General Formula (IV).

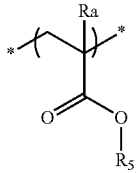

In General Formula (IV), $R_5$ represents a hydrocarbon group which has at least one cyclic structure and does not have a polar group.

Ra represents a hydrogen atom, an alkyl group, or a —$CH_2$—O—$Ra_2$ group. In the formula. $Ra_2$ represents a hydrogen atom, an alkyl group, or an acyl group. $Ra_2$ is preferably a hydrogen atom, a methyl group, a hydroxymethyl group, or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include cycloalkyl groups having 3 to 12 carbon atoms, such as a cyclopentyl group, a cyclohexyl group, a cycloheptyl group, and a cyclooctyl group, cycloalkenyl groups having 3 to 12 carbon atoms, such as a cyclohexenyl group, and a phenyl group. Preferred examples of the monocyclic hydrocarbon group include a monocyclic hydrocarbon group having 3 to 7 carbon atoms, and more preferably a cyclopentyl group and a cyclohexyl group.

Examples of the polycyclic hydrocarbon group include a ring-aggregated hydrocarbon group and a crosslinked cyclic hydrocarbon group, and examples of the ring-aggregated hydrocarbon group include a bicyclohexyl group, a perhydronaphthalenyl group, a biphenyl group, and a 4-cyclohexylphenyl group. Examples of the crosslinked cyclic hydrocarbon ring include bicyclic hydrocarbon rings such as a pinane ring, a bornane ring, a norpinane ring, a norbornane ring, and a bicyclooctane ring (a bicyclo[2.2.2]octane ring, a bicyclo[3.2.1]octane ring, and the like); tricyclic hydrocarbon rings such as a homobrendane ring, an adamantane ring, a tricyclo[5.2.1.0$^{2,6}$]decane ring, and a tricyclo[4.3.1.1$^{2,5}$]undecane ring; and tetracyclic hydrocarbon rings such as a tetracyclo[4.4.0.1$^{2,5}$.1$^{7,10}$]dodecane ring and a perhydro-1,4-methano-5,8-methanonaphthalene ring. Other examples of the crosslinked cyclic hydrocarbon ring include a hydrocarbon ring of a fused ring, for example, a fused ring in which a plurality of 5- to 8-membered cycloalkane rings such as a perhydronaphthalene ring (decalin), a perhydroanthracene ring, a perhydrophenanthrene ring, a perhydroacenaphthene ring, a perhydrofluorene ring, a perhydroindene ring, and a perhydrophenalene ring are fused.

Preferred examples of the crosslinked cyclic hydrocarbon ring include a norbornyl group, an adamantyl group, a bicyclooctanyl group, and a tricyclo[5,2,1,0$^{2,6}$]decanyl group. More preferred examples of the crosslinked cyclic hydrocarbon ring include a norbornyl group and an adamantyl group.

These alicyclic hydrocarbon groups may include a substituent, and preferred examples of the substituent include a halogen atom, an alkyl group, a hydroxyl group substituted with a hydrogen atom, an amino group substituted with a hydrogen atom, and the like. Preferred examples of the halogen atom include a bromine atom, a chlorine atom, and a fluorine atom, and preferred examples of the alkyl group include a methyl group, an ethyl group, a butyl group, and a t-butyl group. The alkyl group may further have a substituent, and examples of this substituent that may be further contained include a halogen atom, an alkyl group, a hydroxyl group substituted with a hydrogen atom, and an amino group substituted with a hydrogen atom.

Examples of the group substituted with a hydrogen atom include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms, preferred examples of the substituted methyl group include a methoxymethyl group, a methoxythiomethyl group, a benzyloxymethyl group, a t-butoxymethyl group, and a 2-methoxyethoxymethyl group, preferred examples of the substituted ethyl group include 1-ethoxyethyl and 1-methyl-1-methoxyethyl, preferred examples of the acyl group include an aliphatic acyl group having 1 to 6 carbon atoms, such as a formyl group, an acetyl group, a propionyl group, a butyryl group, an isobutyryl group, a valeryl group, and a pivaloyl group, and examples of the alkoxycarbonyl group include an alkoxycarbonyl group having 1 to 4 carbon atoms.

The resin (A) may or may not contain a repeating unit having a cyclic hydrocarbon structure having no polar group and not exhibiting acid decomposability, but in a case where the resin (A) contains the repeating unit, the content of the repeating unit is preferably 1% to 40% by mole, and more preferably 2% to 20% by mole, with respect to all the repeating units in the resin (A).

Specific examples of the repeating unit having a cyclic hydrocarbon structure having no polar group and not exhibiting acid decomposability are set forth below, but the present invention is not limited thereto. In the formulae. Ra represents H, $CH_3$, $CH_2OH$, or $CF_3$.

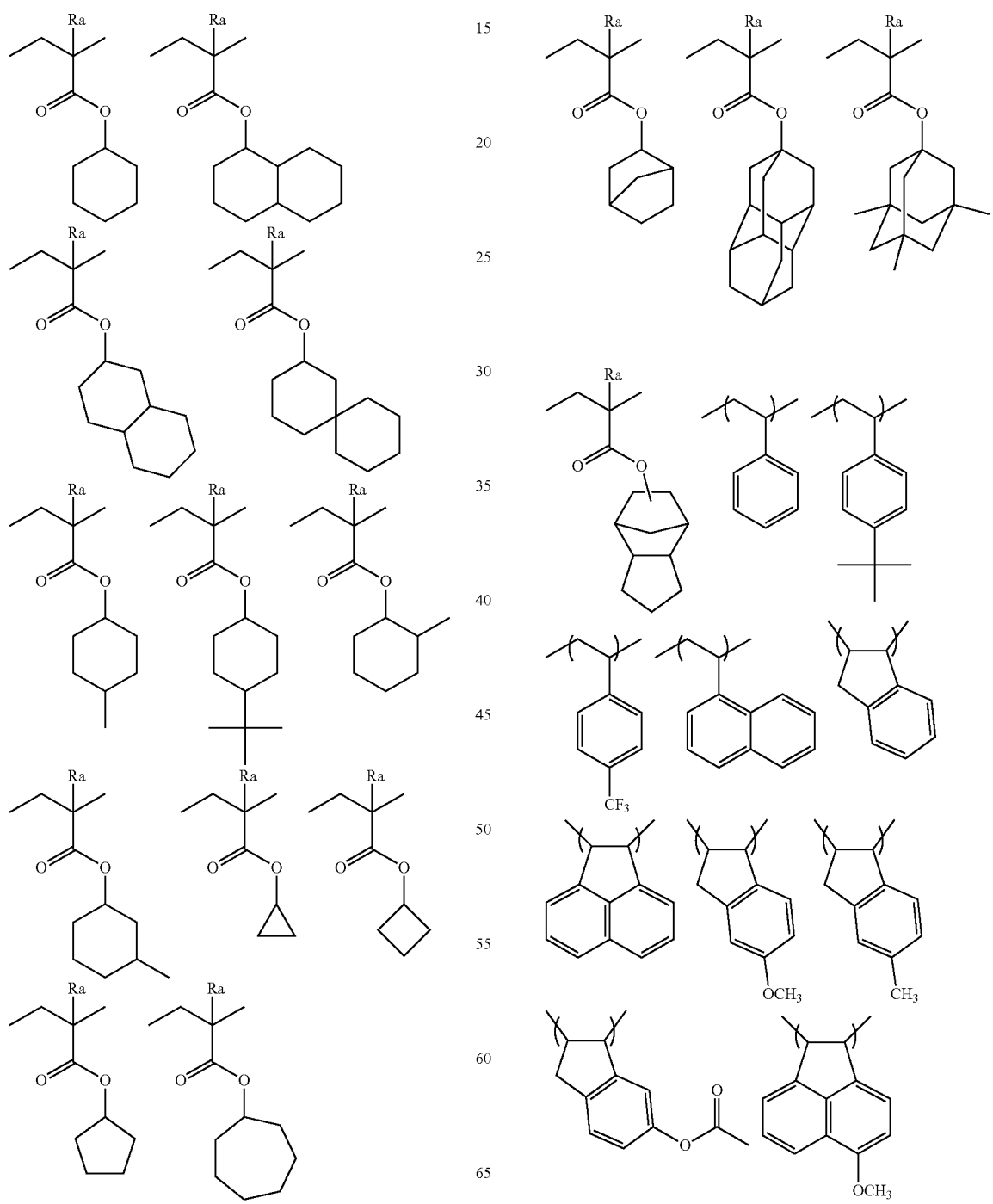

-continued

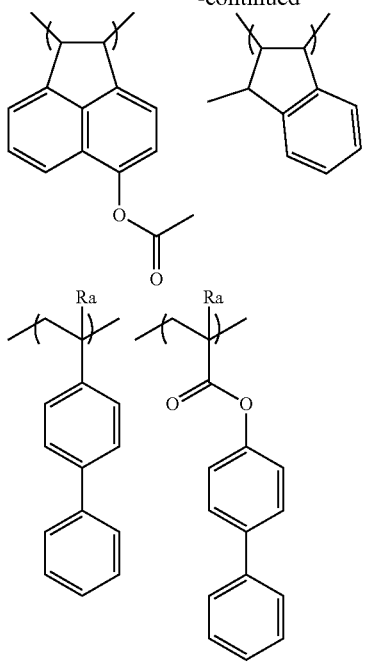

In addition to the repeating structural units, the resin (A) used in the composition of the present invention can have a variety of repeating structural units for the purpose of adjusting dry etching resistance or suitability for a standard developer, adhesiveness to a substrate, and a resist profile, and in addition, resolving power, heat resistance, sensitivity, and the like, which are characteristics generally required for the resist. Examples of such repeating structural units include, but are not limited to, repeating structural units corresponding to the following monomers.

Thus, it becomes possible to perform fine adjustments to performance required for the resin used in the composition of the present invention, in particular, (1) solubility with respect to a coating solvent, (2) film-forming properties (glass transition point), (3) alkali developability, (4) film reduction (selection of hydrophilic, hydrophobic, or acid groups), (5) adhesiveness of an unexposed area to a substrate, (6) dry etching resistance, and the like.

Examples of such a monomer include a compound having one addition-polymerizable unsaturated bond selected from acrylic esters, methacrylic esters, acrylamides, methacrylamides, allyl compounds, vinyl ethers, vinyl esters, and the like.

In addition to these, an addition-polymerizable unsaturated compound that is copolymerizable with the monomers corresponding to various repeating structural units as described above may be copolymerized.

In the resin (A) used in the composition of the present invention, the molar ratio of each repeating structural unit content is appropriately set in order to adjust dry etching resistance or suitability for a standard developer, adhesiveness to a substrate, and a resist profile of the resist, and in addition, resolving power, heat resistance, sensitivity, and the like, each of which is performance generally required for the resist.

The resin (A) in the present invention can be synthesized in accordance with an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 to 10 hours, with the dropwise addition polymerization method being preferable. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethyl formamide and dimethyl acetamide, and a solvent which dissolves the composition of the present invention, such as propylene glycol monomethyl ether acetate, propylene glycol monomethyl ether, and cyclohexanone, which will be described later. It is more preferable to perform polymerization using the same solvent as the solvent used in the composition of the present invention. Thus, generation of the particles during storage can be inhibited.

It is preferable that the polymerization reaction is carried out in an inert gas atmosphere such as nitrogen and argon. As the polymerization initiator, commercially available radical initiators (an azo-based initiator, peroxide, or the like) are used to initiate the polymerization. As the radical initiator, an azo-based initiator is preferable, and the azo-based initiator having an ester group, a cyano group, or a carboxyl group is preferable. Preferable initiators include azobisisobutyronitrile, azobisdimethylvaleronitrile, dimethyl 2,2'-azobis(2-methyl propionate), or the like. The initiator is added or added in portionwise, as desired, a desired polymer is recovered after the reaction is completed, the reaction mixture is poured into a solvent, and then a method such as powder or solid recovery is used. The concentration of the reactant is 5% to 50% by mass and preferably 10% to 30% by mass. The reaction temperature is normally 10° C. to 150° C., preferably 30° C. to 120° C., and more preferably 60° C. to 100° C.

The weight-average molecular weight (Mw) of the resin (A) of the present invention is preferably 1,000 to 200,000, more preferably 2,000 to 20,000, still more preferably 3,000 to 15,000, and particularly preferably 3,000 to 11,000. By setting the weight-average molecular weight to 1,000 to 200,000, it is possible to prevent the deterioration of heat resistance or dry etching resistance, and also prevent the deterioration of film forming properties due to deteriorated developability or increased viscosity.

The dispersity (molecular weight distribution) which is a ratio (Mw/Mn) of the weight-average molecular weight (Mw) to the number-average molecular weight (Mn) is usually 1.0 to 3.0, and the dispersity in the range of preferably 1.0 to 2.6, more preferably 1.0 to 2.0, and particularly preferably 1.1 to 2.0 is used. As the molecular weight distribution is smaller, the resolution and the resist shape are better, the side wall of the resist pattern is smoother, and the roughness is better.

The content of the resin (A) in the entire composition is preferably 30% to 99% by mass, and more preferably 50% to 95% by mass, with respect to the total solid contents.

In addition, the resin (A) may be used singly or in combination of two or more kinds thereof.

<Compound (B) that Generates Acid Upon Irradiation with Actinic Rays or Radiation>

The compound (B) contained in the composition of the present invention is a compound that generates an acid upon irradiation with actinic rays or radiation (hereinafter also referred to as an "acid generator" or an "acid generator (B)"), and is not particularly limited as long as it is a compound capable of providing a transmittance with respect to light at a wavelength of 248 nm in an actinic ray-sensitive or radiation-sensitive film having a film thickness of 12 µm, which is formed using the actinic ray-sensitive or radiation-sensitive resin composition of 5% or more.

The compound (B) is preferably a compound that generates an organic acid upon irradiation with actinic rays or radiation.

The compound (B) is preferably a compound represented by General Formula (ZI-3), with which the transmittance with respect to light at a wavelength of 248 nm in an actinic ray-sensitive or radiation-sensitive film having a film thickness of 12 µm, which is formed using the actinic ray-sensitive or radiation-sensitive resin composition, can be suitably set to 5% or more.

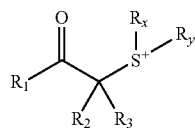

(ZI-3)

In General Formula (ZI-3), $R_1$ represents an alkyl group, a cycloalkyl group, an alkoxy group, a cycloalkoxy group, an aryl group, or an alkenyl group.

$R_2$ and $R_3$ each independently represent a hydrogen atom, an alkyl group, a cycloalkyl group, or an aryl group, $R_2$ and $R_3$ may be linked to each other to form a ring, and $R_1$ and $R_2$ may be linked to each other to form a ring.

$R_x$ and $R_y$ each independently represent an alkyl group, a cycloalkyl group, an alkenyl group, or an aryl group, $R_x$ and $R_y$ may be linked to each other to form a ring, and this ring structure may include an oxygen atom, a nitrogen atom, a sulfur atom, a ketone group, an ether bond, an ester bond, or an amide bond.

$Z^-$ represents a non-nucleophilic anion.

The alkyl group as $R_1$ may be linear or branched, and examples thereof include an alkyl group having 1 to 20 carbon atoms, and preferably a linear or branched alkyl group having 1 to 12 carbon atoms (for example, a methyl group, an ethyl group, a linear or branched propyl group, a linear or branched butyl group, and a linear or branched pentyl group).

Examples of the cycloalkyl group as $R_1$, $R_2$, $R_3$, $R_x$, or $R_y$, and the cycloalkyl group in the cycloalkoxy group as $R_1$ include a cycloalkyl group having 3 to 8 carbon atoms (for example, a cyclopentyl group and a cyclohexyl group).

The alkoxy group as $R_1$ may be linear or branched, and examples thereof include an alkoxy group having 1 to 10 carbon atoms, and preferably a linear or branched alkoxy group having 1 to 5 carbon atoms (for example, a methoxy group, an ethoxy group, a linear or branched propoxy group, a linear or branched butoxy group, and a linear or branched pentoxy group), and a cyclic alkoxy group having 3 to 8 carbon atoms (for example, a cyclopentyloxy group and a cyclohexyloxy group).

The aryl group as $R_1$, $R_2$, or $R_3$ preferably has 5 to 15 carbon atoms, and examples thereof include a phenyl group and a naphthyl group.

In a case where $R_1$ is a phenyl group, it is preferable that $R_1$ has a hydroxyl group as a substituent. Further, it is also preferable that the phenyl group as $R_1$ has a linear or branched alkyl group, a cycloalkyl group, a linear or branched alkoxy group, or a cycloalkoxy group as a substituent, and in this case, it is more preferable that the total number of carbon atoms of the substituent is 2 to 15. Thus, the solubility in a solvent is improved, and generation of particles during storage is suppressed.

Examples of the alkenyl group as $R_1$ include groups having a double bond at an arbitrary position of the alkyl group mentioned as $R_1$.

Examples of the alkyl group as each of $R_2$ and $R_3$ include an alkyl group having 1 to 10 carbon atoms, and preferably a linear and branched alkyl group having 1 to 5 carbon atoms (for example, a methyl group, an ethyl group, and a linear or branched propyl group.

Examples of the ring structure which may be formed by the mutual linking of $R_1$ and $R_2$ preferably include 3- to 10-membered rings, and more preferably 3- to 6-membered ring. The ring skeleton may have a carbon-carbon double bond.

Examples of the alkyl group, the cycloalkyl group, and the aryl group as each of $R_x$ and $R_y$ include the same ones as the alkyl group, the cycloalkyl group, and the aryl group, respectively, as each of $R_2$ and $R_3$.

Examples of the alkenyl group as each of $R_x$ and $R_y$ include groups having a double bond at an arbitrary position of the alkyl group mentioned as each of $R_x$ and $R_y$.

Examples of the group formed by the bonding of $R_x$ and $R_y$ include a butylene group and a pentylene group. That is, examples of the ring structure which may be formed by the mutual bonding of $R_x$ and $R_y$ include a 5- or 6-membered ring, and particularly preferably a 5-membered ring (that is, a tetrahydrothiophene ring) which is formed by divalent $R_x$ and $R_y$ (for example, a methylene group, an ethylene group, and a propylene group) together with a sulfur atom in General Formula (ZI-3).

$R_x$ and $R_y$ are each preferably an alkyl group having 4 or more carbon atoms, more preferably an alkyl group having 6 or more carbon atoms, and still more preferably an alkyl group having 8 or more carbon atoms.

The respective groups as $R_1$, $R_2$, and $R_3$, the ring structure which may be formed by the mutual linking of $R_1$ and $R_2$, the respective groups as $R_x$ and $R_y$, and the ring structure which may be formed by the mutual bonding of $R_x$ and $R_y$ may have an alkyl group, a cycloalkyl group, an alkoxy group, a halogen atom, a phenylthio group, or the like as a substituent. The cycloalkyl group and the aryl group as $R_1$ may further have an alkyl group as a substituent. The substituent preferably has 15 or less carbon atoms.

Suitable examples of the alkyl group having a substituent as each of $R_x$ and $R_y$ include a 2-oxoalkyl group, a 2-oxocycloalkyl group, and an alkoxycarbonylalkyl group, and suitable examples of the cycloalkyl group having a substituent include an alkoxycarbonylcycloalkyl group.

Specific preferred examples of the cation in the compound represented by General Formula (ZI-3) are set forth below, but are not limited thereto.

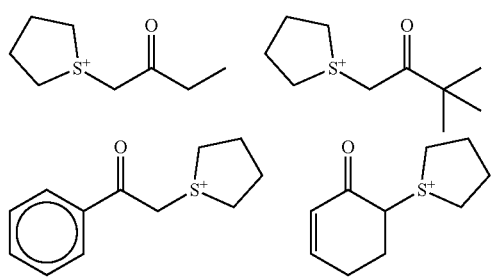

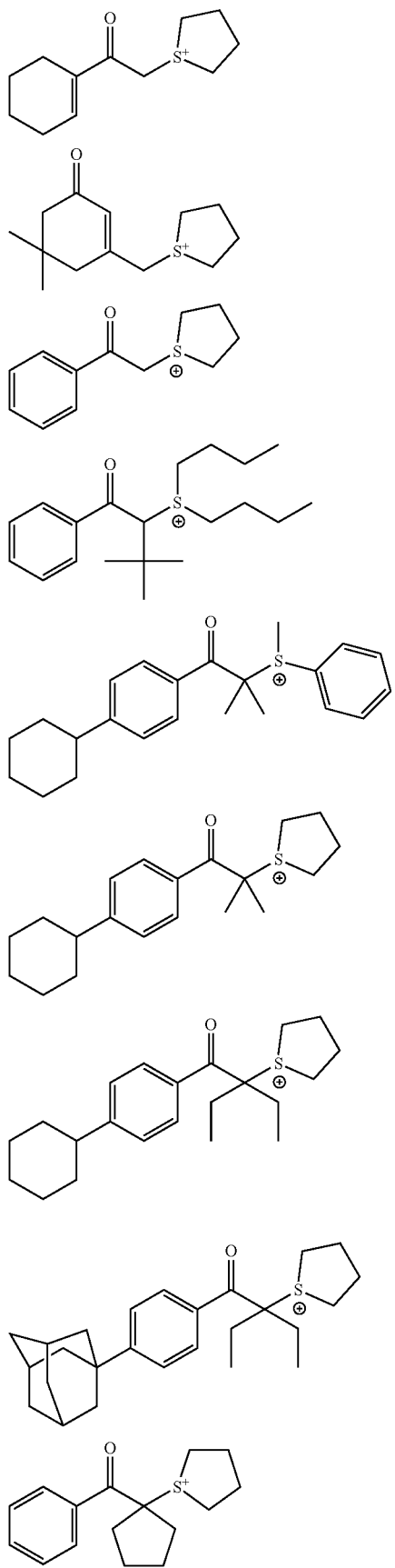
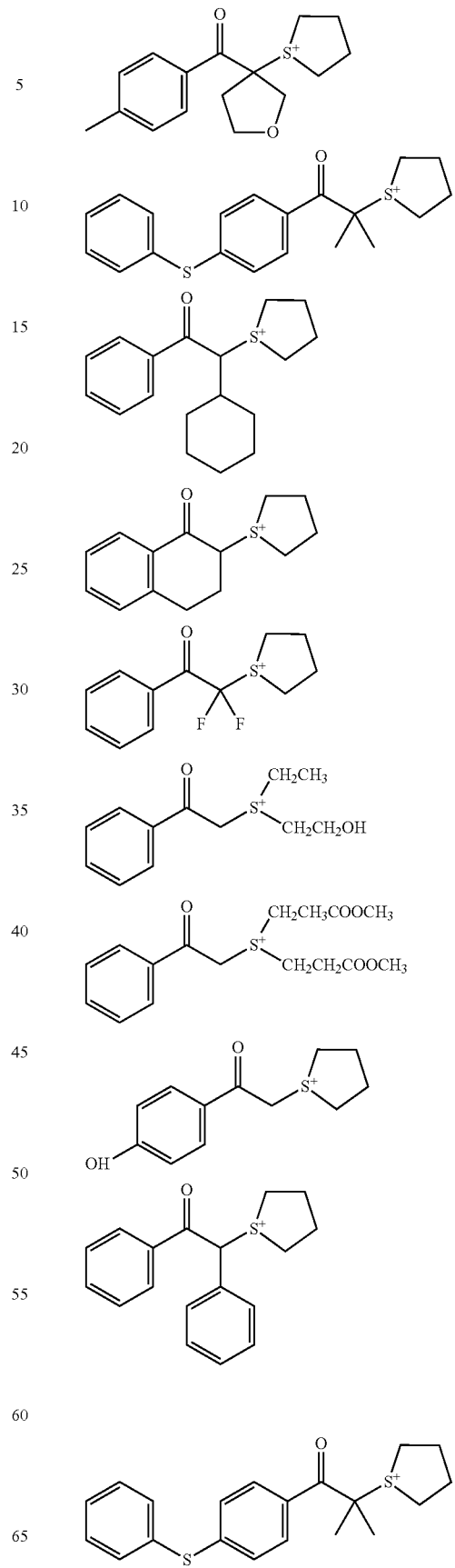

-continued

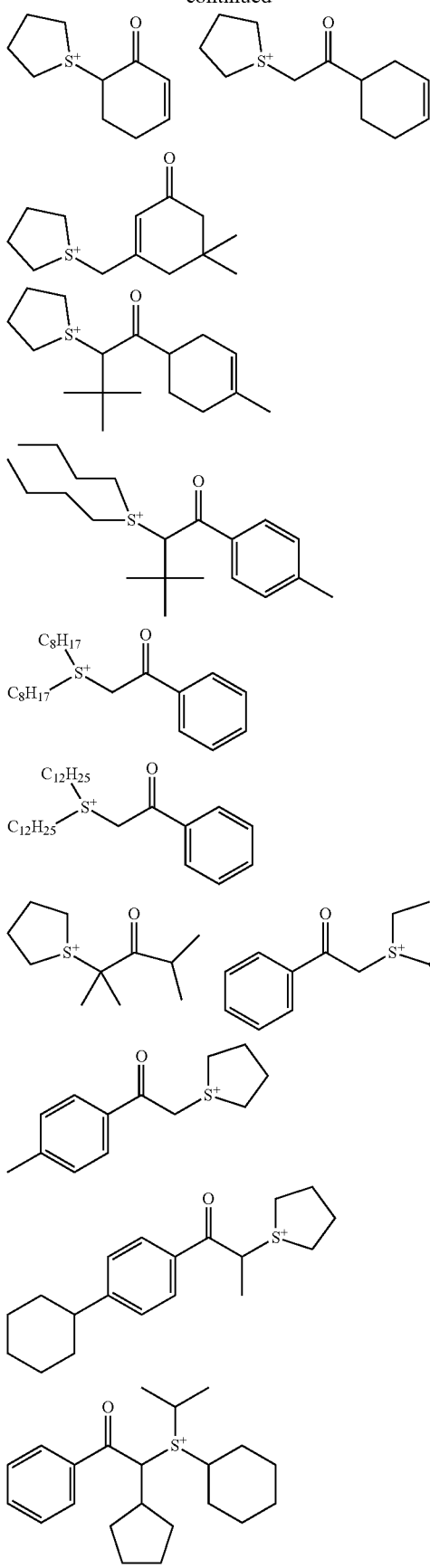

-continued

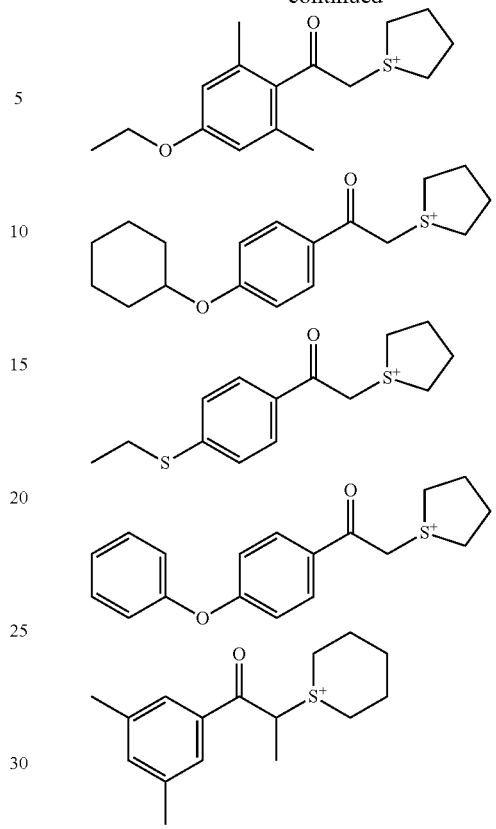

The compound (B) represented by General Formula (ZI-3) is preferably in the form of a low-molecular-weight compound, and its molecular weight is preferably 3,000 or less, more preferably 2.000 or less, and still more preferably 1,000 or less.

Examples of the non-nucleophilic anion as $Z^-$ include a sulfonate anion, a carboxylate anion, a sulfonylimide anion, a bis(alkylsulfonyl)imide anion, and a tris(alkylsulfonyl)methyl anion.

The non-nucleophilic anion is an anion having a noticeably low ability for causing a nucleophilic reaction, and is an anion which can suppress temporal decomposition caused by an intra-molecular nucleophilic reaction. Thus, the temporal stability of the composition is improved.

Examples of the sulfonate anion include an aliphatic sulfonate anion, an aromatic sulfonate anion, and a camphorsulfonate anion.

Examples of the carboxylate anion include an aliphatic carboxylate anion, an aromatic carboxylate anion, and an aralkyl carboxylate anion.

The aliphatic site in the aliphatic sulfonate anion and the aliphatic carboxylate anion may be either an alkyl group or a cycloalkyl group, but preferred examples thereof include an alkyl group having 1 to 30 carbon atoms and a cycloalkyl group having 3 to 30 carbon atoms. Examples of the aromatic group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group in the aliphatic sulfonate anion and the aromatic sulfonate anion may have a substituent.

Other examples of the non-nucleophilic anions include fluorinated phosphorus (for example, $PF_6^-$), fluorinated boron (for example, $BF_4^-$), and fluorinated antimony (for example, $SbF_6^-$).

The non-nucleophilic anion of $Z^-$ is preferably an aliphatic sulfonate anion substituted with a fluorine atom at least at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having 4 to 8 carbon atoms or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

The non-nucleophilic anion of $Z^-$ is preferably represented by General Formula (2). In this case, it is presumed that since the volume of the generated acid is increased and diffusion of an acid is suppressed, the improvement in exposure latitude is further promoted.

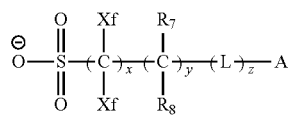

(2)

In General Formula (2),

Xf's each independently represent a fluorine atom or an alkyl group substituted with at least one fluorine atom, and Xf's that are present in plural numbers may be the same as or different from each other.

$R_7$ and $R_8$ each independently represent a hydrogen atom, a fluorine atom, an alkyl group, or an alkyl group substituted with at least one fluorine atom, and in a case where a plurality of $R_7$'s and $R_8$'s are present, they may be the same as or different from each other.

L represents a divalent linking group, and in a case where a plurality of L's are present, they may be the same as or different from each other.

A represents an organic group including a cyclic structure.

x represents an integer of 1 to 20, y represents an integer of 0 to 10, and z represents an integer of 0 to 10.

The anion of General Formula (2) will be described in more detail.

As described above, Xf is a fluorine atom or an alkyl group substituted with at least one fluorine atom, and the alkyl group in the alkyl group substituted with a fluorine atom is preferably an alkyl group having 1 to 10 carbon atoms, and more preferably an alkyl group having 1 to 4 carbon atoms. Further, the alkyl group substituted with a fluorine atom of Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom and $CF_3$ are preferable. In particular, it is preferable that both Xf's are fluorine atoms.

As described above, $R_6$ and $R_7$ each represent a hydrogen atom, a fluorine atom, an alkyl group, or an alkyl group substituted with at least one fluorine atom. An alkyl group having 1 to 4 carbon atoms is preferable, and a perfluoroalkyl group having 1 to 4 carbon atoms is more preferable. Specific examples of the alkyl group substituted with at least one fluorine atom of $R_6$ and $R_7$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

L represents a divalent linking group, and examples thereof include —COO—, —OCO—, —CO—, —O—, —S—, —SO—, —SO$_2$—, —N(Ri)- (in the formula, Ri represents a hydrogen atom or alkyl), an alkylene group (preferably an alkyl group having 1 to 6 carbon atoms, more preferably an alkyl group having 1 to 4 carbon atoms, particularly preferably a methyl group or an ethyl group, and most preferably a methyl group), a cycloalkylene group (preferably having 3 to 10 carbon atoms), an alkenylene group (preferably having 2 to 6 carbon atoms), and a divalent linking group obtained by combining a plurality of the groups. L is preferably —COO—, —OCO—, —CO—, —SO$_2$—, —CON(Ri)-, —SO$_2$N(Ri)-, —CON(Ri)-alkylene group-, —N(Ri)CO-alkylene group-, —COO— alkylene group-, or —OCO-alkylene group-, and more preferably —SO$_2$—, —COO—, —OCO—, —COO— alkylene group-, or —OCO-alkylene group-. The alkylene group in —CON(Ri)-alkylene group-, —N(Ri)CO-alkylene group-, —COO-alkylene group-, and —OCO-alkylene group- is preferably an alkylene group having 1 to 20 carbon atoms, and more preferably an alkylene group having 1 to 10 carbon atoms. In a case where a plurality of L's are present, they may be the same as or different from each other.

Specific examples and preferred examples of the alkyl group for Ri include the same ones as the specific examples and the preferred examples mentioned above as each of $R_1$ to $R_4$ in General Formula (1).

The organic group including the cyclic structure of A is not particularly limited as long as it has a cyclic structure, and examples of the organic group include an alicyclic group, an aryl group, a heterocyclic group (including the group having aromaticity or not having aromaticity, and including, for example, a tetrahydropyran ring, a lactone ring structure, and a sultone ring structure).

The alicyclic group may be monocyclic or polycyclic, and is preferably a monocyclic cycloalkyl group such as a cyclopentyl group, a cyclohexyl group, and a cyclooctyl group, or polycyclic cycloalkyl group such as a norbornyl group, a norbornenyl group, a tricyclodecanyl group (for example, a tricyclo[5.2.1.0$^{2,6}$]decanyl group), a tetracyclodecanyl group, a tetracyclododecanyl group, and an adamantyl group, with the adamantyl group being particularly preferable. Further, a nitrogen atom-containing alicyclic group such as a piperidine group, a decahydroquinoline group, and a decahydroisoquinoline group is also preferable. Among those, an alicyclic group with a bulky structure having 7 or more carbon atoms, such as a norbornyl group, a tricyclodecanyl group, a tetracyclodecanyl group, a tetracyclododecanyl group, an adamantyl group, an decahydroquinoline group, and a decahydroisoquinoline can suppress a diffusivity into a film in the post-exposure baking (PEB) step, and thus are preferable from the viewpoints of an improvement in exposure latitude. Among those, an adamantyl group and a decahydroisoquinoline group are particularly preferable.

Examples of the aryl group include a benzene ring, a naphthalene ring, a phenanthrene ring, and an anthracene ring. Among those, naphthalene with low absorbance is preferable from the viewpoint of light absorbance at 193 nm.

Examples of the heterocyclic group include a furan ring, a thiophene ring, a benzofuran ring, a benzothiophene ring, a dibenzofuran ring, a dibenzothiophene ring, and a pyridine ring. Among those, a furan ring, a thiophene ring, and a pyridine ring are preferable. Other preferred examples of the heterocyclic group include structures shown below (in the formula, X represents a methylene group or an oxygen atom, and R represents a monovalent organic group).

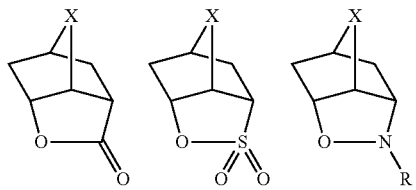

The cyclic organic group may have a substituent, and examples of the substituent include an alkyl group (which may be linear, branched, or cyclic, and preferably has 1 to 12 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group.

Incidentally, the carbon constituting the cyclic organic group (the carbon contributing to ring formation) may be a carbonyl carbon.

x is preferably 1 to 8, more preferably 1 to 4, and particularly preferably 1. y is preferably 0 to 4, more preferably 0 or 1, and still more preferably 1. z is preferably 0 to 8, more preferably 0 to 4, and still more preferably 1.

In General Formula (2), preferred examples of a combination of partial structures other than A include $SO_3^-$—$CF_2$—$CH_2$—OCO—, $SO_3^-$—$CF_2$—CHF—$CH_2$—OCO—, $SO_3^-$—$CF_2$—COO—, $SO_3^-$—$CF_2$—$CF_2$—$CH_2$—, and $SO_3^-$—$CF_2$—$CH(CF_3)$—OCO—.

Moreover, the non-nucleophilic anion as $Z^-$ is also preferably an anion represented by General Formula (3) or (4).

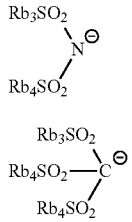

In the formulae, $Rb_3$ to $Rb_5$ each independently represent an alkyl group, a cycloalkyl group, or an aryl group. $Rb_3$ and $Rb_4$ may be bonded to each other to form a ring structure.

In General Formulae (3) and (4), $Rb_3$ to $Rb_5$ are each more preferably an alkyl group substituted with a fluorine atom or a fluoroalkyl group at the first position, or an aryl group (preferably a phenyl group) substituted with a fluorine atom or a fluoroalkyl group. In a case where the fluorine atom or the fluoroalkyl group is contained, the acidity of an acid generated upon irradiation with light is increased, and thus, the sensitivity is improved. In a case where $Rb_3$ to $Rb_5$ each have 5 or more carbon atoms, it is preferable that all of the hydrogen atoms of at least one carbon atom is not substituted with fluorine atoms, and it is more preferable that the number of hydrogen atoms is larger than that of fluorine atoms. In a case where a perfluoroalkyl group having 5 or more carbon atoms is not contained, the toxicity to ecology is reduced.

$Rb_3$ to $Rb_5$ are each preferably a perfluoroalkyl group having 1 to 4 carbon atoms, and more preferably a perfluoroalkyl group having 1 to 3 carbon atoms.

Examples of a group formed by the bonding of $Rb_3$ and $Rb_4$ include an alkylene group and an arylene group.

The group formed by the bonding of $Rb_3$ and $Rb_4$ is preferably a perfluoroalkylene group having 2 to 4 carbon atoms, and more preferably a perfluoropropylene group. In a case where $Rb_3$ and $Rb_4$ are bonded to form a ring structure, the acidity is improved and the sensitivity of the composition is also improved, as compared with a case of not forming the ring structure.

A particularly preferred aspect of $Rb_3$ to $Rb_5$ may include a group represented by the following general formula.

$Rc_7$-Ax-$Rc_6$-

In the general formula, $Rc_6$, represents a perfluoroalkylene group, and is more preferably a perfluoroalkylene group having 2 to 4 carbon atoms.

Ax represents a single bond or a divalent linking group (preferably —O—, —$CO_2$—, —S—, —$SO_3$—, or —$SO_2N$($Rd_1$)-). $Rd_1$ represents a hydrogen atom or an alkyl group, or may be bonded to $Rc_7$ to form a ring structure.

$Rc_7$ represents a hydrogen atom, a fluorine atom, an alkyl group, a cycloalkyl group, or an aryl group. It is preferable that the alkyl group, the cycloalkyl group, or the aryl group as $Rc_7$ does not have a fluorine atom as the substituent.

Specific examples of the anion represented by General Formula (3) are set forth below, but the present invention is not limited thereto.

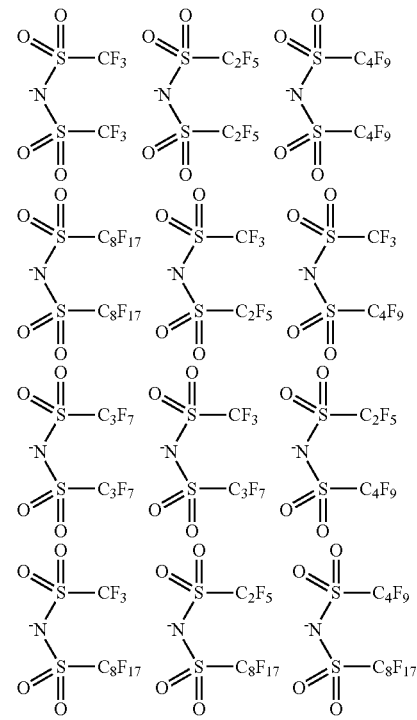

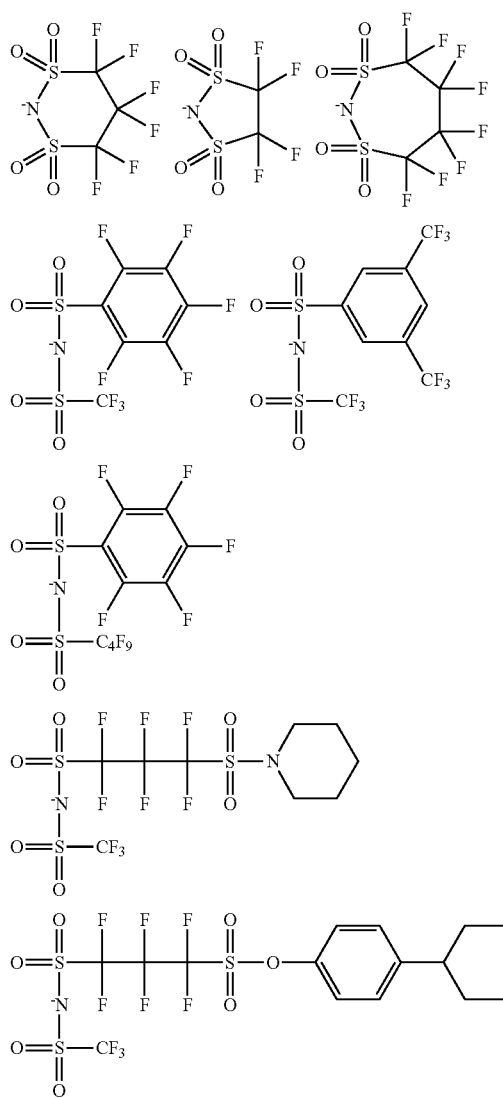

Specific examples of the anion represented by General Formula (4) are set forth below, but the present invention is not limited thereto.

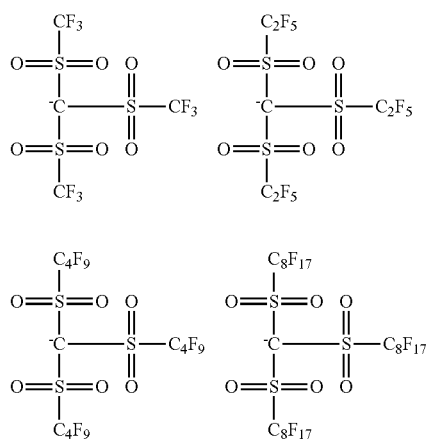

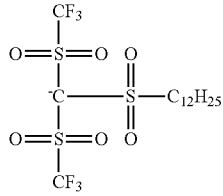

For the non-nucleophilic anion of $Z^-$, from the viewpoint of an acid strength, it is preferable that the pKa of the generated acid is −1 or less so as to improve the sensitivity.

The non-nucleophilic anion of Z preferably has a fluorine content represented by (a total mass of all the fluorine atoms included in the anion)/(a total mass of all the atoms included in the anion) of 0.25 or less, more preferably has the fluorine content of 0.20 or less, and still more preferably has the fluorine content of 0.15 or less.

The acid generator (particularly a compound represented by General Formula (ZI-3)) may be used singly or in combination of two or more kinds thereof.

In addition, the compound represented by General Formula (ZI-3) may be used in combination with an acid generator (hereinafter also referred to as an acid generator to be used in combination) other than the compound represented by General Formula (ZI-3).

The acid generator to be used in combination is not particularly limited, but preferred examples thereof include compounds represented by General Formulae (ZI'), (ZII'), and (ZIII').

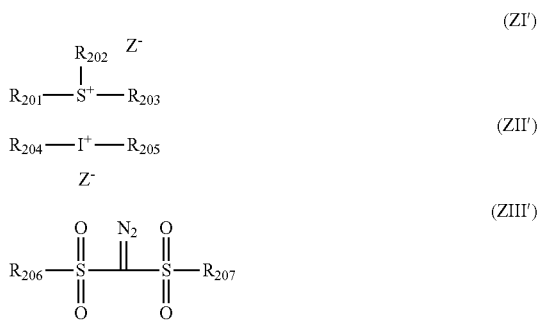

In General Formula (ZI'), $R_{201}$, $R_{202}$, and $R_{203}$ each independently represent an organic group.

The number of carbon atoms of the organic group as each of $R_{201}$, $R_{202}$, and $R_{203}$ is generally 1 to 30, and preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two of $R_{201}$ to $R_{203}$ include an alkylene group (for example, a butylene group and a pentylene group).

$Z^-$ represents a non-nucleophilic anion (anion having an extremely low ability of causing a nucleophilic reaction).

Examples of $Z^-$ include a sulfonate anion, a carboxylate anion (an aliphatic carboxylate anion, an aromatic carboxylate anion, an aralkyl carboxylate anion, and the like), a sulfonylimide anion, a bis(alkylsulfonyl)imide anion, and a tris(alkylsulfonyl)methide anion.

Specific examples and preferred examples of the sulfonate anion include the same ones as the specific examples and the preferred examples of the sulfonate anion mentioned for the sulfonate anion in General Formula (ZI-3).

Examples of the aliphatic site in the aliphatic carboxylate anion include the same ones as the aliphatic site mentioned for the sulfonate anion in General Formula (ZI-3).

Examples of the aromatic group in the aromatic carboxylate anion include the same ones as the aromatic group mentioned for the sulfonate anion in General Formula (ZI-3).

Preferred examples of the aralkyl group in the aralkyl carboxylate anion include an aralkyl group having 6 to 12 carbon atoms, such as a benzyl group, a phenethyl group, a naphthylmethyl group, a naphthylethyl group, and a naphthylbutyl group.

Examples of the sulfonylimide anion include a saccharin anion.

The alkyl group in each of the bis(alkylsulfonyl)imide anion and the tris(alkylsulfonyl)methide anion is preferably an alkyl group having 1 to 5 carbon atoms. Examples of the substituent of this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with the fluorine atom and the fluorine atom-substituted alkyl group being preferable.

Other examples of $Z^-$ include fluorinated phosphorus (for example, $PF_6^-$), fluorinated boron (for example, $BF_4^-$), and fluorinated antimony (for example, $SbF_6^-$).

The non-nucleophilic anion of $Z^-$ is preferably an aliphatic sulfonate anion substituted with a fluorine atom at least at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having 4 to 8 carbon atoms or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of an acid strength, it is preferable that the pKa of the generated acid is −1 or less so as to improve the sensitivity.

Examples of the organic group represented by each of $R_{201}$, $R_{202}$, and $R_{203}$ include corresponding groups in the compounds (ZI'-1) and (ZI'-2) which will be described later.

Incidentally, the compound may be a compound having a plurality of structures represented by General Formula (ZI'). For example, the compound may be a compound having a structure in which at least one of $R_{201}$, . . . , or $R_{203}$ in a compound represented by General Formula (ZI') is bonded to at least one of $R_{201}$, . . . , or $R_{203}$ in another compound represented by General Formula (ZI') through a single bond or a linking group.

More preferred examples of the component (ZI') include compounds (ZI'-1) and (ZI'-2) described below.

The compound (ZI'-1) is an arylsulfonium compound, that is, a compound having arylsulfonium as a cation, in which at least one of $R_{201}$, . . . , or $R_{203}$ in General Formula (ZI') is an aryl group.

In the arylsulfonium compound, all of $R_{201}$ to $R_{203}$ may be aryl groups, or some of $R_{201}$ to $R_{203}$ may be aryl groups and the remainders may be alkyl groups or cycloalkyl groups, but it is preferable that all of $R_{201}$ to $R_{203}$ are aryl groups.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound, and the arylsulfonium compound is preferably the triarylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, if desired, in the arylsulfonium compound, is preferably a linear or branched alkyl group having 1 to 15 carbon atoms or a cycloalkyl group having 3 to 15 carbon atoms, for example, a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may have an alkyl group (for example, an alkyl group having 1 to 15 carbon atoms), a cycloalkyl group (for example, a cycloalkyl group having 3 to 15 carbon atoms), an aryl group (for example, an aryl group having 6 to 14 carbon atoms), an alkoxy group (for example, an alkoxy group having 1 to 15 carbon atoms), a halogen atom, a hydroxyl group, or a phenylthio group as a substituent. Preferred examples of the substituent include a linear or branched alkyl group having 1 to 12 carbon atoms, a cycloalkyl group having 3 to 12 carbon atoms, and a linear, branched, or cyclic alkoxy group having 1 to 12 carbon atoms, and more preferably an alkyl group having 1 to 4 carbon atoms and an alkoxy group having 1 to 4 carbon atoms. The substituent may be substituted to any one of three $R_{201}$ to $R_{203}$ or may be substituted to three all of them. Further, in a case where $R_{201}$ to $R_{203}$ are each an aryl group, the substituent is preferably substituted at the p-position of the aryl group.

Next, the compound (ZI'-2) will be described.

The compound (ZI'-2) is a compound in which $R_{201}$ to $R_{203}$ in Formula (ZI') each independently represent an organic group not having an aromatic ring. Here, the aromatic ring also encompasses an aromatic ring containing a heteroatom.

The organic group, as each of $R_{201}$ to $R_{203}$, containing no aromatic ring has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

As the alkyl group and the cycloalkyl group of each of $R_{201}$ to $R_{203}$, a linear or branched alkyl group having 1 to 10 carbon atoms (for example, a methyl group, an ethyl group, a propyl group, a butyl group, and a pentyl group), or a cycloalkyl group having 3 to 10 carbon atoms (a cyclopentyl group, a cyclohexyl group, and a norbornyl group) is preferable. More preferred examples of the alkyl group include a 2-oxoalkyl group and an alkoxycarbonylmethyl group.

More preferred examples of the alkyl cycloalkyl group include a 2-oxocycloalkyl group.

The 2-oxoalkyl group may be linear or branched, and preferred examples thereof include a group having >C=O on the 2-position of the alkyl group.

Preferred examples of the 2-oxocycloalkyl group include a group having >C=O on the 2-position of the cycloalkyl group.

Preferred examples of the alkoxy group in the alkoxycarbonylmethyl group include an alkoxy group having 1 to 5 carbon atoms (a methoxy group, an ethoxy group, a propoxy group, a butoxy group, and a pentoxy group).

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next General Formulae (ZII') and (ZIII') will be described.

In General Formulae (ZIT') and (ZIII'), $R_{204}$ to $R_{207}$ each independently represent an aryl group, an alkyl group, or a cycloalkyl group.

The aryl group, the alkyl group, or the cycloalkyl group as each of $R_{204}$ to $R_{207}$ is the same as the aryl group described as the aryl group, the alkyl group, or the cycloalkyl group of each of $R_{201}$ to $R_{203}$ in the above-mentioned compound (ZI'-1).

The aryl group, the alkyl group, or the cycloalkyl group as each of $R_{204}$ to $R_{207}$ may have a substituent. Examples of the substituent include the substituents which may be contained in the aryl group, the alkyl group, or the cycloalkyl group of each of $R_{201}$ to $R_{203}$ in the above-mentioned compound (ZI'-1).

$Z^-$ represents a non-nucleophilic anion, and examples thereof include the same ones as the non-nucleophilic anion of $Z^-$ in General Formula (ZI').

Other examples of the acid generator to be used in combination which can be used together with the compound (ZI-3) in the present invention include compounds represented by General Formulae (ZIV'), (ZV'), and (ZVI').

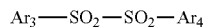

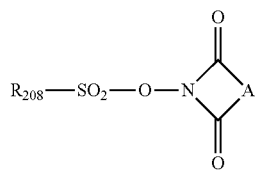

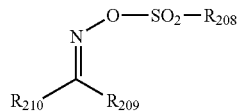

In General Formulae (ZIV') to (ZVI'), $Ar_3$ and $Ar_4$ each independently represent an aryl group.

$R_{208}$, $R_{209}$, and $R_{210}$ each independently represent an alkyl group, a cycloalkyl group, or an aryl group.

A represents an alkylene group, an alkenylene group, or an arylene group.

Specific examples of the aryl group of each of $Ar_3$, $Ar_4$, $R_{208}$, $R_{209}$, and $R_{210}$ include the same ones as the specific examples of the aryl group of each of $R_{201}$, $R_{202}$, and $R_{203}$ in General Formula (ZI'-1).

Specific examples of the alkyl group and the cycloalkyl group of $R_{208}$, $R_{209}$, and $R_{210}$ include the same ones as the specific examples of the alkyl group and the cycloalkyl group of each of $R_{201}$, $R_{202}$, and $R_{203}$ in General Formula (ZI'-2).

Examples of the alkylene group of A include an alkylene having 1 to 12 carbon atoms (for example, a methylene group, an ethylene group, a propylene group, an isopropylene group, a butylene group, and an isobutylene group), examples of the alkenylene group of A include an alkenylene group having 2 to 12 carbon atoms (for example, an ethenylene group, a propenylene group, and a butenylene group), and examples of the arylene group of A include an arylene group having 6 to 10 carbon atoms (for example, a phenylene group, a tolylene group, and a naphthylene group).

Among the acid generators to be used in combination which can be used together with the compound (ZI-3) in the present invention, particularly preferred examples are set forth below.

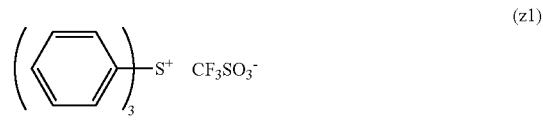

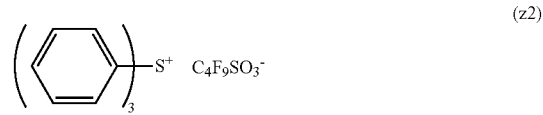

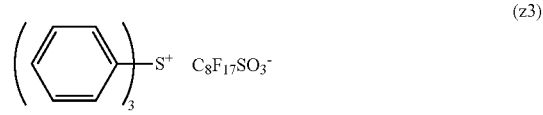

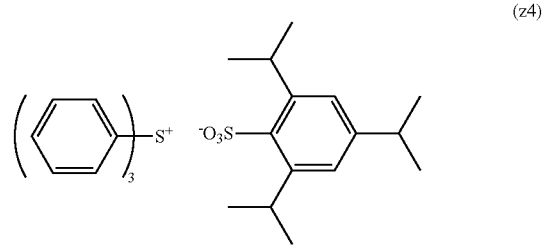

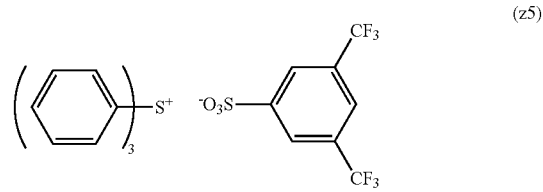

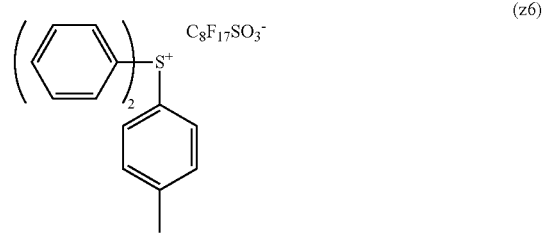

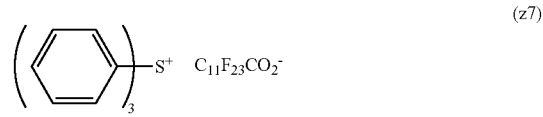

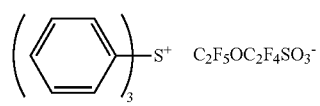 (z8)
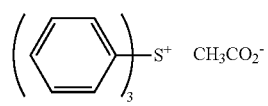 (z9)
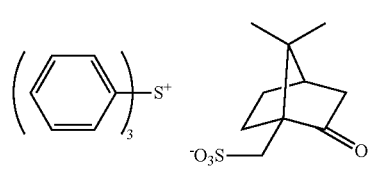 (z10)
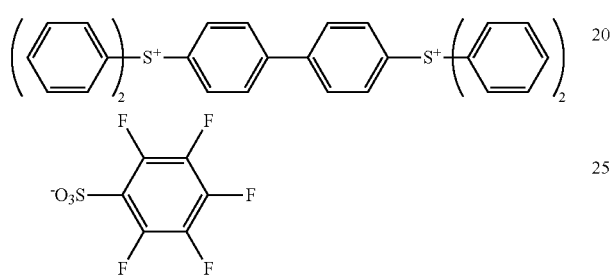 (z11)
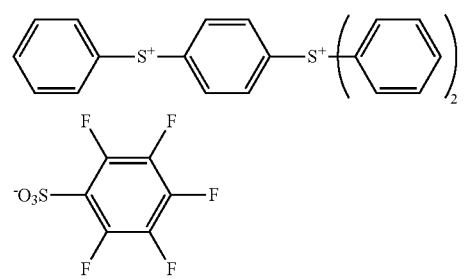 (z12)
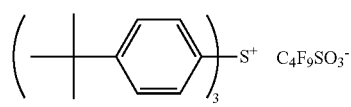 (z13)
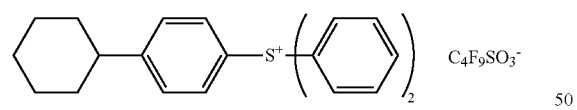 (z14)
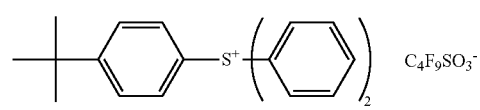 (z15)
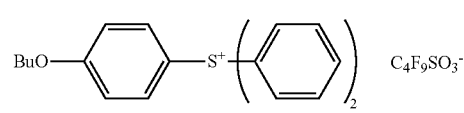 (z16)
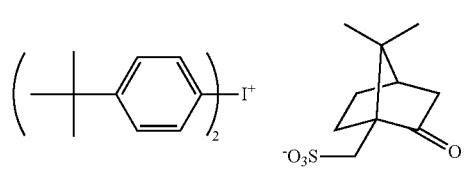 (z17)
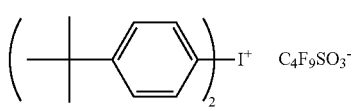 (z18)
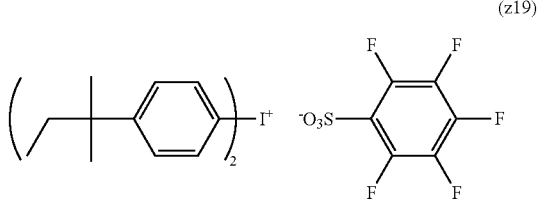 (z19)
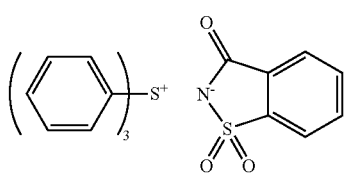 (z20)
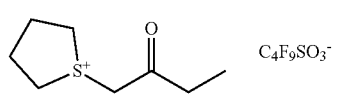 (z21)
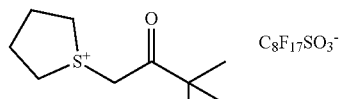 (z22)
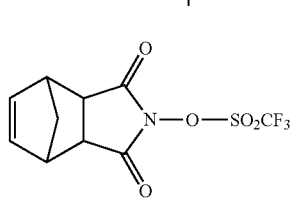 (z23)
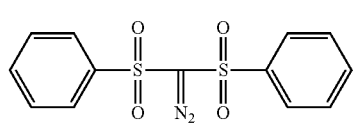 (z24)
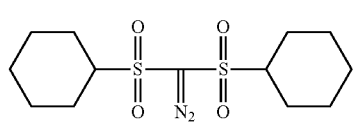 (z25)
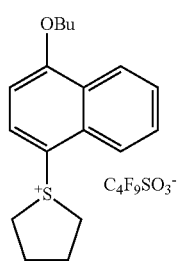 (z26)
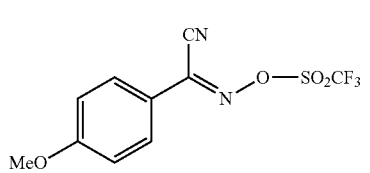 (z27)

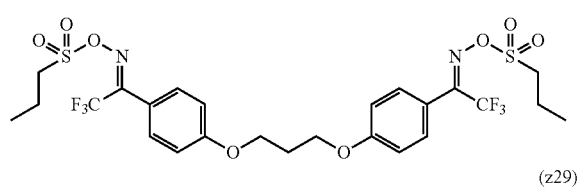 (z28)
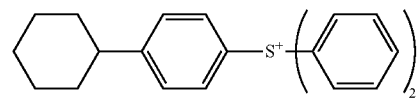 (z29)
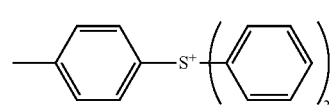 (z30)
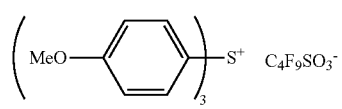 (z31)
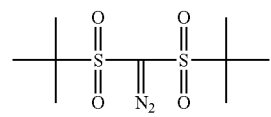 (z32)
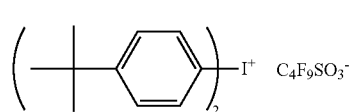 (z33)
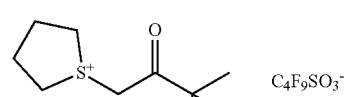 (z34)
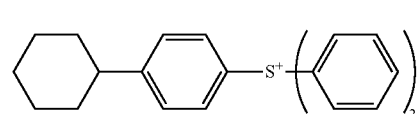 (z35)
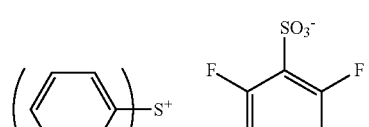 (z36)
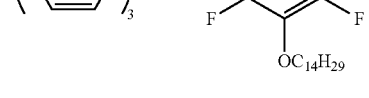 (z37)
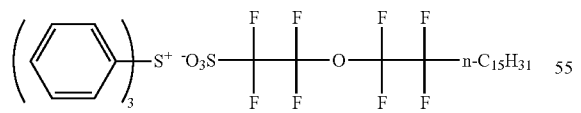 (z38)
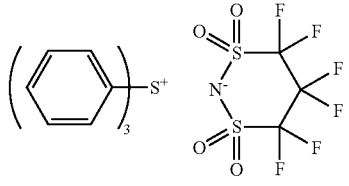 (z39)
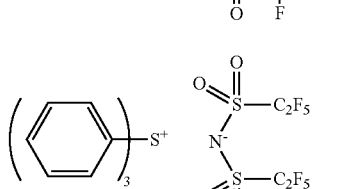 (z40)
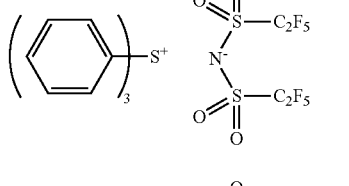 (z41)
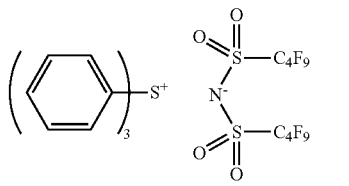 (z42)
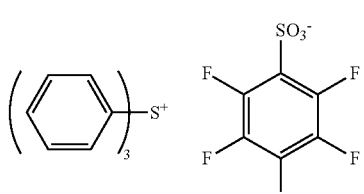 (z43)
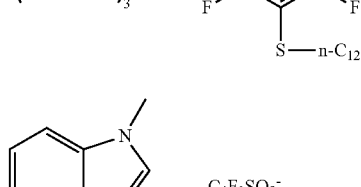 (z44)
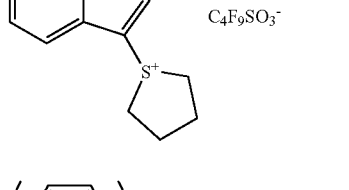 (z45)
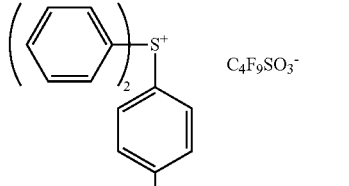 (z46)
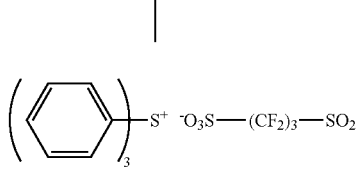 (z47)

-continued
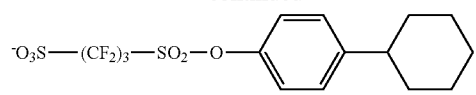 (z48)
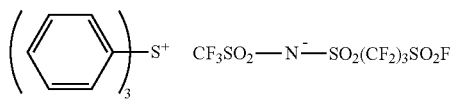 (z49)
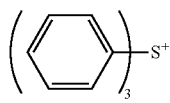
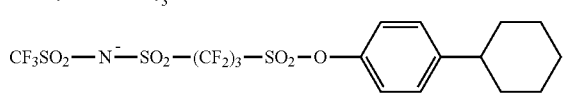 (z50)
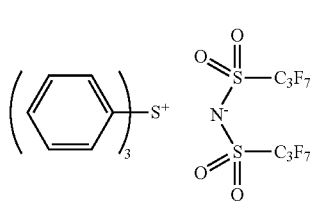 (z51)
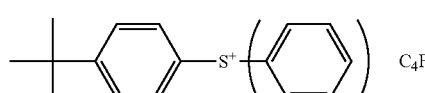 (z52)
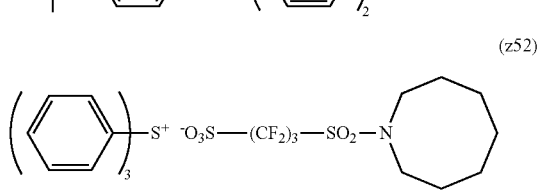 (z53)
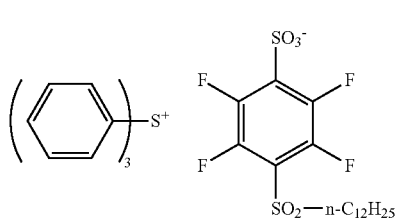 (z54)
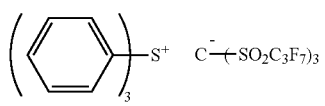 (z55)
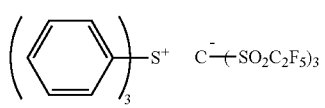 (z56)
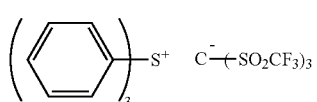
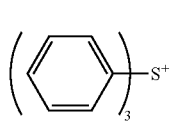 (z57)
-continued
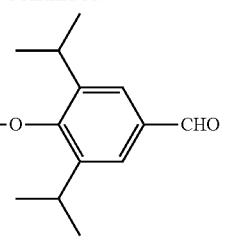
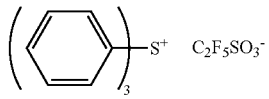 (z58)
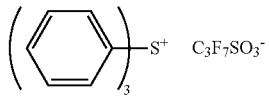 (z59)
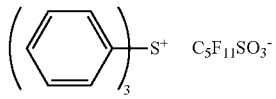 (z60)
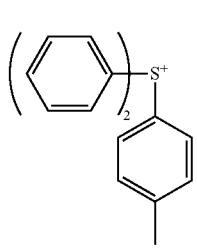 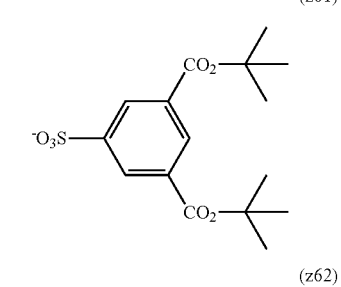 (z61)
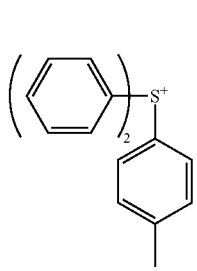 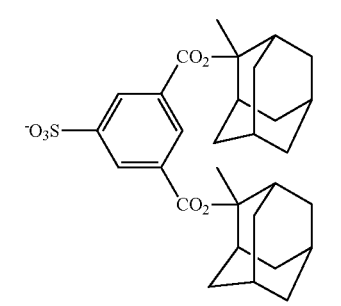 (z62)
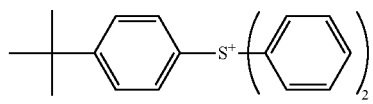 (z63)
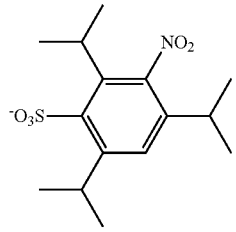
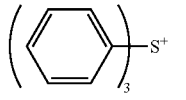 (z64)

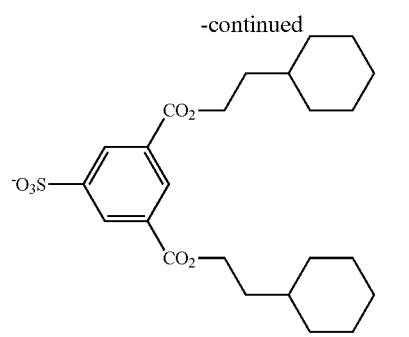
(z65)

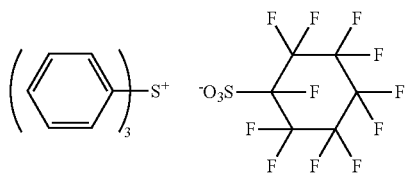
(z66)

(z67)

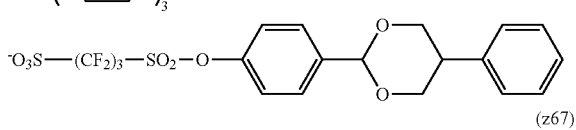
(z68)

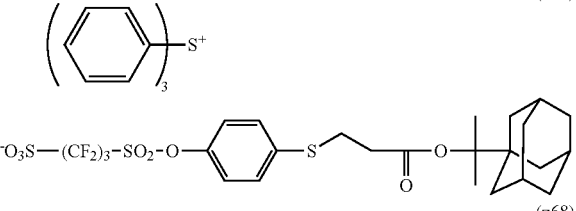
(z69)

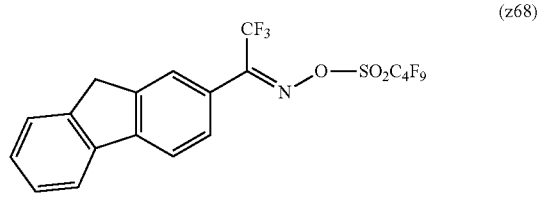
(z70)

The amount of the acid generator to be used in a case where the compound represented by General Formula (ZI-3) and the acid generator to be used in combination are used together, the molar ratio (compound represented by General Formula (ZI-3)/acid generator to be used in combination) is usually 99/1 to 20/80, preferably 99/1 to 40/60, and more preferably 99/1 to 50/50.

The content of the compound (B) in the composition (the total content in a case of using a plural kinds of the compounds (B)) is preferably 0.1% to 30% by mass, more preferably 0.2% to 25% by mass, still more preferably 0.3% to 20% by mass, and particularly preferably 0.5% to 15% by mass, with respect to the total solid content of the composition.

<Hydrophobic Resin>

The composition of the present invention may contain a hydrophobic resin. Further, the hydrophobic resin is preferably different from the resin (A).

Although the hydrophobic resin is preferably designed to be unevenly distributed on an interface as described above, it does not necessarily have to have a hydrophilic group in its molecule as different from the surfactant, and does not need to contribute to uniform mixing of polar/nonpolar materials.

Examples of the effect of addition of the hydrophobic resin include suppression of out gas.

The hydrophobic resin preferably has at least one of a "fluorine atom", a "silicon atom", or a "$CH_3$ partial structure which is contained in a side chain moiety of a resin" from the viewpoint of uneven distribution on the film surface layer, and more preferably has two or more kinds.

In a case where hydrophobic resin includes a fluorine atom and/or a silicon atom, the fluorine atom and/or the silicon atom in the hydrophobic resin may be contained in the main chain or the side chain of the resin.

In a case where the hydrophobic resin includes a fluorine atom, it is preferably a resin having an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group such as a phenyl group and a naphthyl group, in which at least one hydrogen atom is substituted with a fluorine atom, and may further have a substituent other than a fluorine atom.

Preferred examples of the alkyl group having a fluorine atom, the cycloalkyl group having a fluorine atom, and the aryl group having a fluorine atom include groups represented by General Formulae (F2) to (F4), but the present invention is not limited thereto.

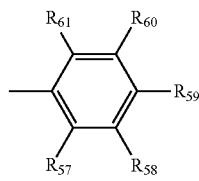
(F2)

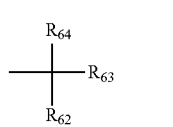
(F3)

-continued

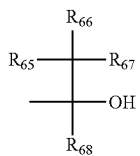
(F4)

In General Formulae (F2) to (F4), $R_{57}$ to $R_{68}$ each independently represent a hydrogen atom, a fluorine atom, or an (linear or branched) alkyl group, a provided that at least one of $R_{57}, \ldots,$ or $R_{61}$, at least one of $R_{62}, \ldots,$ or $R_{64}$, and at least one of $R_{65}, \ldots,$ or $R_{68}$ each independently represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include those described in [0500] of US2012/0251948A1.

Specific examples of the group represented by General Formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferable.

The partial structure including a fluorine atom may be directly bonded to a main chain, or bonded to a main chain via a group selected from the group consisting of an alkylene group, a phenylene group, an ether bond, a thioether bond, a carbonyl group, an ester bond, an amide bond, a urethane bond, and a ureylene bond, or a group formed by combining two or more of these groups.

The hydrophobic resin may contain a silicon atom. The hydrophobic resin is preferably a resin having an alkylsilyl structure (preferably a trialkylsilyl group) or a cyclic siloxane structure as the partial structure having a silicon atom.

Examples of the alkylsilyl structure or the cyclic siloxane structure include the partial structures described in paragraphs <0304> to <0307> of JP2013-178370A.

Examples of the repeating unit having a fluorine atom or a silicon atom include those exemplified in [0519] of US2012/0251948A1.

Moreover, it is also preferable that the hydrophobic resin includes a CH$_3$ partial structure in the side chain moiety as described above.

Here, the CH$_3$ partial structure contained in the side chain moiety in the hydrophobic resin includes a CH$_3$ partial structure contained in an ethyl group, a propyl group, and the like.

On the other hand, a methyl group bonded directly to the main chain of the hydrophobic resin (for example, an α-methyl group in the repeating unit having a methacrylic acid structure) makes only a small contribution of uneven distribution to the surface of the hydrophobic resin due to the effect of the main chain, and it is therefore not included in the CH$_3$ partial structure.

More specifically, in a case where the hydrophobic resin contains a repeating unit derived from a monomer having a polymerizable moiety with a carbon-carbon double bond, such as a repeating unit represented by General Formula (M), and in addition, $R_{11}$ to $R_{14}$ are CH$_3$ "themselves," such CH$_3$ is not included in the CH$_3$ partial structure contained in the side chain portion in the present invention.

On the other hand, a CH$_3$ partial structure which is present via a certain atom from a C—C main chain corresponds to the CH$_3$ partial structure in the present invention. For example, in a case where $R_{11}$ is an ethyl group (CH$_2$CH), the hydrophobic resin has "one" CH$_3$ partial structure in the present invention.

(M)

In General Formula (M).

$R_{11}$ to $R_{14}$ each independently represent a side chain portion.

Examples of $R_{11}$ to $R_{14}$ at the side chain portion include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The hydrophobic resin is preferably a resin including a repeating unit having the CH$_3$ partial structure in the side chain portion thereof. Further, the hydrophobic resin more preferably has, as such a repeating unit, at least one repeating unit (x) selected from a repeating unit represented by General Formula (II) or a repeating unit represented by General Formula (III).

Hereinafter, the repeating unit represented by General Formula (II) will be described in detail.

(II)

In General Formula (II), $X_{b1}$ represents a hydrogen atom, an alkyl group, a cyano group, or a halogen atom, and $R_2$ represents an organic group which has one or more CH$_3$ partial structures and is stable against an acid. Here, more specifically, the organic group which is stable against an acid is preferably an organic group which does not have an "acid-decomposable group" described with respect to the resin (A).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more $CH_3$ partial structures.

The number of the $CH_3$ partial structures contained in the organic group which has one or more $CH_3$ partial structures and is stable against an acid as $R_2$ is preferably 2 to 10, and more preferably 2 to 8.

Specific preferred examples of the repeating unit represented by General Formula (II) are set forth below, but the present invention is not limited thereto.

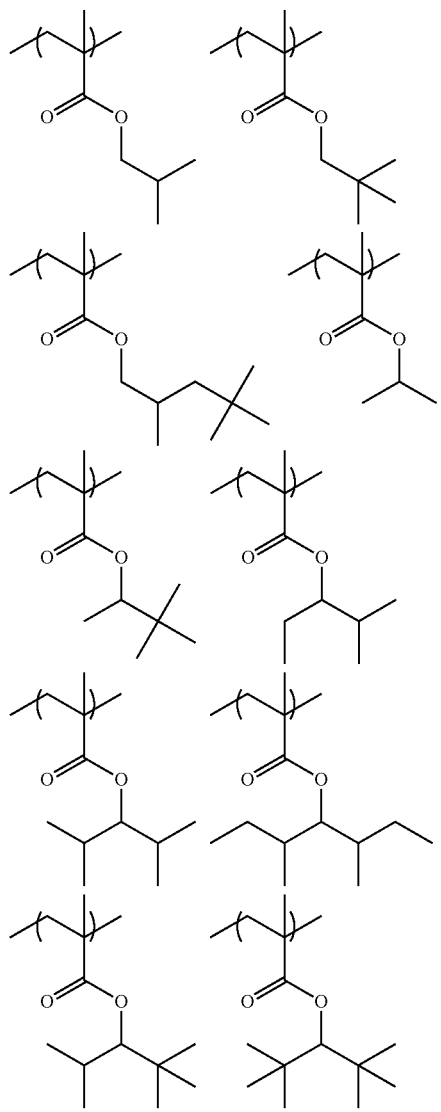

-continued

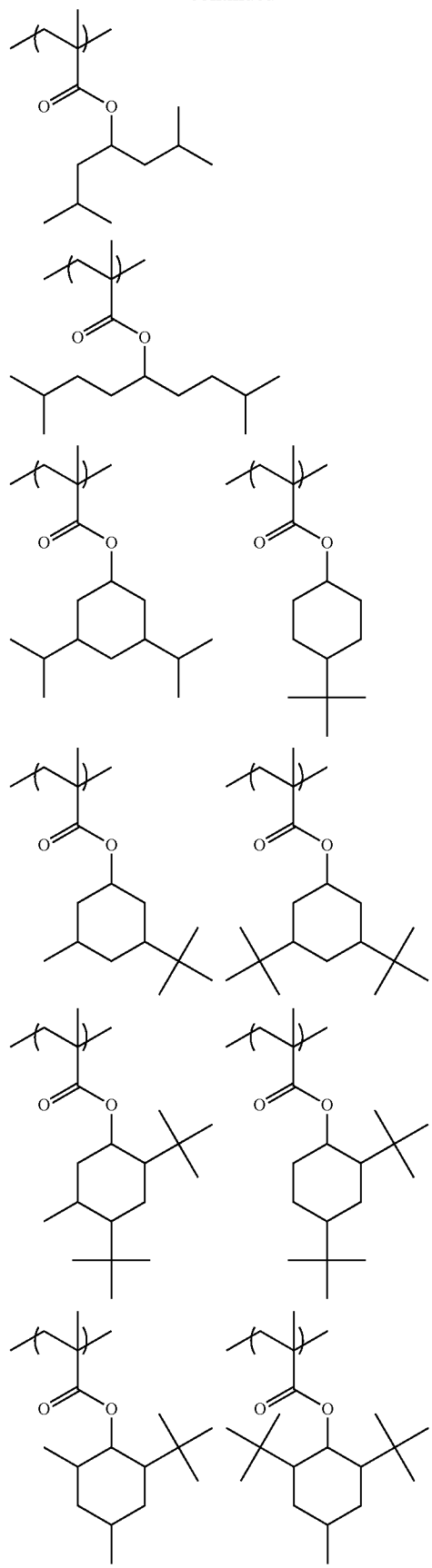

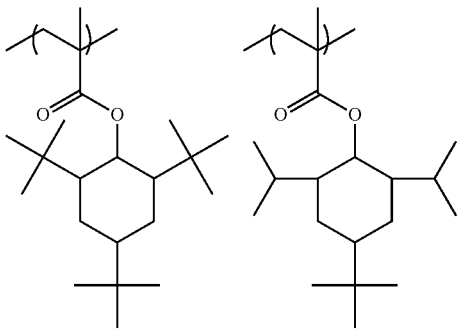

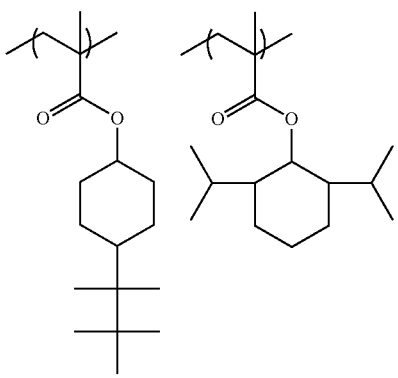

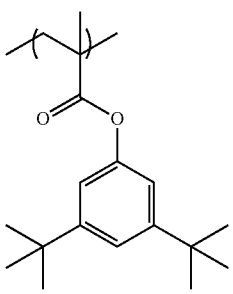

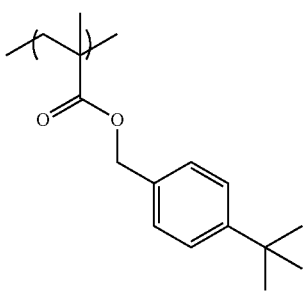

The repeating unit represented by General Formula (II) is preferably a repeating unit which is stable against an acid (non-acid-decomposable), and specifically, it is preferably a repeating unit not having a group that decomposes by the action of an acid to generate a polar group.

Hereinafter, the repeating unit represented by General Formula (III) will be described in detail.

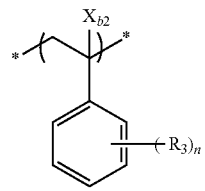

(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group stable against an acid, more specifically, $R_3$ is preferably an organic group which does not have the "acid-decomposable group" described with respect to the resin (A).

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably from 1 to 10, more preferably from 1 to 8, and still more preferably from 1 to 4.

n represents an integer of 1 to 5, more preferably 1 to 3, and still more preferably 1 or 2.

Specific preferred examples of the repeating unit represented by General Formula (III) are set forth below, but the present invention is not limited thereto.

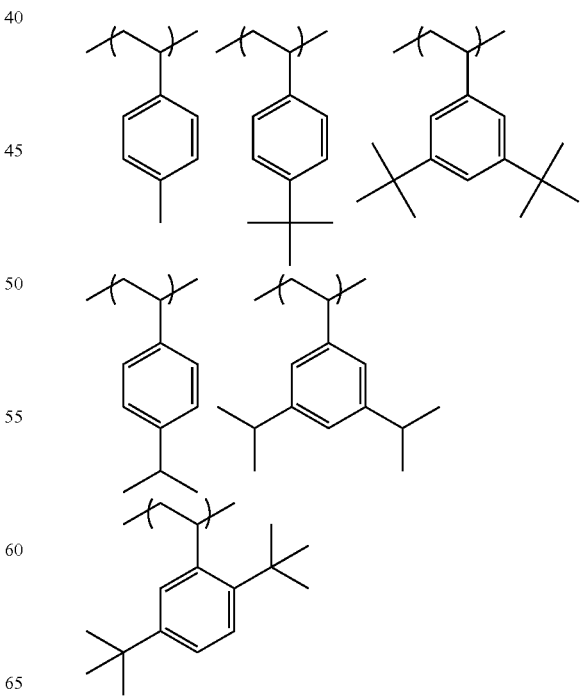

The repeating unit represented by General Formula (III) is preferably a repeating unit which is stable against an acid (non-acid-decomposable), and specifically, it is preferably a repeating unit which does not have "a group that decomposes by the action of an acid to generate a polar group".

In a case where the hydrophobic resin includes a $CH_3$ partial structure in the side chain portion thereof, and in particular, it has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the hydrophobic resin. Further, the content is usually 100% by mole or less with respect to all the repeating units of the hydrophobic resin.

By incorporating at least one repeating unit (x) of the repeating unit represented by General Formula (II) or the repeating unit represented by General Formula (III) in a proportion of 90% by mole or more with respect to all the repeating units of the hydrophobic resin into the hydrophobic resin, the surface free energy of the hydrophobic resin is increased. As a result, it is difficult for the hydrophobic resin to be unevenly distributed on the surface of the resist film and the static/dynamic contact angle of the resist film with respect to water can be securely increased, thereby enhancing the immersion liquid tracking properties.

In addition, in a case where the hydrophobic resin contains (i) a fluorine atom and/or a silicon atom or (ii) a $CH_3$ partial structure in the side chain moiety, the hydrophobic resin may have at least one group selected from the following groups (x) to (z):

(x) an acid group,
(y) a group having a lactone structure, an acid anhydride group, or an acid imido group, and
(z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the acid group include a fluorinated alcohol group (preferably a hexafluoroisopropanol group), a sulfonimido group, and a bis(alkylcarbonyl)methylene group.

Examples of the repeating unit having an acid group (x) include a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the polymer chain terminal by using a polymerization initiator or chain transfer agent containing an acid group during the polymerization. All of these cases are preferable. The repeating unit having an acid group (x) may have at least one of a fluorine atom or a silicon atom.

The content of the repeating units having an acid group (x) is preferably 1% to 50% by mole, more preferably 3% to 35% by mole, and still more preferably 5% to 20% by mole, with respect to all the repeating units in the hydrophobic resin.

Specific examples of the repeating unit having an acid group (x) are set forth below, but the present invention is not limited thereto. In the formulae, Rx represents a hydrogen atom, $CH_3$, $CF_3$, or $CH_2OH$.

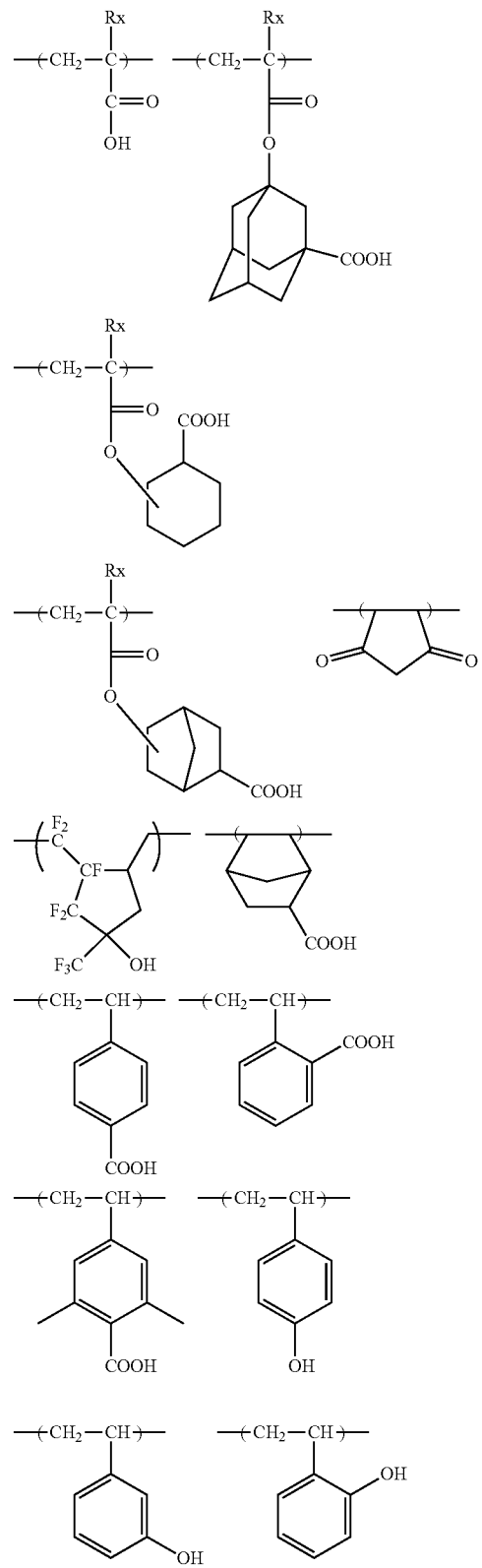

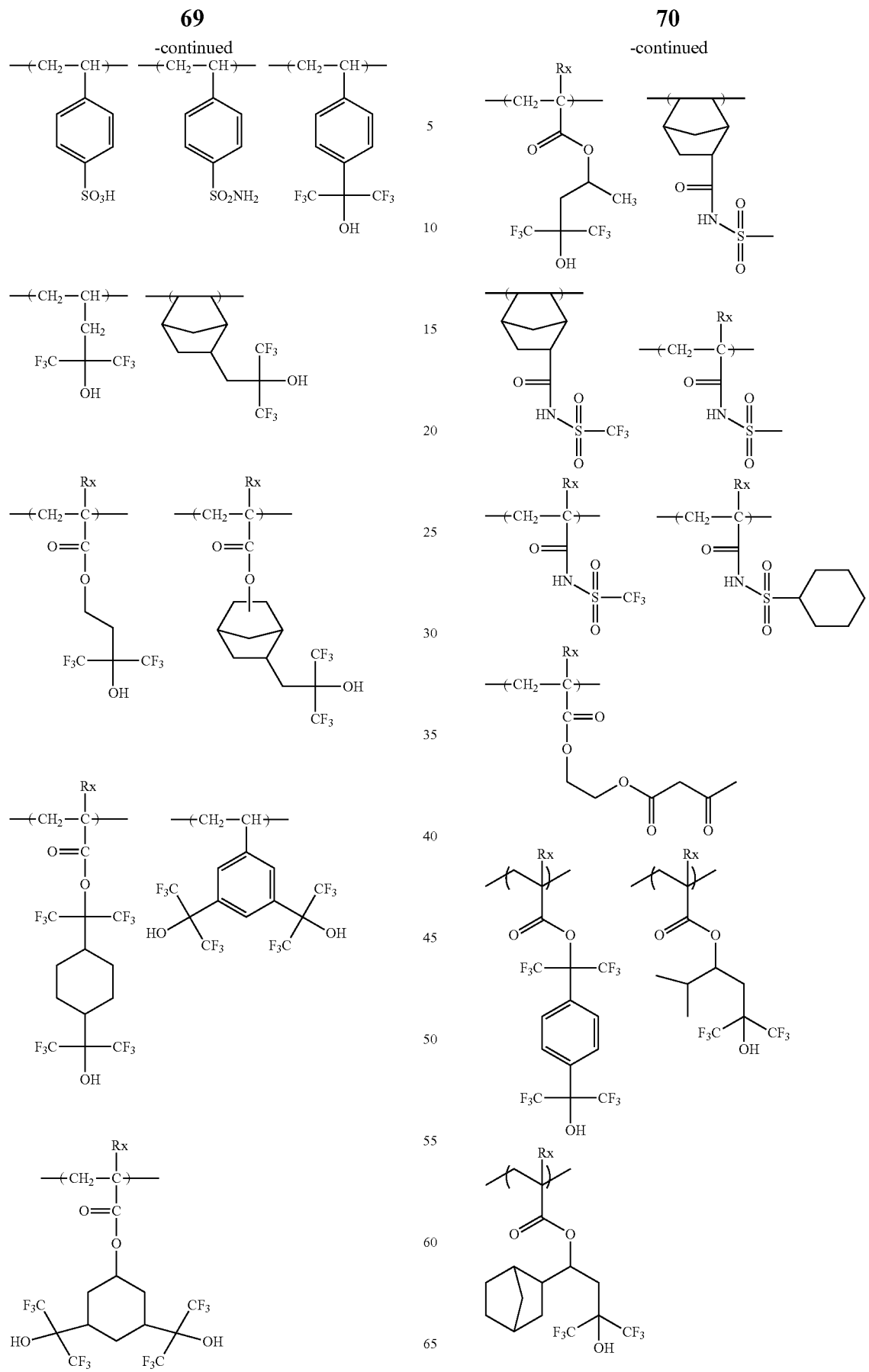

As the group having a lactone structure, the acid anhydride group, or the acid imido group (y), a group having a lactone structure is particularly preferable.

The repeating unit including the group is, for example, a repeating unit in which the group is directly bonded to the main chain of the resin, such as a repeating unit by an acrylic ester or a methacrylic ester. This repeating unit may be a repeating unit in which the group is bonded to the main chain of the resin through a linking group. Alternatively this repeating unit may be introduced into the terminal of the resin by using a polymerization initiator or chain transfer agent containing the group during the polymerization.

Examples of the repeating unit containing a group having a lactone structure include the same ones as the repeating unit having a lactone structure as described earlier in the section of the resin (A).

The content of the repeating units having a group having a lactone structure, an acid anhydride group, or an acid imido group is preferably 1% to 100%, by mole, more preferably 3% to 98% by mole, and still more preferably 5% to 95% by mole, with respect to all the repeating units in the hydrophobic resin.

With respect to the hydrophobic resin, examples of the repeating unit having a group (z) that decomposes by the action of an acid include the same ones as the repeating units having an acid-decomposable group, as exemplified in the resin (A). The repeating unit having a group (z) that decomposes by the action of an acid may have at least one of a fluorine atom or a silicon atom. With respect to the hydrophobic resin, the content of the repeating units having a group (z) that decomposes by the action of an acid is preferably 1% to 80% by mole, more preferably 10% to 80% by mole, and still more preferably 20% to 60% by mole, with respect to all the repeating units in the hydrophobic resin.

In a case where the hydrophobic resin has fluorine atoms, the content of the fluorine atoms is preferably 5% to 80% by mass, and more preferably 10% to 80% by mass, with respect to the weight-average molecular weight of the hydrophobic resin. In addition, the repeating unit including a fluorine atom is preferably in the amount of 10% to 100% by mole, and more preferably in the amount of 30% to 100% by mole, with respect to all the repeating units included in the hydrophobic resin.

In a case where the hydrophobic resin has a silicon atom, the content of the silicon atom is preferably 2% to 50% by mass, and more preferably 2% to 30% by mass, with respect to the weight-average molecular weight of the hydrophobic resin. In addition, the repeating unit including a silicon atom is preferably in the amount of 10% to 100% by mole, and more preferably in the amount of 20% to 100% by mole, with respect to all the repeating units in the hydrophobic resin.

On the other hand, in particular, in a case where the hydrophobic resin includes a $CH_3$ partial structure in the side chain moiety thereof, it is also preferable that the hydrophobic resin has a form substantially not having any one of fluorine atoms and silicon atoms. In this case, specifically, the content of the repeating unit having a fluorine atom or a silicon atom is preferably 5% by mole or less, more preferably 3% by mole or less, and still more preferably 1% by mole or less, with respect to all the repeating units in the hydrophobic resin, and ideally, the content is 0% by mole, that is, the hydrophobic resin does not contain a fluorine atom and a silicon atom. In addition, it is preferable that the hydrophobic resin is substantially composed only of repeating units which are composed only of atoms selected from a carbon atom, an oxygen atom, a hydrogen atom, a nitrogen atom and a sulfur atom. More specifically, the proportion of the repeating units which are composed only of atoms selected from a carbon atom, an oxygen atom, a hydrogen atom, a nitrogen atom, and a sulfur atom is preferably 95% by mole or more, more preferably 97% by mole or more, still more preferably 99% by mole or more, and ideally 100% by mole, in all the repeating units in the hydrophobic resin.

The weight-average molecular weight in terms of standard polystyrene, of the hydrophobic resin, is preferably 1,000 to 100,000, more preferably 1,000 to 50,000, and still more preferably 2,000 to 15,000.

Furthermore, the hydrophobic resin may be used singly or in combination of a plurality of kinds thereof.

The content of the hydrophobic resin in the composition is preferably 0.01% to 10% by mass, more preferably 0.05% to 8% by mass, and still more preferably 0.1% to 7% by mass, with respect to the total solid contents of the composition of the present invention.

It is natural that the hydrophobic resin contains a small amount of impurities such as metals, but the amount of remaining monomers and oligomer components in the hydrophobic resin is preferably 0.01% to 5% by mass, more preferably 0.01% to 3% by mass, and still more preferably 0.05% to 1% by mass. Thus, a composition having no temporal change in foreign substances in a liquid, sensitivity, and the like is obtained. Further, the molecular weight distribution (Mw/Mn, also referred to as a dispersity) is preferably in a range of 1 to 5, more preferably in a range of 1 to 3, and still more preferably in a range of 1 to 2, in views of a resolution, a resist shape, side walls of a resist pattern, roughness, and the like.

As the hydrophobic resin, various commercial products can also be used, or the resin can be synthesized by an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 to 10 hours, with the dropwise addition polymerization method being preferable.

A reaction solvent, a polymerization initiator, reaction conditions (a temperature, a concentration, and the like), and a purification method after the reaction are the same as those described for the resin (A), but in the synthesis of the hydrophobic resin, the concentration of the reaction is preferably 30% to 50% by mass.

<Acid Diffusion Control Agent (D)>

The composition of the present invention preferably contains an acid diffusion control agent (D). The acid diffusion control agent (D) acts as a quencher that inhibits a reaction of the acid-decomposable resin in the unexposed area by excessive generated acids by trapping the acids generated from an acid generator or the like upon exposure. As the acid diffusion control agent (D), a basic compound, a low-molecular-weight compound which has a nitrogen atom and a group that leaves by the action of an acid, a basic compound whose basicity is reduced or lost upon irradiation with actinic rays or radiation, or an onium salt which becomes a relatively weak acid with respect to the acid generator upon irradiation with actinic rays or radiation can be used.

Preferred examples of the basic compound include compounds having structures represented by Formulae (A) to (E).

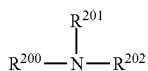 (A)

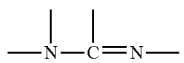 (B)

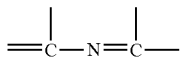 (C)

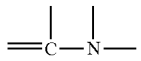 (D)

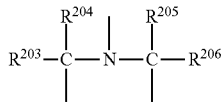 (E)

In General Formulae (A) and (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms), and $R^{201}$ and $R^{202}$ may be bonded to each other to form a ring.

$R^{203}$, $R^{204}$, $R^{205}$, and $R^{206}$ may be the same as or different from each other, and each represent an alkyl group having 1 to 20 carbon atoms.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in General Formulae (A) and (E) are more preferably unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Specific preferred examples of the compound include the compounds exemplified in <0379> of US2012/0219913A1.

Preferred examples of the basic compound include an amine compound having a phenoxy group, an ammonium salt compound having a phenoxy group, an amine compound containing a sulfonic ester group, and an ammonium salt compound having a sulfonic ester group.

As the amine compound, a primary, secondary, or tertiary amine compound can be used, and an amine compound in which at least one alkyl group is bonded to a nitrogen atom is preferable. The amine compound is more preferably a tertiary amine compound. Any amine compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group. The amine compound preferably has an oxygen atom in the alkyl chain to form an oxyalkylene group. The number of the oxyalkylene groups within the molecule is 1 or more, preferably 3 to 9, and more preferably from 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. Any ammonium salt compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group. The ammonium salt compound preferably has an oxygen atom in the alkyl chain to form an oxyalkylene group. The number of the oxyalkylene groups within the molecule is 1 or more, preferably 3 to 9, and more preferably 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

Examples of the anion of the ammonium salt compound include a halogen atom, sulfonate, borate, and phosphate, and among these, the halogen atom and sulfonate are preferable.

Furthermore, the following compounds are also preferable as the basic compound.

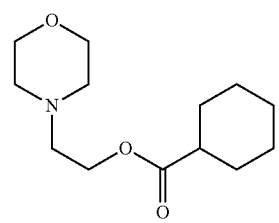 (MO-1)

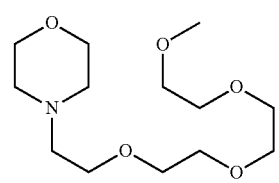 (MO-2)

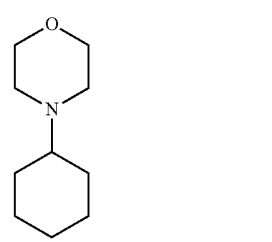 (MO-3)

-continued

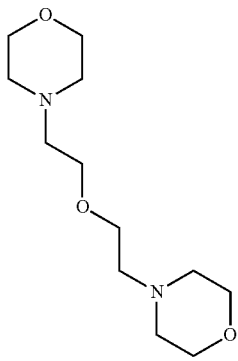
(MO-4)

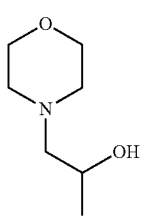
(MO-5)

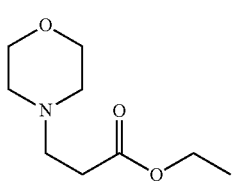
(MO-6)

In addition to the compounds as described above, as the basic compound, the compounds described in [0180] to [0225] of JP2011-22560A, [0218] to [0219] of JP2012-137735A, and [0416] to [0438] of WO2011/158687A1, and the like can also be used.

These basic compounds may be used singly or in combination of two or more kinds thereof.

The composition of the present invention may or may not contain a basic compound, but in a case where it contains the basic compound, the content of the basic compound is usually 0.001% to 10% by mass, and preferably 0.01% to 5% by mass, with respect to the solid content of the composition.

The ratio of between the acid generator (a total amount in a case of using plural kinds of the acid generators) and the basic compound to be used in the composition is preferably acid generator/basic compound (molar ratio)=2.5 to 300. That is, the molar ratio is preferably 2.5 or more in a view of sensitivity and resolution, and is preferably 300 or less in a view of suppressing the reduction in resolution due to thickening of the resist pattern with aging after exposure until the heat treatment. The acid generator/basic compound (molar ratio) is more preferably 5.0 to 200, and still more preferably 7.0 to 150.

The low-molecular-weight compound (hereinafter also referred to as a "compound (D-1)") which has a nitrogen atom and a group that leaves by the action of an acid is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group is preferable, and a carbamate group or a hemiaminal ether group is particularly preferable.

The molecular weight of the compound (D-1) is preferably 100 to 1,000, more preferably 100 to 700, and particularly preferably 100 to 500.

The compound (D-1) may have a carbamate group having a protecting group on a nitrogen atom. The protecting group constituting the carbamate group can be represented by General Formula (d-1).

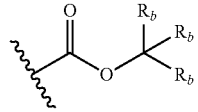
(d-1)

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, or the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. This is the same as for the alkoxyalkyl group represented by $R_b$.

$R_b$ is preferably a linear or branched alkyl group, a cycloalkyl group, or an aryl group, and more preferably a linear or branched alkyl group, or a cycloalkyl group.

Examples of the ring formed by the mutual linking of two $R_b$'s include an alicyclic hydrocarbon group, an aromatic hydrocarbon group, a heterocyclic hydrocarbon group, and derivatives thereof.

Examples of the specific structure of the group represented by General Formula (d-1) include, but are not limited to, structures disclosed in <0466> of US2012/0135348A1.

It is particularly preferable that the compound (D-1) has a structure of General Formula (6).

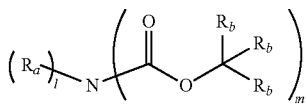
(6)

In General Formula (6), $R_a$ represents a hydrogen atom, an alkyl group, a cycloalkyl group, an aryl group, or an aralkyl group. In a case where 1 is 2, two $R_a$'s may be the same as or different from each other. Two $R_a$'s may be linked to each other to form a heterocycle may be bonded to each other to form, together with a carbon atom to which they are bonded with the nitrogen atom in the formula. The heterocycle may include a heteroatom other than the nitrogen atom in the formula.

$R_b$ has the same definition as $R_b$ in General Formula (d-1), and preferred examples are also the same.

l represents an integer of 0 to 2, and m represents an integer of 1 to 3, satisfying l+m=3.

In General Formula (6), the alkyl group, the cycloalkyl group, the aryl group, and the aralkyl group as $R_a$ may be substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (such the alkyl group, a cycloalkyl group, an aryl group, and aralkyl group may be substituted with the groups as described above) of $R_a$ include the same groups as the specific of examples as described above with respect to $R_b$.

Specific examples of the particularly preferred compound (D-1) in the present invention include, but are not limited to, the compounds disclosed in paragraph <0475> in the specification of US2012/0135348A1.

The compounds represented by General Formula (6) can be synthesized in accordance with JP2007-298569A, JP2009-199021A, and the like.

In the present invention, the compound (D-1) may be used singly or as a mixture of two or more kinds thereof.

The content of the compound (D-1) in the composition of the present invention is preferably 0.001% to 20% by mass, more preferably 0.001% to 10% by mass, and still more preferably 0.01% to 5% by mass, with respect to the total solid content of the composition.

The basic compound whose basicity is reduced or lost upon irradiation with actinic rays or radiation (hereinafter also referred to as a "compound (PA)") is a compound which has a functional group with proton-accepting properties, and decomposes under irradiation with actinic rays or radiation to exhibit deterioration in proton-accepting properties, no proton-accepting properties, or a change from the proton-accepting properties to acidic properties.

The functional group with proton-accepting properties refers to a functional group having a group or an electron which is capable of electrostatically interacting with a proton, and for example, means a functional group with a macrocyclic structure, such as a cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following formula.

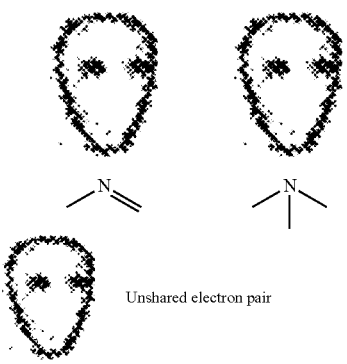

Unshared electron pair

Preferred examples of the partial structure of the functional group with proton-accepting properties include crown ether, azacrown ether, primary to tertiary amines, pyridine, imidazole, and pyrazine structures.

The compound (PA) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the functional group with proton-accepting properties, and specifically a decrease in the equilibrium constant at chemical equilibrium in a case where a proton adduct is generated from the compound (PA) having the functional group with proton-accepting properties and the proton.

The proton-accepting properties can be confirmed by carrying out pH measurement.

In the present invention, the acid dissociation constant pKa of the compound generated by the decomposition of the compound (PA) upon irradiation with actinic rays or radiation preferably satisfies pKa<−1, more preferably −13<pKa<−1, and still more preferably −13<pKa<−3.

In the present invention, the acid dissociation constant pKa indicates an acid dissociation constant pKa in an aqueous solution, and is described, for example, in Chemical Handbook (II) (Revised $4^{th}$ Edition, 1993, compiled by the Chemical Society of Japan. Maruzen Company. Ltd.), and a lower value thereof indicates higher acid strength. Specifically, the pKa in an aqueous solution may be measured by using an infinite-dilution aqueous solution and measuring the acid dissociation constant at 25° C., or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by General Formula (PA-1), for example, as the proton adduct generated by decomposition upon irradiation with actinic rays or radiation. The compound represented by General Formula (PA-1) is a compound exhibiting deterioration in proton-accepting properties, no proton-accepting properties, or a change from the proton-accepting properties to acidic properties since the compound has a functional group with proton-accepting properties as well as an acidic group, as compared with the compound (PA).

Q-A-(X)$_n$—B—R       (PA-1)

In General Formula (PA-1),

Q represents —SO$_3$H, —CO$_2$H, or —W$_1$NHW$_2$R$_f$, in which R$_f$ represents an alkyl group (preferably having 1 to 20 carbon atoms), a cycloalkyl group (preferably having 3 to 20 carbon atoms), or an aryl group (preferably having 6 to 30 carbon atoms), and W$_1$ and W$_2$ each independently represent —SO$_2$— or —CO—.

A represents a single bond or a divalent linking group.

X represents —SO$_2$— or —CO—.

n is 0 or 1.

B represents a single bond, an oxygen atom, or —N(R$_x$)R$_y$—, in which R$_x$ represents a hydrogen atom or a monovalent organic group, and R$_y$ represents a single bond or a divalent organic group, a provided that R$_x$ may be bonded to R$_y$ to form a ring or may be bonded to R to form a ring.

R represents a monovalent organic group having a functional group with proton-accepting properties.

General Formula (PA-1) will be described in more detail.

The divalent linking group in A is preferably a divalent linking group having 2 to 12 carbon atoms, and examples thereof include an alkylene group and a phenylene group. The divalent linking group is more preferably an alkylene group having at least one fluorine atom, and preferably has 2 to 6 carbon atoms, and more preferably has 2 to 4 carbon atoms. The divalent linking group may have a linking group such as an oxygen atom and a sulfur atom in the alkylene chain. The alkylene group preferably an alkylene group, in particular, in which 30% to 100% by number of the hydrogen atoms are substituted with fluorine atoms, more preferably in which a carbon atom bonded to the Q site has a fluorine atom, still more preferably a perfluoroalkylene group, and particularly preferably a perfluoroethylene group, a perfluoropropylene group, or a perfluorobutylene group.

The monovalent organic group in $R_x$ is preferably an organic group having 1 to 30 carbon atoms, and examples thereof include an alkyl group, a cycloalkyl group, an aryl group, an aralkyl group, and an alkenyl group. These groups may further have a substituent.

The alkyl group in $R_x$ may have a substituent, is preferably a linear or branched alkyl group having 1 to 20 carbon atoms, and may have an oxygen atom, a sulfur atom, or a nitrogen atom in the alkyl chain.

The cycloalkyl group in $R_x$ may have a substituent, is preferably a monocyclic or polycyclic cycloalkyl group having 3 to 20 carbon atoms, and may have an oxygen atom, a sulfur atom, or a nitrogen atom in the ring.

The aryl group in $R_x$ may have a substituent and is preferably an aryl group having 6 to 14 carbon atoms, and examples thereof include a phenyl group and a naphthyl group.

The aralkyl group in $R_x$ may have a substituent and is preferably an aralkyl group having 7 to 20 carbon atoms, and examples thereof include a benzyl group and a phenethyl group.

The alkenyl group in $R_x$ may have a substituent, may be linear or branched, and is preferably an alkenyl group having 3 to 20 carbon atoms, and examples of such the alkenyl group include a vinyl group, an allyl group, and a styryl group.

In a case where $R_x$ further has a substituent, examples of the substituent include a halogen atom a linear, branched, or cyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxyl group, an alkoxy group, an aryloxy group, an alkylthio group, an arylthio group, a heterocyclic oxy group, an acyloxy group, an amino group, a nitro group, a hydrazino group, and a heterocyclic group.

Preferred examples of the divalent organic group in $R_y$ include an alkylene group.

Examples of the ring structure which may be formed by the mutual bonding of $R_x$ and $R_y$ include a 5- to 10-membered ring, and particularly preferably a 6-membered ring, including a nitrogen atom.

The functional group with proton-accepting properties in R is as described above, and examples thereof include nitrogen-including heterocyclic aromatic structures such as azacrown ether, primary to tertiary amines, pyridine, and imidazole.

The organic group having such a structure is preferably an organic group having 4 to 30 carbon atoms, and examples thereof include an alkyl group, a cycloalkyl group, an aryl group, an aralkyl group, and an alkenyl group.

The alkyl group, the cycloalkyl group, the aryl group, the aralkyl group, or the alkenyl group in the alkyl group, the cycloalkyl group, the aryl group, the aralkyl group, or the alkenyl group, each including a functional group with proton-accepting properties or an ammonium group in R, are the same as the alkyl group, the cycloalkyl group, the aryl group, the aralkyl group, or the alkenyl group, mentioned as $R_x$, respectively.

In a case where B is $-N(R_x)R_y-$, it is preferable that R and $R_x$ are bonded to each other to form a ring. By forming a ring structure, the stability is improved and the storage stability of a composition using the ring is improved. The number of carbon atoms which form a ring is preferably 4 to 20, the ring may be monocyclic or polycyclic, and an oxygen atom, and a sulfur atom, or a nitrogen atom may be included in the ring.

Examples of the monocyclic structure include 4-, 5-, 6-, 7-, and 8-membered rings, each including a nitrogen atom. Examples of the polycyclic structure include structures formed by a combination of two, or three or more monocyclic structures.

$R_f$ in $-W_1NHW_2R_f$ represented by Q is preferably an alkyl group having 1 to 6 carbon atoms, which may have a fluorine atom, and more preferably a perfluoroalkyl group having 1 to 6 carbon atoms. Further, it is preferable that at least one of $W_1$ or $W_2$ is $-SO_2-$, and it is more preferable that both of $W_1$ and $W_2$ are $-SO_2-$.

Q is particularly preferably $-SO_3H$ or $-CO_2H$ from the viewpoint of hydrophilicity of acid group.

Among the compounds represented by General Formula (PA-1), the compound in which the Q moiety is sulfonic acid, can be synthesized by a common sulfonamidation reaction. For example, the compound can be obtained by a method of selectively reacting one sulfonyl halide moiety of a bissulfonyl halide compound with an amine compound to form a sulfonamide bond, followed by hydrolysis of another sulfonyl halide moiety thereof, or a method of reacting a cyclic sulfonic acid anhydride with an amine compound to cause ring-opening.

The compound (PA) is preferably an ionic compound. The functional group with proton-accepting properties may be included in an anion moiety or a cation moiety, and it is preferable that the functional group is included in an anion moiety.

Preferred examples of the compound (PA) include compounds represented by General Formulae (4) to (6).

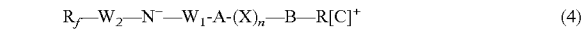

$$R_f-W_2-N^--W_1-A-(X)_n-B-R[C]^+ \quad (4)$$

$$R-SO_3^-[C]^+ \quad (5)$$

$$R-CO_2^-[C]^+ \quad (6)$$

In General Formulae (4) to (6), A, X, n, B, R, $R_f$, $W_1$, and $W_2$ each have the same definitions as those, respectively, in General Formula (PA-1).

$C^+$ represents a counter cation.

The counter cation is preferably an onium cation. More specifically, preferred examples thereof include the sulfonium cations described as $S^+(R_{201})(R_{202})(R_{203})$ in General Formula (ZI) and the iodonium cations described as $I^+(R_{204})(R_{205})$ in General Formula (ZII) with regard to the acid generator.

Specific examples of the compound (PA) include the compounds exemplified in <0280> of US2011/0269072A1.

Furthermore, in the present invention, compounds (PA) other than a compound which generates the compound represented by General Formula (PA-1) can also be appropriately selected. For example, a compound containing a proton acceptor moiety at its cation moiety may be used as an ionic compound. More specific examples thereof include a compound represented by General Formula (7).

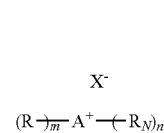

(7)

In the formula, A represents a sulfur atom or an iodine atom.

m represents 1 or 2 and n represents 1 or 2, provided that m+n=3 in a case where A is a sulfur atom and that m+n=2 in a case where A is an iodine atom.

R represents an aryl group.

$R_N$ represents an aryl group substituted with the functional group with proton-accepting properties, and $X^-$ represents a counter anion.

Specific examples of $X^-$ include the same anions as those of the acid generators as described above.

Specific preferred examples of the aryl group of each of R and $R_N$ include a phenyl group.

Specific examples of the functional group with proton-accepting properties contained in $R_N$ are the same as those of the functional group with proton-accepting properties as described above in Formula (PA-1).

Specific examples of the ionic compounds having a proton acceptor site at a cationic moiety include the compounds exemplified in <0291> of US2011/0269072A1.

Furthermore, such compounds can be synthesized, for example, with reference to the methods described in JP2007-230913A, JP2009-122623A, and the like.

The compound (PA) may be used singly or in combination of two or more kinds thereof.

The content of the compound (PA) is preferably 0.1% to 10% by mass, and more preferably 1% to 8% by mass, with respect to the total solid content of the composition.

In the composition of the present invention, an onium salt which becomes a relatively weak acid with respect to the acid generator can be used as an acid diffusion control agent (D).

In a case of mixing the acid generator and the onium salt that generates an acid which is a relatively weak acid (preferably a weak acid having a pKa of more than −1) with respect to an acid generated from the acid generator, and then using the mixture, in a case where the acid generated from the acid generator upon irradiation with actinic rays or radiation collides with an onium salt having an unreacted weak acid anion, a weak acid is discharged by salt exchange, thereby generating an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the acid generator, compounds represented by General Formulae (d1-1) to (d1-3) are preferable.

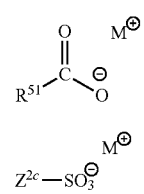

(d1-1)

(d1-2)

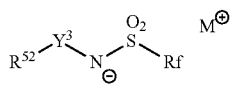

(d1-3)

In the formulae, $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent. $R^{52}$ is an organic group, $Y^3$ is a linear, branched, or cyclic alkylene group or arylene group, Rf is a hydrocarbon group including a fluorine atom, and $M^+$'s are each independently a sulfonium or iodonium cation.

Preferred examples of the sulfonium cation or the iodonium cation represented by $M^+$ include the sulfonium cations exemplified for the acid generator (ZI) and the iodonium cations exemplified for the acid generator (ZII).

Preferred examples of the anionic moiety of the compound represented by General Formula (d1-1) include the structures exemplified in paragraph [0198] of JP2012-242799A.

Preferred examples of the anionic moiety of the compound represented by General Formula (d1-2) include the structures exemplified in paragraph [0201] of JP2012-242799A.

Preferred examples of the anionic moiety of the compound represented by General Formula (d1-3) include the structures exemplified in paragraphs [0209] and [0210] of JP2012-242799A.

The onium salt which becomes a relatively weak acid with respect to the acid generator may be a compound (hereinafter also referred to as a "compound (D-2)") having a cationic moiety and an anionic moiety in the same molecule, in which the cationic moiety and the anionic moiety are linked to each other through a covalent bond.

As the compound (D-2), a compound represented by any one of General Formulae (C-1) to (C-3) is preferable.

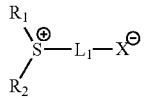

(C-1)

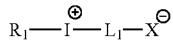

(C-2)

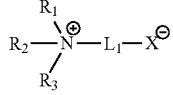

(C-3)

In General Formulae (C-1) to (C-3), $R_1$, $R_2$, and $R_3$ represent a substituent having 1 or more carbon atoms.

$L_1$ represents a divalent linking group that links a cationic moiety with an anionic moiety, or a single bond.

—$X^-$ represents an anionic moiety selected from —COO$^-$, —SO$_3^-$, —SO$_2^-$, and —N$^-$—R$_4$. R$_4$ represents a monovalent substituent having a carbonyl group: —C(=O)—, a sulfonyl group: —S(=O)$_2$—, or a sulfinyl group: —S(=O)— at a site for linking to an adjacent N atom.

$R_1$, $R_2$, $R_3$, $R_4$, and $L_1$ may be bonded to one another to form a ring structure. Further, in (C-3), two of $R_1$ to $R_3$ may be combined to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and preferably an alkyl group, a cycloalkyl group, and an aryl group.

Examples of $L_1$ as a divalent linking group include a linear or branched alkylene group, a cycloalkylene group, an arylene group, a carbonyl group, an ether bond, ester bond, amide bond, a urethane bond, a urea bond, and a group formed by a combination of two or more kinds of these groups. $L_1$ is more preferably an alkylene group, an arylene group, an ether bond, ester bond, and a group formed by a combination of two or more kinds of these groups.

Preferred examples of the compound represented by General Formula (C-1) include the compounds exemplified in paragraphs [0037] to [0039] of JP2013-6827A and paragraphs [0027] to [0029] of JP2013-8020A.

Preferred examples of the compound represented by General Formula (C-2) include the compounds exemplified in paragraphs [0012] to [0013] of JP2012-189977A.

Preferred examples of the compound represented by General Formula (C-3) include the compounds exemplified in paragraphs [0029] to [0031] of JP2012-252124A.

The content of the onium salt which becomes a relatively weak acid with respect to the acid generator is preferably 0.5% to 10.0% by mass, more preferably 0.5% to 8.0% by mass, and still more preferably 1.0% to 8.0% by mass, with respect to the solid content of the composition.

<Solvent>

The composition of the present invention usually contains a solvent.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

Specific examples of these solvents include those described in [0441] to [0455] of US2008/0187860A, isoamyl acetate, butyl butanoate, and methyl 2-hydroxyisobutyrate.

In the present invention, a mixed solvent obtained by mixing a solvent containing a hydroxyl group and a solvent containing no hydroxyl group in the structure may be used as the organic solvent.

As the solvent containing a hydroxyl group and the solvent containing no hydroxyl group, the above-mentioned exemplary compounds can be appropriately selected and used, but as the solvent containing a hydroxyl group, an alkylene glycol monoalkyl ether, alkyl lactate, and the like are preferable, and propylene glycol monomethyl ether (PGME, alternative name: 1-methoxy-2-propanol) and ethyl lactate are more preferable. Further, as the solvent containing no hydroxyl group, alkylene glycol monoalkyl ether acetate, alkyl alkoxy propionate, a monoketone compound which may contain a ring, cyclic lactone, alkyl acetate, and the like are preferable. Among these, propylene glycol monomethyl ether acetate (PGMEA, alternative name: 1-methoxy-2-acetoxypropane), ethyl ethoxypropionate, 2-heptanone, γ-butyrolactone, cyclohexanone, and butyl acetate are more preferable, and propylene glycol monomethyl ether acetate, ethyl ethoxypropionate, and 2-heptanone are still more preferable.

The mixing ratio (mass) of the solvent containing a hydroxyl group and the solvent containing no hydroxyl group is 1/99 to 99/1, preferably 10/90 to 90/10, and more preferably 20/80 to 60/40. A mixed solvent whose proportion of the solvent containing no hydroxyl group is 50% by mass or more is particularly preferable from the viewpoint of coating evenness.

The solvent preferably includes propylene glycol monomethyl ether acetate, and is more preferably a solvent formed of propylene glycol monomethyl ether acetate singly or a mixed solvent of two or more kinds of solvents including propylene glycol monomethyl ether acetate.

<Other Additives>

The composition of the present invention may or may not contain an onium carboxylate salt. Examples of such an onium carboxylate salt include those described in <0605> to <0606> in the specification of US2008/0187860A.

The onium carboxylate salt can be synthesized by reacting sulfonium hydroxide, iodonium hydroxide, ammonium hydroxide and carboxylic acid with silver oxide in a suitable solvent.

In a case where the composition of the present invention contains the onium carboxylate salt, the content of the salt is generally 0.1% to 20% by mass, preferably 0.5% to 10% by mass, and more preferably 1% to 7% by mass, with respect to the total solid content of the composition.

The composition of the present invention may further contain an acid proliferation agent, a cross-linking agent, a dye, a plasticizer, a light sensitizer, a light absorbent, an alkali-soluble resin, a dissolution inhibitor, a compound promoting solubility in a developer (for example, a phenol compound with a molecular weight of 1.000 or less, an alicyclic or aliphatic compound having a carboxyl group), and the like, if desired.

Such a phenol compound having a molecular weight of 1,000 or less may be easily synthesized by those skilled in the art with reference to the method disclosed in, for example, JP1992-122938A (JP-H04-122938A), JP1990-28531A (JP-H02-28531A), U.S. Pat. No. 4,916,210A, EP219294B, and the like.

Specific examples of the alicyclic compound or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

The actinic ray-sensitive or radiation-sensitive resin composition of the present invention is a composition for forming an actinic ray-sensitive or radiation-sensitive film having a film thickness of 1 μm or more, and the film thickness of the actinic ray-sensitive or radiation-sensitive film is more preferably 2 μm or more, and still more preferably 3 μm or more.

In addition, the film thickness of the actinic ray-sensitive or radiation-sensitive film is usually 12 μm or less.

The concentration of the solid content of composition of the present invention is usually 10% to 50% by mass, preferably 15% to 45% by mass, and more preferably 20% to 40% by mass. By setting the concentration of the solid content to these ranges, it is possible to uniformly coat the resist solution on a substrate and additionally, it is possible to form a resist pattern having excellent LWR The reason therefor is not clear, but it is considered that by setting the concentration of the solid content to 50% by mass or less, and preferably 45% by mass or less, the aggregation of materials, particularly a photoacid generator, in the resist solution is suppressed, and as the result, it is possible to form a uniform resist film.

The concentration of the solid content is the mass percentage of the mass of other resist components excluding the solvent with respect to the total mass of the composition.

The composition of the present invention is used by dissolving the components in a predetermined organic solvent, and preferably in the mixed solvent, filtering the solution through a filter, and then applying the filtered solution on a predetermined substrate. The filter for use in filtration is preferably a polytetrafluoroethylene-, polyethylene- or nylon-made filter having a pore size of 1.0 µm or less, more preferably 100 nm or less, and still more preferably 10 nm or less. In the filtration through a filter, as described in, for example, JP2002-62667A, circulating filtration may be carried out, or the filtration may be carried out by connecting plural kinds of filters in series or in parallel. In addition, the composition may be filtered in plural times. Furthermore, the composition may be subjected to a deaeration treatment or the like before or after filtration through a filter.

[Pattern Forming Method]

Next, the pattern forming method of the present invention will be described.

The pattern forming method of the present invention is a pattern forming method including:

(i) a step of forming an actinic ray-sensitive or radiation-sensitive film having a film thickness of 1 µm or more (hereinafter also simply referred to as a film) on a substrate, using an actinic ray-sensitive or radiation-sensitive resin composition (film forming step), (ii) a step of irradiating the actinic ray-sensitive or radiation-sensitive film with actinic rays having a wavelength of 200 to 300 nm or radiation (exposing step), and (iii) a step of developing the actinic ray-sensitive or radiation-sensitive film irradiated with actinic rays or radiation with a developer (developing step), in which the actinic ray-sensitive or radiation-sensitive resin composition contains a resin (A) and a compound (B) that generates an acid upon irradiation with actinic rays or radiation, and the compound represented by General Formula (ZI-3) is contained as the compound (B).

It is preferable that the pattern forming method of the present invention includes (iv) a heating step after (ii) the exposing step.

The pattern forming method of the present invention may include (ii) the exposing step in plural times.

The pattern forming method of the present invention may include (iv) the heating step in plural times.

In the pattern forming method of the present invention, the step of forming a film from the composition of the present invention on a substrate, the step of exposing the film, and the developing step can be carried out by generally known methods.

The substrate on which the film is formed in the present invention is not particularly limited, and a substrate such as an inorganic substrate such as silicon, SiN, $SiO_2$, and SiN, and a coating type inorganic substrate such as SOG, which are generally used in a process for manufacturing a semiconductor such as an IC, and a process for manufacture of a circuit board for a liquid crystal, a thermal head, or the like; and in other lithographic processes of photofabrication, can be used. In addition, an antireflection film may further be formed between the resist film and the substrate, as desired. As the antireflection film, a known organic or inorganic antireflection film can be appropriately used.

As described above, the film thickness of a film obtained using the actinic ray-sensitive or radiation-sensitive resin composition of the present invention is 1 µm or more, more preferably 2 µm or more, and still more preferably 3 µm or more. In addition, the film thickness of the film is usually 12 µm or less.

It is also preferable that the method includes a pre-heating step (PB; Prebake) after forming a film and before the exposing step.

Moreover, it is also preferable that the method includes a step of post-exposure heating (PEB: Post-Exposure Bake) after the exposing step and before the developing step.

For both of PB and PEB, the heating is preferably carried out at a heating temperature of 70° C. to 130° C., and more preferably 80° C. to 120° C.

The heating time is preferably 30 to 300 seconds, more preferably 30 to 180 seconds, and still more preferably 30 to 90 seconds.

Heating may be carried out using a means equipped in an ordinary exposure/development machine, or may also be carried out using a hot plate or the like.

The baking accelerates the reaction in the exposed areas, and thus, the sensitivity or the pattern profile is enhanced.

The light source wavelength used for the exposure device in the present invention is 200 to 300 nm. Thus, preferred examples of the light source include a KrF excimer laser (248 nm).

The developer used in the developing a film formed using the composition of the present invention is not particularly limited, but examples thereof include a developer containing an alkali developer or an organic solvent (hereinafter also referred to an organic developer), with the alkali developer being preferable.

As the alkali developer, for example, aqueous alkali solutions of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetraalkylammonium hydroxides such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, trimethylphenylammonium hydroxide, trimethylbenzylammonium hydroxide, and triethylbenzylammonium hydroxide, cyclic amines such as pyrrole and piperidine, or the like can be used. Further, alcohols and a surfactant can also be added to the aqueous alkali solution in an appropriate amount before use. The alkali concentration of the alkali developer is usually 0.1% to 20% by mass. The pH of the alkali developer is usually 10.0 to 15.0. It is possible to appropriately adjust and use the alkali concentration and the pH of the alkali developer. The alkali developer may also be used after adding a surfactant or an organic solvent thereto.

As a rinsing liquid in the rinsing treatment to be carried out after the alkali development, pure water is used, and an appropriate amount of a surfactant may also be added and used.

In addition, after the development treatment or the rinsing treatment, a treatment of removing the developer or rinsing liquid adhering on the pattern by a supercritical fluid can be carried out.

As the organic developer, a polar solvent such as a ketone-based solvent, an ester-based solvent, an alcohol-based solvent, an amide-based solvent, or an ether-based solvent, and a hydrocarbon-based solvent can be used, and specific examples thereof include the solvents described in paragraph <0507> of JP2013-218223A. and isoamyl acetate, butyl butanoate, methyl 2-hydroxyisobutyrate, isobutyl isobutyrate, and butyl propionate.

The above-mentioned solvents can be used by mixing a plurality of the solvents or by mixing the solvents with solvents other than the solvents or water. However, in order to sufficiently exhibit the effects of the present invention, the moisture content in the entire developer is preferably less than 10% by mass, but a developer having substantially no water is more preferable.

That is, the amount of the organic solvent to be used with respect to the organic developer is preferably from 90% by mass to 1009% by mass, and more preferably from 95% by mass to 100% by mass, with respect to the total amount of the developer.

In particular, the organic developer is preferably a developer containing at least one organic solvent selected from the group consisting of a ketone-based solvent, an ester-based solvent, an alcohol-based solvent, an amide-based solvent, and an ether-based solvent.

The vapor pressure of the organic developer is preferably 5 kPa or less, more preferably 3 kPa or less, and particularly preferably 2 kPa or less, at 20° C. By setting the vapor pressure of the organic developer to 5 kPa or less, the evaporation of the developer on the substrate or in a developing cup is suppressed, the temperature uniformity in the wafer surface is improved, and as a result, the dimensional uniformity within a wafer surface is improved.

An appropriate amount of a surfactant can be added to the organic developer, as desired.

The surfactant is not particularly limited, but it is possible to use, for example, ionic or non-ionic fluorine-based and/or silicon-based surfactants, or the like. Examples of the fluorine- and/or silicon-based surfactant include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), U.S. Pat. Nos. 5,405,720A, 5,360,692A, 5,529,881A, 5,296,330A, 5,436,098A, 5,576,143A, 5,294,511A, and 5,824,451A, and non-ionic surfactants are preferable. The non-ionic surfactant is not particularly limited, but it is more preferable to use a fluorine-based surfactant or a silicon-based surfactant.

The amount of the surfactant to be used is usually 0.001% to 5% by mass, preferably 0.005% to 2% by mass, and more preferably 0.01% to 0.5% by mass, with respect to the total amount of the developer.

The organic developer may include a basic compound. Specific examples and preferred examples of the basic compound which can be included in the organic developer are the same ones as for the basic compound which can be included in the composition of the present invention as mentioned as the acid diffusion control agent (D)

As the developing method, for example, a method in which a substrate is immersed in a tank filled with a developer for a certain period of time (a dip method), a method in which a developer is heaped up to the surface of a substrate by surface tension and developed by stopping for a certain period of time (a puddle method), a method in which a developer is sprayed on the surface of a substrate (a spray method), a method in which a developer is continuously discharged on a substrate spun at a constant rate while scanning a developer discharging nozzle at a constant rate (a dynamic dispense method), or the like, can be applied.

In a case where the various developing methods include a step of discharging a developer toward a resist film from a development nozzle of a developing device, the discharge pressure of the developer discharged (the flow rate per unit area of the developer discharged) is preferably 2 mL/sec/mm$^2$ or less, more preferably 1.5 mL/sec/mm$^2$ or less, and still more preferably 1 mL/sec/mm$^2$ or less. The flow rate has no particular lower limit, but is preferably 0.2 mL/sec/mm$^2$ or more in consideration of throughput.

By setting the discharge pressure of the discharged developer to the above-mentioned range, pattern defects resulting from the resist scum after development can be significantly reduced.

Details on the mechanism are not clear, but it is thought that it is due to the pressure imposed on the resist film by the developer being decreased by setting the ejection pressure to the above-described range so that the resist film and/or the resist pattern is suppressed from being inadvertently cut or collapsing.

In addition, the discharge pressure (mL/sec/mm$^2$) of the developer is the value at the outlet of the development nozzle in the developing device.

Examples of the method for adjusting the discharge pressure of the developer include a method of adjusting the discharge pressure by a pump, and a method of supplying a developer from a pressurized tank and adjusting the pressure to change the discharge pressure.

In addition, after the step of performing development, using a developer including an organic solvent, a step of stopping the development while replacing the solvent with another solvent may be carried out.

In the pattern forming method of the present invention, a step of performing development by using a developer containing an organic solvent (organic solvent development step) and a step of carrying out development by using an aqueous alkali-solution (alkali development step) may be used in combination. Due to this combination, a finer pattern can be formed.

In the present invention, an area with a low exposure intensity is removed in the organic solvent development step, and by further carrying out the alkali development step, an area with a high exposure intensity is also removed. By virtue of multiple development processes in which development is carried out a plurality of times in this way, a pattern can be formed by keeping only a region with an intermediate exposure intensity from being dissolved, so that a finer pattern than usual can be formed (the same mechanism as in <0077> of JP2008-292975A).

In the pattern forming method of the present invention, the order of the alkali development step and the organic solvent development step is not particularly limited, but the alkali development is more preferably carried out before the organic solvent development step.

It is preferable that the method includes a step of washing using a rinsing liquid after the step of carrying out development using a developer including an organic solvent.

The rinsing liquid used in the rinsing step after the step of carrying out development using a developer including an organic solvent is not particularly limited as long as the rinsing liquid does not dissolve the resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same as those described for the developer containing an organic solvent.

After the developing step using a developer including an organic solvent, it is more preferable to carry out a step of washing using a rinsing liquid containing at least one organic solvent selected from the group consisting of a ketone-based solvent, an ester-based solvent, an alcohol-based solvent, an amide-based solvent, and a hydrocarbon-based solvent, it is still more preferable to carry out a step of washing using a rinsing liquid containing an alcohol-based solvent or an ester-based solvent, it is particularly preferable to carry out a step of cleaning using a rinsing liquid containing a monohydric alcohol, and it is most preferable to carry out a step of cleaning using a rinsing liquid containing a monohydric alcohol having 5 or more carbon atoms.

Here, examples of the monohydric alcohol used in the rinsing step include linear, branched, or cyclic monohydric alcohols, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like can be used. Further, 1-hexanol, 2-hexanol, 4-methyl-2-pentanol, 1-pentanol, 3-methyl-1-butanol, or the like can be used as a particularly preferred monohydric alcohol having 5 or more carbon atoms.

The hydrocarbon-based solvent used in the rinsing step is preferably a hydrocarbon compound having 6 to 30 carbon atoms, more preferably a hydrocarbon compound having 8 to 30 carbon atoms, still more preferably a hydrocarbon compound having 7 to 30 carbon atoms, and particularly preferably a hydrocarbon compound having 10 to 30 carbon atoms. By using a rinsing liquid including decane and/or undecane among these, pattern collapse is suppressed.

The respective components in plural numbers may be mixed, or the components may be mixed with an organic solvent other than the above solvents, and used.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure at 20° C. of the rinsing liquid which is used after the step of carrying out development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a range from 0.05 kPa to 5 kPa, the temperature uniformity within a wafer surface is improved, and further, the dimensional uniformity within a wafer surface is enhanced by suppression of swelling due to the permeation of the rinsing liquid.

The rinsing liquid can also be used after adding an appropriate amount of a surfactant thereto.

In the rinsing step, the wafer which has been subjected to development using a developer including an organic solvent is subjected to a cleaning treatment using the rinsing liquid including an organic solvent. A method for the cleaning treatment is not particularly limited, and for example, a method in which a rinsing liquid is continuously discharged on a substrate rotated at a constant rate (a rotation application method), a method in which a substrate is immersed in a bath filled with a rinsing liquid for a certain period of time (a dip method), a method in which a rinsing liquid is sprayed on a substrate surface (a spray method), or the like, can be applied. Among these, a method in which a cleaning treatment is carried out using the rotation application method, and a substrate is rotated at a rotation speed of 2,000 rpm to 4,000 rpm after cleaning, thereby removing the rinsing liquid from the substrate, is preferable. Further, it is preferable that a heating step (Post Bake) is included after the rinsing step. The residual developer and the rinsing liquid between and inside the patterns are removed by the baking. The heating step after the rinsing step is carried out at typically 40° C. to 160° C., and preferably at 70° C. to 95° C., and typically for 10 seconds to 3 minutes, and preferably for 30 seconds to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the present invention and the pattern forming method of the present invention do not include impurities such as metals. The content of the impurities included in these materials is preferably 1 ppm or less, more preferably 10 ppb or less, still more preferably 100 ppt or less, and particularly preferably 10 ppt or less but the material not having substantially metal components (within a detection limit of a determination device or less) is particularly preferable.

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. The filter may be formed of a composite material formed by combining these materials with an ion exchange medium. As the filter, a filter which had been washed with an organic solvent in advance may be used. In the step of filtration using a filter, plural kinds of filters may be connected in series or in parallel, and used. In a case of using plural kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method involving selecting raw materials having a small content of metals as raw materials constituting various materials, a method involving subjecting raw materials constituting various materials to filtration using a filter, and a method involving performing distillation under the condition with contamination being suppressed to the largest degree by, for example, lining the inside of a device with TEFLON (registered trademark). The preferred conditions for filtration using a filter, which is carried out for raw materials constituting various materials, are the same as described above.

In addition to filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

A method for improving the surface roughness of a pattern may be applied to the pattern formed by the pattern forming method of the present invention. Examples of the method for improving the surface roughness of a pattern include the method of treating a resist pattern by a plasma of a hydrogen-containing gas disclosed in WO2014/002808. In addition, known methods as described in JP2004-235468A, US2010/0020297A, JP2009-19969A, and Proc. of SPIE Vol. 8328 83280N-1 "EUV Resist Curing Technique for LWR Reduction and Etch Selectivity Enhancement" may be applied.

The pattern forming method of the present invention can be used for a guide pattern formation in a directed self-assembly (DSA) (see, for example, ACS Nano Vol. 4 No. 8 Pages 4815 to 4823).

In addition, a resist pattern formed by the method can be used as a core material (core) of the spacer process disclosed in JP1991-270227A (JP-H03-270227A) and JP2013-164509A.

In addition, the present invention further relates to a method for manufacturing an electronic device, including the pattern forming method of the present invention as described above, and an electronic device manufactured by the method for manufacturing an electronic device.

The electronic device of the present invention is suitably mounted on electric or electronic equipment (home electronics, OA/media-related equipment, optical equipment, telecommunication equipment, and the like).

EXAMPLES

Hereinafter, the present invention will be described with reference to Examples, but the present invention is not limited thereto.

<Preparation of Actinic Ray-Sensitive or Radiation-Sensitive Resin Composition>

The components shown in Table 1 were dissolved in a solvent, respectively, to prepare a resist solution, which was filtered through an ultrahigh-molecular-weight polyethylene (UPE) filter having a pore size of 1.0 μm, and thus, preparing an actinic ray-sensitive or radiation-sensitive resin composition (resist composition) having a concentration of the solid content of 32% by mass.

<Transmittance of Film with Respect to Light at Wavelength of 248 nm at Film Thickness of 12 μm>

The resist composition prepared by the above method was applied onto a quartz glass substrate by spin coating and pre-baked at 140° C. for 60 seconds to form a resist film having a film thickness of 12 μm. The transmittance of the film with respect to light at a wavelength of 248 nm was measured. For the measurement of the transmittance, an absorption spectrophotometer UV-2500PC (manufactured by Shimadzu Corporation) was used. The results are shown in Table 1.

TABLE 1

| | Resin | | Acid generator | | Acid diffusion control agent | | Additive | | Solvent (mass ratio) | Transmittance of film with respect to light at wavelength of 248 nm at film thickness of 12 μm |
|---|---|---|---|---|---|---|---|---|---|---|
| | Type | % by mass | Type | % by mass | Type | % by mass | Type | % by mass | | |
| Example 1 | A-1 | 98.6 | B-1 | 1.2 | C-1 | 0.2 | — | 0 | PGMEA/PGME = 80/20 | 8% |
| Example 2 | A-1 | 97.3 | B-1 | 2.5 | C-1 | 0.2 | — | 0 | PGMEA/PGME = 80/20 | 6% |
| Example 3 | A-1 | 99.2 | B-1 | 0.6 | C-1 | 0.2 | — | 0 | PGMEA/PGME = 80/20 | 9% |
| Example 4 | A-1 | 98.3 | B-1 | 1.2 | C-1 | 0.5 | — | 0 | PGMEA/PGME = 80/20 | 8% |
| Example 5 | A-1 | 98.7 | B-1 | 1.2 | C-1 | 0.1 | — | 0 | PGMEA/PGME = 80/20 | 8% |
| Example 6 | A-1' | 98.6 | B-1 | 1.2 | C-1 | 0.2 | — | 0 | PGMEA/PGME = 80/20 | 8% |
| Example 7 | A-1'' | 98.6 | B-1 | 1.2 | C-1 | 0.2 | — | 0 | PGMEA/PGME = 80/20 | 8% |
| Example 8 | A-1''' | 98.6 | B-1 | 1.2 | C-1 | 0.2 | — | 0 | PGMEA/PGME = 90/10 | 8% |
| Example 9 | A-1 A-1' | 98.6 (mass ratio of 50/50) | B-1 | 1.2 | C-1 | 0.2 | — | 0 | PGMEA/PGME = 90/10 | 8% |
| Example 10 | A-1 A-1'' | 98.6 (mass ratio of 50/50) | B-1 | 1.2 | C-1 | 0.2 | — | 0 | PGMEA/PGME = 90/10 | 8% |
| Example 11 | A-1 A-1'' | 98.6 (mass ratio of 20/80) | B-1 | 1.2 | C-1 | 0.2 | — | 0 | PGMEA/PGME = 90/10 | 8% |
| Example 12 | A-1 A-1'' | 98.6 (mass ratio of 80/20) | B-1 | 1.2 | C-1 | 0.2 | — | 0 | PGMEA/PGME = 90/10 | 8% |
| Example 13 | A-1 A-1''' | 98.6 (mass ratio of 50/50) | B-1 | 1.2 | C-1 | 0.2 | — | 0 | PGMEA/PGME = 90/10 | 8% |
| Example 14 | A-1 | 98.6 | B-1 | 1.2 | C-1 | 0.2 | — | 0 | PGMEA/PGME = 50/50 | 8% |
| Example 15 | A-1 | 98.6 | B-1 | 1.2 | C-1 | 0.2 | — | 0 | PGMEA/EL = 80/20 | 8% |
| Example 16 | A-1 | 98.6 | B-1 | 1.2 | C-1 | 0.2 | — | 0 | PGMEA/EEP = 80/20 | 8% |
| Example 17 | A-1 | 98.6 | B-1 | 1.2 | C-1 | 0.2 | — | 0 | PGMEA/CyHx = 80/20 | 8% |
| Example 18 | A-1 | 98.6 | B-1 | 1.2 | C-1 | 0.2 | — | 0 | PGMEA/GBL = 90/10 | 8% |
| Example 19 | A-1 | 98.6 | B-1 | 1.2 | C-1 | 0.2 | — | 0 | PGMEA | 8% |
| Example 20 | A-1 | 98.6 | B-2 | 1.2 | C-1 | 0.2 | — | 0 | PGMEA/PGME = 80/20 | 8% |
| Example 21 | A-1 | 98.6 | B-3 | 1.2 | C-1 | 0.2 | — | 0 | PGMEA/PGME = 80/20 | 8% |
| Example 22 | A-1 | 98.6 | B-4 | 1.2 | C-1 | 0.2 | — | 0 | PGMEA/PGME = 80/20 | 8% |

TABLE 1-continued

| | Resin | | Acid generator | | Acid diffusion control agent | | Additive | | | Transmittance of film with respect to light at wavelength of 248 nm at |
|---|---|---|---|---|---|---|---|---|---|---|
| | Type | % by mass | Type | % by mass | Type | % by mass | Type | % by mass | Solvent (mass ratio) | film thickness of 12 μm |
| Example 23 | A-1 | 98.6 | B-5 | 1.2 | C-1 | 0.2 | — | 0 | PGMEA/PGME = 80/20 | 8% |
| Example 24 | A-1 | 98.6 | B-6 | 1.2 | C-1 | 0.2 | — | 0 | PGMEA/PGME = 80/20 | 8% |
| Example 25 | A-1 | 98.6 | B-7 | 1.2 | C-1 | 0.2 | — | 0 | PGMEA/PGME = 80/20 | 8% |
| Example 26 | A-1 | 98.6 | B-8 | 1.2 | C-1 | 0.2 | — | 0 | PGMEA/PGME = 80/20 | 8% |
| Example 27 | A-1 | 98.6 | B-9 | 1.2 | C-1 | 0.2 | — | 0 | PGMEA/PGME = 80/20 | 8% |
| Example 28 | A-1 | 98.6 | B-10 | 1.2 | C-1 | 0.2 | — | 0 | PGMEA/PGME = 80/20 | 8% |
| Example 29 | A-1 | 98.6 | B-11 | 1.2 | C-1 | 0.2 | — | 0 | PGMEA/PGME = 80/20 | 8% |
| Example 30 | A-1 | 98.6 | B-12 | 1.2 | C-1 | 0.2 | — | 0 | PGMEA/PGME = 80/20 | 8% |
| Example 31 | A-1 | 98.6 | B-14 | 1.2 | C-1 | 0.2 | — | 0 | PGMEA/PGME = 80/20 | 8% |
| Example 32 | A-1 | 98.6 | B-15 | 1.2 | C-1 | 0.2 | — | 0 | PGMEA/PGME = 80/20 | 8% |
| Example 33 | A-1 | 98.6 | B-16 | 1.2 | C-1 | 0.2 | — | 0 | PGMEA/PGME = 80/20 | 8% |
| Example 34 | A-1 | 98.6 | B-7 B-12 (mass ratio of 50/50) | 1.2 | C-1 | 0.2 | — | 0 | PGMEA/PGME = 80/20 | 8% |
| Example 35 | A-1 | 98.6 | B-7 B-12 (mass ratio of 20/80) | 1.2 | C-1 | 0.2 | — | 0 | PGMEA/PGME = 80/20 | 8% |
| Example 36 | A-1 | 98.6 | B-a B-11 (mass ratio of 50/50) | 1.2 | C-1 | 0.2 | — | 0 | PGMEA/PGME = 80/20 | 7% |
| Example 37 | A-1 | 98.6 | B-c B-11 (mass ratio of 50/50) | 1.2 | C-1 | 0.2 | — | 0 | PGMEA/PGME = 80/20 | 7% |
| Example 38 | A-1 | 98.6 | B-d B-11 (mass ratio of 50/50) | 1.2 | C-1 | 0.2 | — | 0 | PGMEA/PGME = 80/20 | 8% |
| Example 39 | A-1 | 98.6 | B-11 B-14 (mass ratio of 50/50) | 1.2 | C-1 | 0.2 | — | 0 | PGMEA/PGME = 80/20 | 7% |
| Example 40 | A-1 | 98.6 | B-11 B-15 (mass ratio of 50/50) | 1.2 | C-1 | 0.2 | — | 0 | PGMEA/PGME = 80/20 | 8% |

TABLE 2

| | Resin | | Acid generator | | Acid diffusion control agent | | Additive | | | Transmittance of film with respect to light at wavelength of 248 nm at |
|---|---|---|---|---|---|---|---|---|---|---|
| | Type | % by mass | Type | % by mass | Type | % by mass | Type | % by mass | Solvent (mass ratio) | film thickness of 12 μm |
| Example 41 | A-2 | 98.6 | B-1 | 1.2 | C-1 | 0.2 | — | 0 | PGMEA/PGME = 80/20 | 8% |
| Example 42 | A-3 | 98.6 | B-1 | 1.2 | C-1 | 0.2 | — | 0 | PGMEA/PGME = 80/20 | 8% |
| Example 43 | A-4 | 98.6 | B-1 | 1.2 | C-1 | 0.2 | — | 0 | PGMEA/PGME = 80/20 | 8% |
| Example 44 | A-5 | 98.6 | B-1 | 1.2 | C-1 | 0.2 | — | 0 | PGMEA/PGME = 80/20 | 8% |
| Example 45 | A-6 | 98.6 | B-1 | 1.2 | C-1 | 0.2 | — | 0 | PGMEA/PGME = 80/20 | 8% |
| Example 46 | A-7 | 98.6 | B-1 | 1.2 | C-1 | 0.2 | — | 0 | PGMEA/PGME = 80/20 | 8% |
| Example 47 | A-8 | 98.6 | B-1 | 1.2 | C-1 | 0.2 | — | 0 | PGMEA/PGME = 80/20 | 8% |
| Example 48 | A-9 | 98.6 | B-1 | 1.2 | C-1 | 0.2 | — | 0 | PGMEA/PGME = 80/20 | 8% |
| Example 49 | A-10 | 98.6 | B-1 | 1.2 | C-1 | 0.2 | — | 0 | PGMEA/PGME = 80/20 | 8% |
| Example 50 | A-10' | 98.6 | B-1 | 1.2 | C-1 | 0.2 | — | 0 | PGMEA/PGME = 80/20 | 8% |
| Example 51 | A-10" | 98.6 | B-1 | 1.2 | C-1 | 0.2 | — | 0 | PGMEA/PGME = 80/20 | 8% |
| Example 52 | A-10 A-10' (mass ratio of 50/50) | 98.6 | B-1 | 1.2 | C-1 | 0.2 | — | 0 | PGMEA/PGME = 80/20 | 8% |
| Example 53 | A-10 A-10" (mass ratio of 50/50) | 98.6 | B-1 | 1.2 | C-1 | 0.2 | — | 0 | PGMEA/PGME = 80/20 | 8% |
| Example 54 | A-11 | 98.6 | B-1 | 1.2 | C-1 | 0.2 | — | 0 | PGMEA/PGME = 80/20 | 8% |
| Example 55 | A-12 | 98.6 | B-1 | 1.2 | C-1 | 0.2 | — | 0 | PGMEA/PGME = 80/20 | 8% |
| Example 56 | A-13 | 98,6 | B-1 | 1.2 | C-1 | 0.2 | — | 0 | PGMEA/PGME = 80/20 | 8% |
| Example 57 | A-14 | 98.6 | B-1 | 1.2 | C-1 | 0.2 | — | 0 | PGMEA/PGME = 80/20 | 8% |
| Example 58 | A-14' | 98.6 | B-1 | 1.2 | C-1 | 0.2 | — | 0 | PGMEA/PGME = 80/20 | 8% |
| Example 59 | A-14" | 98.6 | B-1 | 1.2 | C-1 | 0.2 | — | 0 | PGMEA/PGME = 80/20 | 8% |
| Example 60 | A-14'" | 98.6 | B-1 | 1.2 | C-1 | 0.2 | — | 0 | PGMEA/PGME = 80/20 | 8% |

TABLE 2-continued

| | Resin | | Acid generator | | Acid diffusion control agent | | Additive | | Solvent (mass ratio) | Transmittance of film with respect to light at wavelength of 248 nm at film thickness of 12 μm |
|---|---|---|---|---|---|---|---|---|---|---|
| | Type | % by mass | Type | % by mass | Type | % by mass | Type | % by mass | | |
| Example 61 | A-14 | 98.6 | B-1 | 1.2 | C-1 | 0.2 | — | 0 | PGMEA/PGME = 80/20 | 8% |
| Example 62 | A-14 | 98.6 | B-1 | 1.2 | C-1 | 0.2 | — | 0 | PGMEA/PGME = 80/20 | 8% |
| Example 63 | A-14 A-14' (mass ratio of 50/50) | 98.6 | B-1 | 1.2 | C-1 | 0.2 | — | 0 | PGMEA/PGME = 80/20 | 8% |
| Example 64 | A-14 A-14' (mass ratio of 50/50) | 98.6 | B-1 | 1.2 | C-1 | 0.2 | — | 0 | PGMEA/PGME = 80/20 | 8% |
| Example 65 | A-14 A-14" (mass ratio of 50/50) | 98.6 | B-1 | 1.2 | C-1 | 0.2 | — | 0 | PGMEA/PGME = 80/20 | 8% |
| Example 66 | A-14 A-14" (mass ratio of 50/50) | 98.6 | B-1 | 1.2 | C-1 | 0.2 | — | 0 | PGMEA/PGME = 80/20 | 8% |
| Example 67 | A-14 A-14''' (mass ratio of 50/50) | 98.6 | B-1 | 1.2 | C-1 | 0.2 | — | 0 | PGMEA/PGME = 80/20 | 8% |
| Example 68 | A-14 A-14''' (mass ratio of 50/50) | 98.6 | B-1 | 1.2 | C-1 | 0.2 | — | 0 | PGMEA/PGME = 80/20 | 8% |
| Example 69 | A-15 | 98.6 | B-1 | 1.2 | C-1 | 0.2 | — | 0 | PGMEA/PGME = 80/20 | 8% |
| Example 70 | A-15 | 98.6 | B-1 | 1.2 | C-1 | 0.2 | — | 0 | PGMEA/PGME = 80/20 | 8% |
| Example 71 | A-16 | 98.6 | B-1 | 1.2 | C-1 | 0.2 | — | 0 | PGMEA/PGME = 80/20 | 8% |
| Example 72 | A-16 | 98.6 | B-1 | 1.2 | C-1 | 0.2 | — | 0 | PGMEA/PGME = 80/20 | 8% |
| Example 73 | A-17 | 98.6 | B-1 | 1.2 | C-1 | 0.2 | — | 0 | PGMEA/PGME = 80/20 | 8% |
| Example 74 | A-17 | 98.6 | B-1 | 1.2 | C-1 | 0.2 | — | 0 | PGMEA/PGME = 80/20 | 8% |
| Example 75 | A-18 | 98.6 | B-1 | 1.2 | C-1 | 0.2 | — | 0 | PGMEA/PGME = 80/20 | 8% |
| Example 76 | A-18 | 98.6 | B-1 | 1.2 | C-1 | 0.2 | — | 0 | PGMEA/PGME = 80/20 | 8% |
| Example 77 | A-19 | 98.6 | B-1 | 1.2 | C-1 | 0.2 | — | 0 | PGMEA/PGME = 80/20 | 8% |
| Example 78 | A-18 | 98.6 | B-1 | 1.2 | C-1 | 0.2 | — | 0 | PGMEA/PGME = 80/20 | 8% |

TABLE 3

| | Resin | | Acid generator | | Acid diffusion control agent | | Additive | | Solvent (mass ratio) | Transmittance of film with respect to light at wavelength of 248 nm at film thickness of 12 μm |
|---|---|---|---|---|---|---|---|---|---|---|
| | Type | % by mass | Type | % by mass | Type | % by mass | Type | % by mass | | |
| Example 79 | A-20 | 98.6 | B-1 | 1.2 | C-1 | 0.2 | — | 0 | PGMEA/PGME = 80/20 | 8% |
| Example 80 | A-20 | 98.6 | B-11 B-13 (mass ratio of 50/50) | 1.2 | C-1 | 0.2 | — | 0 | PGMEA/PGME = 80/20 | 8% |
| Example 81 | A-21 | 98.6 | B-1 | 1.2 | C-1 | 0.2 | — | 0 | PGMEA/PGME = 80/20 | 8% |
| Example 82 | A-22 | 98.6 | B-1 | 1.2 | C-1 | 0.2 | — | 0 | PGMEA/PGME = 80/20 | 8% |
| Example 83 | A-23 | 98.6 | B-1 | 1.2 | C-1 | 0.2 | — | 0 | PGMEA/PGME = 80/20 | 8% |
| Example 84 | A-20 A-1 (mass ratio of 50/50) | 98.6 | B-1 | 1.2 | C-1 | 0.2 | — | 0 | PGMEA/PGME = 80/20 | 8% |
| Example 85 | A-1 A-7 (mass ratio of 50/50) | 98.6 | B-1 | 1.2 | C-1 | 0.2 | — | 0 | PGMEA/PGME = 80/20 | 8% |
| Example 86 | A-11 A-17 (mass ratio of 50/50) | 98.6 | B-1 | 1.2 | C-1 | 0.2 | — | 0 | PGMEA/PGME = 80/20 | 8% |
| Example 87 | A-7 A-9 (mass ratio of 50/50) | 98.6 | B-1 | 1.2 | C-1 | 0.2 | — | 0 | PGMEA/PGME = 80/20 | 8% |

TABLE 3-continued

| | Resin | | Acid generator | | Acid diffusion control agent | | Additive | | Solvent (mass ratio) | Transmittance of film with respect to light at wavelength of 248 nm at film thickness of 12 μm |
|---|---|---|---|---|---|---|---|---|---|---|
| | Type | % by mass | Type | % by mass | Type | % by mass | Type | % by mass | | |
| Example 88 | A-3 A-10 | 98.6 (mass ratio of 50/50) | B-1 | 1.2 | C-1 | 0.2 | — | 0 | PGMEA/PGME = 80/20 | 8% |
| Example 89 | A-1 A-14 | 98.6 (mass ratio of 50/50) | B-1 | 1.2 | C-1 | 0.2 | — | 0 | PGMEA/PGME = 80/20 | 8% |
| Example 90 | A-1 | 98.6 | B-1 | 1.2 | C-2 | 0.2 | — | 0 | PGMEA/PGME = 80/20 | 8% |
| Example 91 | A-1 | 98.6 | B-1 | 1.2 | C-3 | 0.2 | — | 0 | PGMEA/PGME = 80/20 | 8% |
| Example 92 | A-1 | 98.6 | B-1 | 1.2 | C-4 | 0.2 | — | 0 | PGMEA/PGME = 80/20 | 8% |
| Example 93 | A-1 | 98.6 | B-1 | 1.2 | C-5 | 0.2 | — | 0 | PGMEA/PGME = 80/20 | 8% |
| Example 94 | A-1 | 98.6 | B-1 | 1.2 | C-6 | 0.2 | — | 0 | PGMEA/PGME = 80/20 | 8% |
| Example 95 | A-1 | 98.6 | B-1 | 1.2 | C-7 | 0.2 | — | 0 | PGMEA/PGME = 80/20 | 8% |
| Example 96 | A-1 | 98.6 | B-1 | 1.2 | C-8 | 0.2 | — | 0 | PGMEA/PGME = 80/20 | 8% |
| Example 97 | A-1 | 98.6 | B-1 | 1.2 | C-9 | 0.2 | — | 0 | PGMEA/PGME = 80/20 | 8% |
| Example 98 | A-1 | 98.6 | B-1 | 1.2 | C-1 C-3 | 0.2 (mass ratio of 50/50) | — | 0 | PGMEA/PGME = 80/20 | 8% |
| Example 99 | A-1 | 98.6 | B-1 | 1.2 | C-1 C-3 | 0.2 (mass ratio of 20/80) | — | 0 | PGMEA/PGME = 80/20 | 8% |
| Example 100 | A-1 | 98.6 | B-1 | 1.2 | C-2 C-3 | 0.2 (mass ratio of 50/50) | — | 0 | PGMEA/PGME = 80/20 | 8% |
| Example 101 | A-1 | 98.6 | B-1 | 1.2 | C-2 C-9 | 0.2 (mass ratio of 50/50) | — | 0 | PGMEA/PGME = 80/20 | 8% |
| Example 102 | A-1 | 98.6 | B-1 | 1.2 | C-1 C-7 | 0.2 (mass ratio of 50/50) | — | 0 | PGMEA/PGME = 80/20 | 8% |
| Example 103 | A-1 | 88.6 | B-1 | 1.2 | C-1 | 0.2 | D-1 | 10 | PGMEA/PGME = 80/20 | 8% |
| Example 104 | A-1 | 93.6 | B-1 | 1.2 | C-1 | 0.2 | D-1 | 5 | PGMEA/PGME = 80/20 | 8% |
| Example 105 | A-1 | 93.6 | B-1 | 1.2 | C-1 | 0.2 | D-2 | 5 | PGMEA/PGME = 80/20 | 8% |
| Example 106 | A-1 | 93.6 | B-1 | 1.2 | C-1 | 0.2 | D-3 | 5 | PGMEA/PGME = 80/20 | 8% |
| Example 107 | A-1 | 88.6 | B-1 | 1.2 | C-1 | 0.2 | D-1 D-3 | 10 (mass ratio of 50/50) | PGMEA/PGME = 80/20 | 8% |
| Example 108 | A-1 | 98.6 | B-1 | 1.2 | C-1 | 0.2 | — | 0 | PGMEA/PGME = 80/20 | 7% |
| Example 109 | A-1 | 98.6 | B-1 | 1.2 | C-1 | 0.2 | — | 0 | PGMEA/PGME = 80/20 | 11% |
| Example 110 | A-1 | 98.6 | B-1 | 1.2 | C-1 | 0.2 | — | 0 | PGMEA/PGME = 80/20 | 20% |
| Example 111 | A-1 | 98.6 | B-1 | 1.2 | C-1 | | — | 0 | PGMEA/PGME = 80/20 | 8% |
| Example 112 | A-1 | 98.6 | B-1 | 1.2 | C-1 | 0.2 | — | 0 | PGMEA/PGME = 80/20 | 8% |
| Example 113 | A-1 | 98.6 | B-1 | 1.2 | C-1 | 0.2 | — | 0 | PGMEA/PGME = 80/20 | 8% |
| Example 114 | A-1 | 98.6 | B-1 | 1.2 | C-1 | 0.2 | — | 0 | PGMEA/PGME = 80/20 | 8% |
| Example 115 | A-1 | 98.6 | B-1 | 1.2 | C-1 | | — | 0 | PGMEA/PGME = 80/20 | 8% |
| Example 116 | A-1 | 98.6 | B-1 | 1.2 | C-1 | 0.2 | — | 0 | PGMEA/PGME = 80/20 | 8% |
| Example 117 | A-1 | 98.6 | B-1 | 1.2 | C-1 | 0.2 | — | 0 | PGMEA/PGME = 80/20 | 8% |
| Example 118 | A-1 | 98.6 | B-1 | 1.2 | C-1 | 0.2 | — | 0 | PGMEA/PGME = 80/20 | 8% |
| Comparative Example 1 | A-1 | 98.6 | B-a | 1.2 | C-1 | 0.2 | — | 0 | PGMEA/PGME = 80/20 | 4% |
| Comparative Example 2 | A-1 | 98.6 | B-b | 1.2 | C-1 | 0.2 | — | 0 | PGMEA/PGME = 80/20 | 4% |
| Comparative Example 3 | A-1 | 98.6 | B-c | 1.2 | C-1 | 0.2 | — | 0 | PGMEA/PGME = 80/20 | 4% |

The components and abbreviations in Tables 1 to 3 are as follows.
The structures of the resins are as follows.
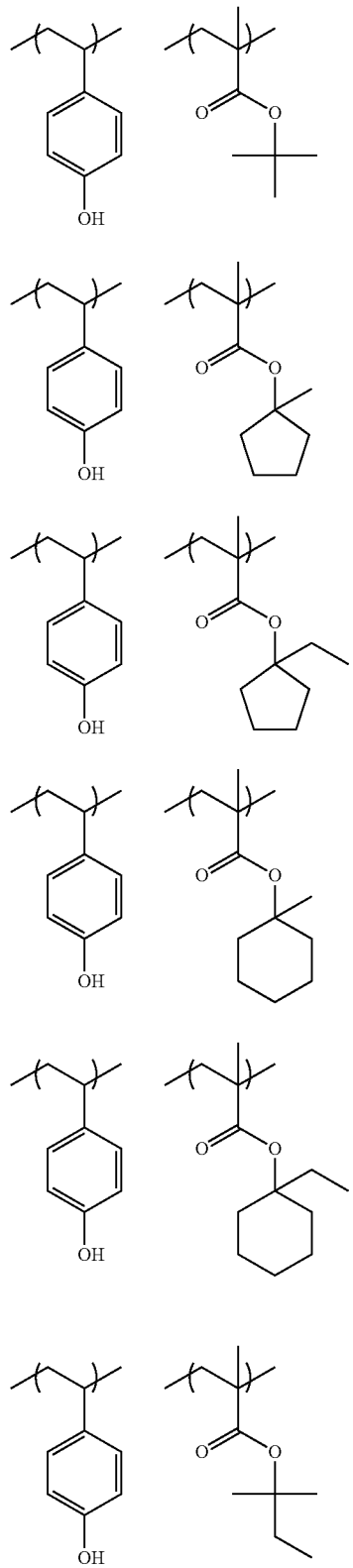
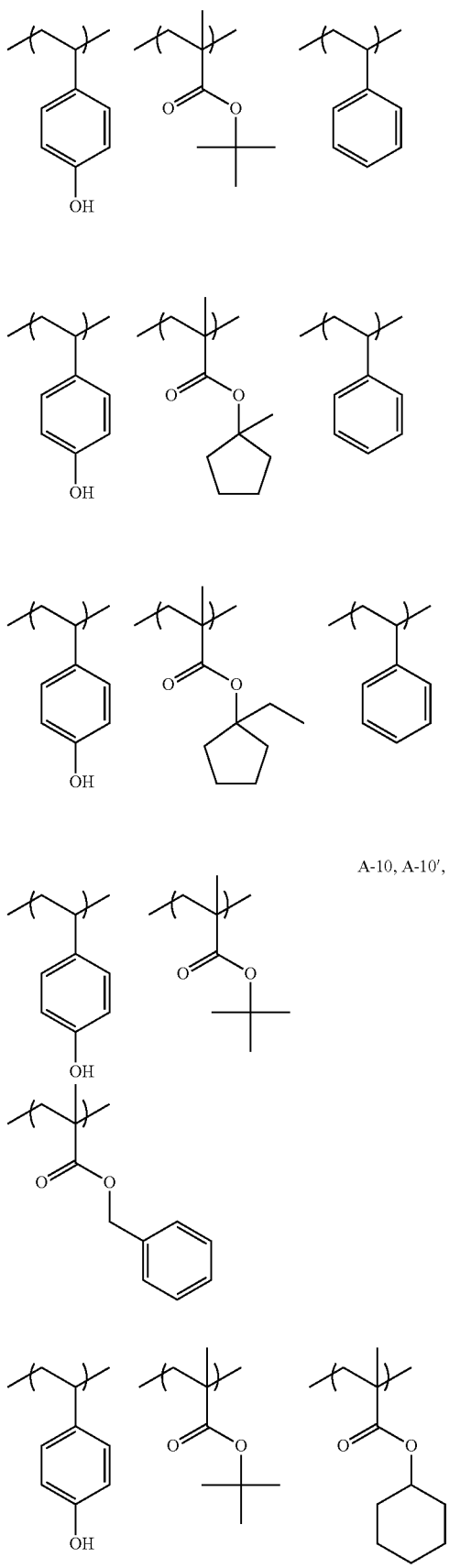

A-12
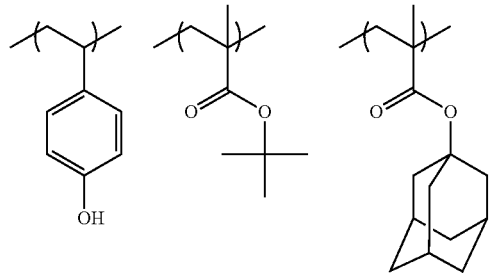
A-13
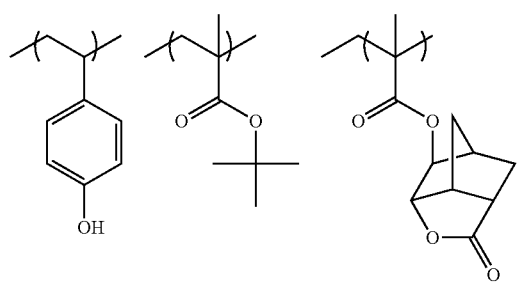
A-14, A-14', A-14'', A-14'''
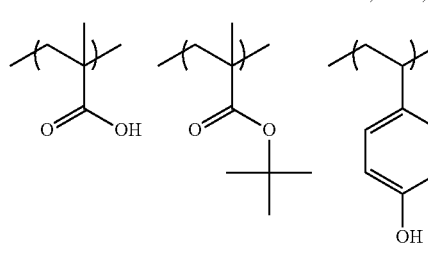
A-15
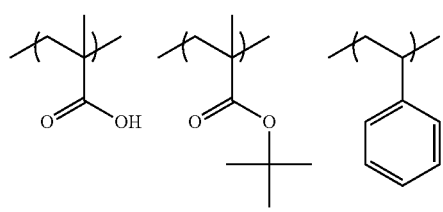
A-16
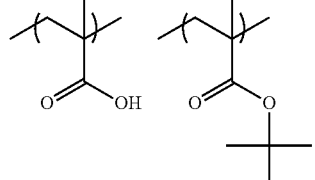
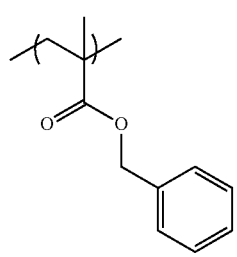
A-17
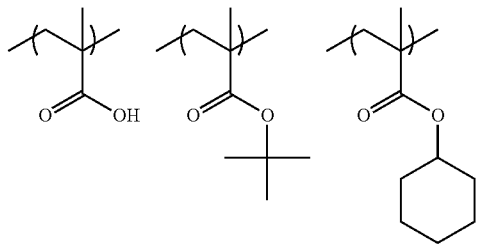
A-18
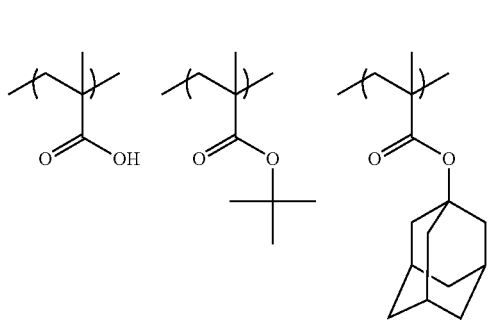
A-19
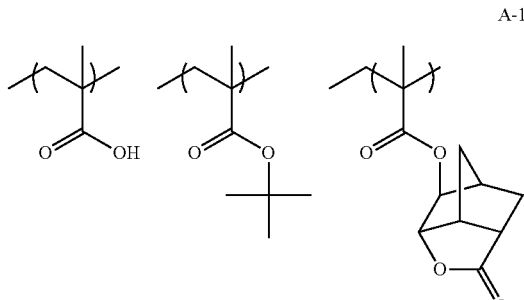
A-20
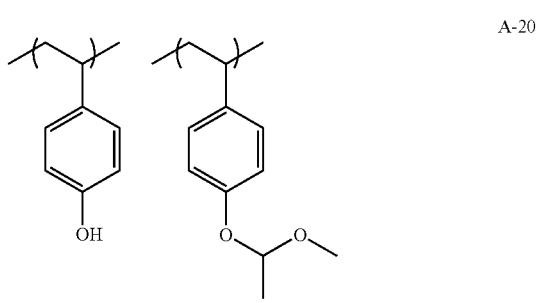
A-21
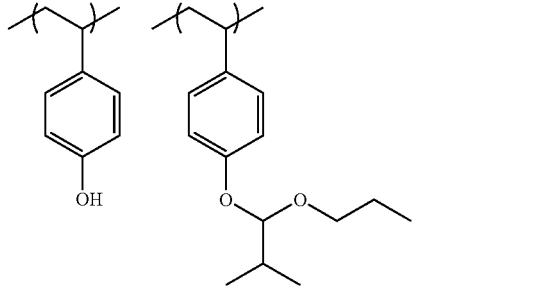

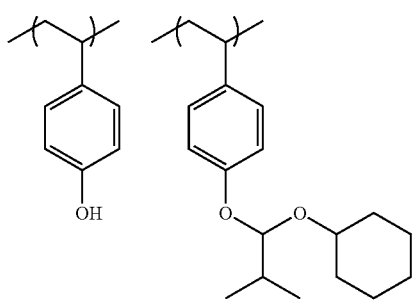

A-22

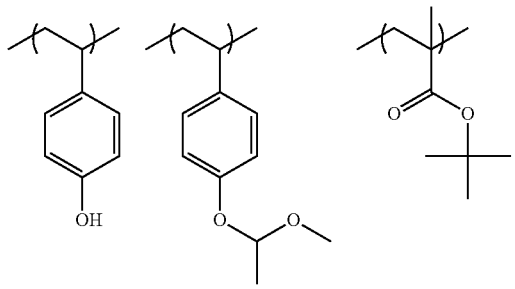

A-23

Hereinafter, the compositional ratios (molar ratios), the weight-average molecular weights (Mw), and the dispersities (Mw/Mn) of the above-mentioned resins are shown in Table 4. Here, the molar ratios of the repeating units correspond to repeating units in order from the left side. The resins A-1', A-1", and A-1'" have the same repeating units as for the resin A-1, the resins A-10' and A-10" have the same repeating units as for the resin A-10, and the resins A-14', A-14", and A-14'" have the same repeating units as for the resin A-14.

TABLE 4

| | Composition | Mw | Mw/Mn |
|---|---|---|---|
| A-1 | 75/25 | 21,000 | 1.3 |
| A-1' | 75/25 | 15,000 | 1.3 |
| A-1" | 75/25 | 10,000 | 1.3 |
| A-1'" | 70/30 | 21,000 | 1.3 |
| A-2 | 75/25 | 21,000 | 1.3 |
| A-3 | 75/25 | 21,000 | 1.3 |
| A-4 | 75/25 | 21,000 | 1.3 |
| A-5 | 75/75 | 21,000 | 1.3 |
| A-6 | 75/25 | 21,000 | 1.3 |
| A-7 | 65/25/10 | 21,000 | 1.3 |
| A-8 | 65/25/10 | 21,000 | 1.3 |
| A-9 | 65/25/10 | 21,000 | 1.3 |
| A-10 | 65/25/10 | 21,000 | 1.4 |
| A-10' | 55/25/20 | 21,000 | 1.4 |
| A-10" | 55/35/10 | 21,000 | 1.4 |
| A-11 | 65/25/10 | 13,000 | 1.4 |
| A-12 | 65/25/10 | 13,000 | 1.4 |
| A-13 | 65/25/10 | 13,000 | 1.4 |
| A-14 | 40/50/10 | 13,000 | 1.4 |
| A-14' | 40/50/10 | 1,0000 | 1.4 |
| A-14" | 40/50/10 | 15,000 | 1.4 |
| A-14'" | 30/60/10 | 15,000 | 1.4 |
| A-15 | 40/50/10 | 13,000 | 1.4 |
| A-16 | 40/50/10 | 13,000 | 1.4 |
| A-17 | 40/50/10 | 13,000 | 1.4 |
| A-18 | 40/50/10 | 13,000 | 1.4 |
| A-19 | 40/50/10 | 13,000 | 1.4 |
| A-20 | 65/35 | 14,000 | 1.4 |
| A-21 | 65/35 | 14,000 | 1.4 |

TABLE 4-continued

| | Composition | Mw | Mw/Mn |
|---|---|---|---|
| A-22 | 65/35 | 14,000 | 1.4 |
| A-23 | 65/25/10 | 14,000 | 1.4 |

The structures of the acid generators are as follows.

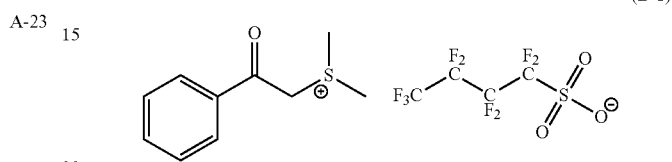

(B-1)

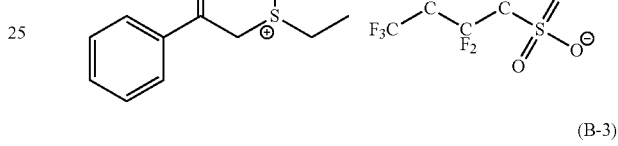

(B-2)

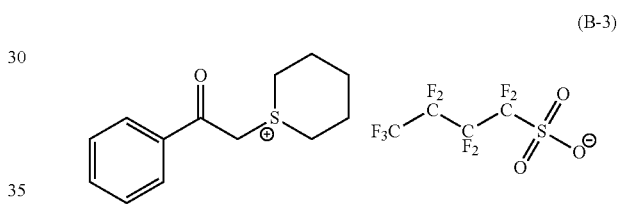

(B-3)

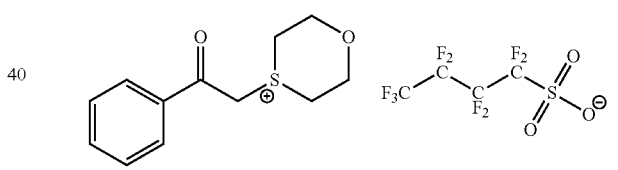

(B-4)

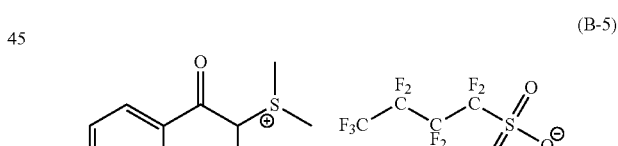

(B-5)

(B-6)

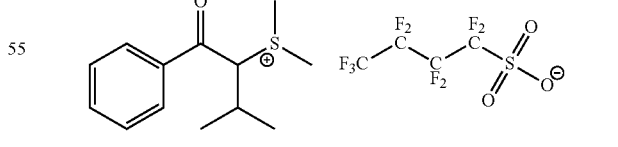

(B-7)

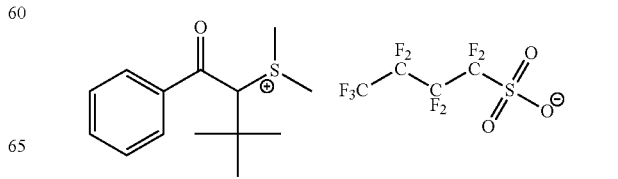

(B-8)
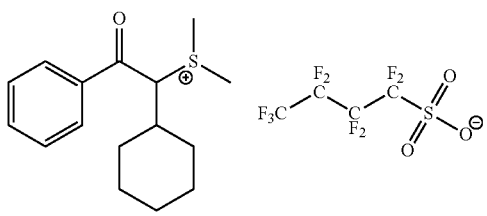
(B-9)
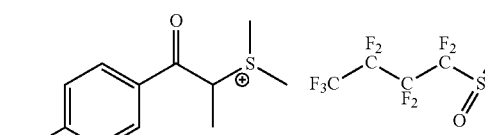
(B-10)
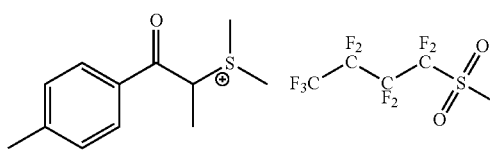
(B-11)
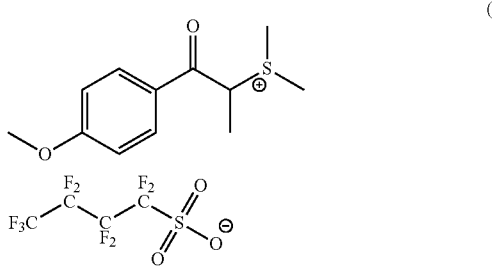
(B-12)
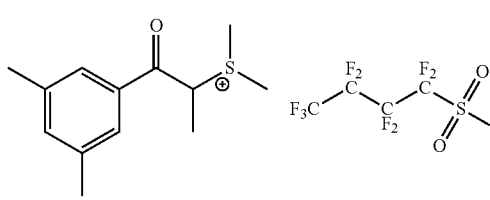
(B-13)
(B-14)
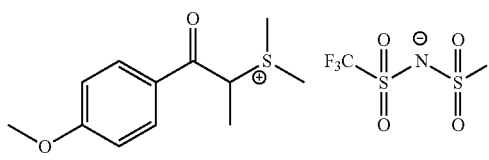
(B-15)
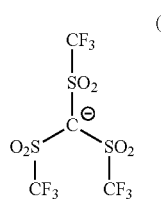
(B-16)
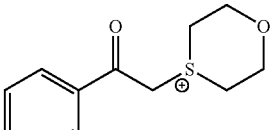
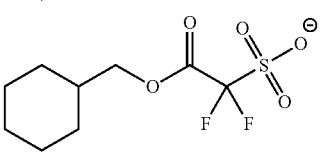
(B-a)
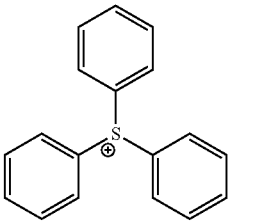
(B-b)
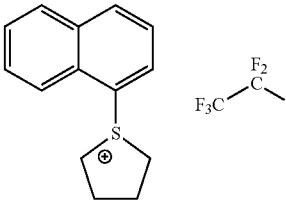
(B-c)
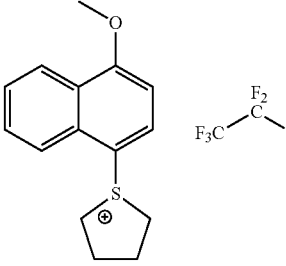
(B-d)
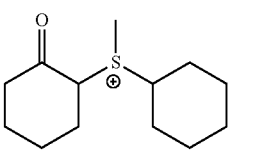 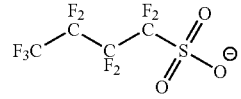
The structures of the acid diffusion control agents are as follows.
(C-1)
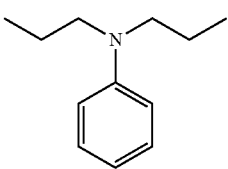

-continued (C-2) 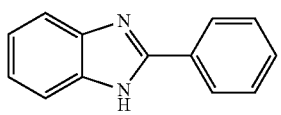

(C-3) 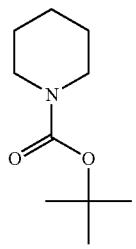

(C-4) 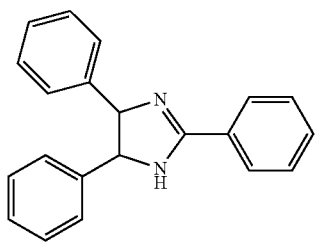

(C-5) 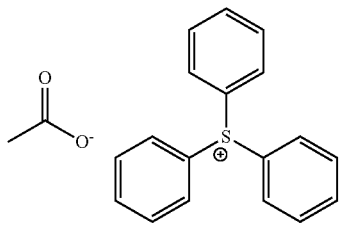

(C-6) 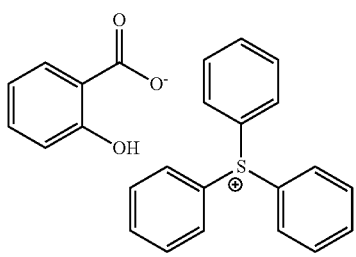

(C-7) 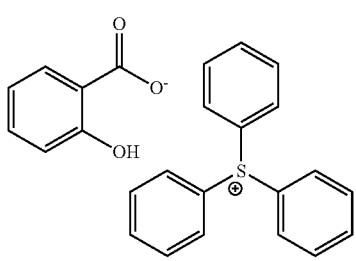

-continued (C-8) 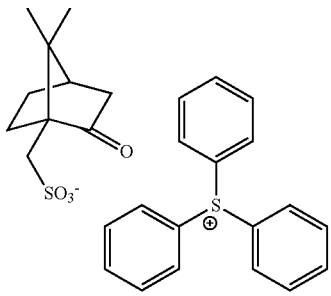

(C-9) 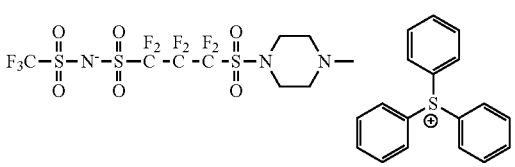

The structures of the additives are as follows.

(D-1) 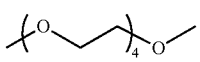

(D-2) 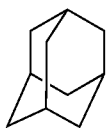

(D-3) 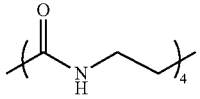

The solvents are as follows.
PGMEA: Propylene glycol monomethyl ether acetate
PGME: Propylene glycol monomethyl ether
EL: Ethyl lactate
EEP: Ethyl 3-ethoxypropionate
CyHx: Cyclohexanone
GBL: γ-Butyrolactone Evaluation Formation of Patterns (1) Formation of Positive Tone Patterns (Examples 1 to 59, 62, 64, 66, 68, 70, 72, 74, 76, and 78 to 117, and Comparative Examples 1 to 3)

An antireflection layer was not applied onto an Si substrate (manufactured by Advanced Materials Technology) which had been subjected to a hexamethyldisilazane treatment, and the resist composition prepared above was applied thereto and baked (prebaked; PB) at a temperature (° C.) described in Tables 5 to 7 below for 60 seconds to form an actinic ray-sensitive or radiation-sensitive film (resist film) having a film thickness described in Tables 5 to 7 below. The wafer having the resist film formed thereon was subjected to pattern exposure through an exposure mask, using a KrF excimer laser scanner (manufactured by ASML, PAS5500/850C, wavelength of 248 nm, NA 0.80). Thereafter, the wafer was baked (post-exposure baked; PEB) at a temperature (° C.) described in Tables 5 to 7 below for 60 seconds, then developed with a 2.38%-by-mass aqueous tetramethylammoniumhydroxide solution (TMAHaq) for 60 sec, rinsed with pure water, and then spin-dried to obtain a isolated space pattern having a space of 3 μm and a pitch of 33 μm.

(2) Formation of Negative Tone Patterns (Examples 60, 61, 63, 65, 67, 69, 71, 73, 75, and 77)

By the same procedure as in (1) above except that an exposure mask in which the light-transmitted area and the light-shielded area of the exposure mask in (1) were inverted was used, TMAHaq was changed to an organic developer described in Table 6, and rinsing was performed using 4-methyl-2-pentanol, an isolated space pattern having a space of 3 μm and a pitch of 33 μm was obtained.

In Table 6 below, nBA represents butyl n-acetate and MAK represents 2-heptanone (methyl amyl ketone).

<Evaluation>
(Sensitivity)
Exposure was performed through a mask having a line-and-space pattern such that a space pattern after a reduction projection exposure became 3 μm and a pitch became 33 μm, with an exposure dose such that a space pattern thus formed became 3 μm and a pitch became 33 μm, respectively, as an optimal exposure, and the optimal exposure dose was defined as a sensitivity (mJ/cm$^2$). The space pattern width was measured using a scanning electron microscope (SEM) (938011, manufactured by Hitachi, Ltd.). A smaller value of the sensitivity was evaluated to be better.

(Cross-Sectional Shape of Isolated Space Pattern)
A wafer having the isolated space pattern formed with regard to the sensitivity was fractured, and the isolated space pattern at 3 μm from the fractured surface was observed using a scanning electron microscope (SEM) and evaluated as follows: A: being rectangular, B: being slightly tapered, and C: having occurrence of film reduction.

(Transmittance with Respect to Light at Wavelength of 248 nm)
The resist composition prepared by the above method was applied onto a quartz glass substrate by spin coating and pre-baked at a temperature (° C.) described in Tables 5 to 7 below for 60 seconds to form an actinic ray-sensitive or radiation-sensitive film (resist film) having a film thickness described in Tables 5 to 7 below. The transmittance of the film at a wavelength of 248 nm was measured. For the measurement of the transmittance, an absorption spectrophotometer (manufactured by Shimadzu Corporation) was used.

TABLE 5

| | Film thickness | Transmittance of film with respect to light at wavelength of 248 nm | PB | PEB | Developer | Sensitivity (mJ/cm$^2$) | Isolated space cross-sectional shape |
|---|---|---|---|---|---|---|---|
| Example 1 | 10 μm | 11% | 130 | 120 | TMAHaq | 35 | B |
| Example 2 | 10 μm | 11% | 130 | 120 | TMAHaq | 35 | B |
| Example 3 | 10 μm | 11% | 130 | 120 | TMAHaq | 35 | B |
| Example 4 | 10 μm | 11% | 130 | 120 | TMAHaq | 41 | B |
| Example 5 | 10 μm | 11% | 130 | 120 | TMAHaq | 30 | B |
| Example 6 | 10 μm | 11% | 130 | 120 | TMAHaq | 38 | B |
| Example 7 | 10 μm | 11% | 130 | 120 | TMAHaq | 32 | B |
| Example 8 | 10 μm | 11% | 130 | 120 | TMAHaq | 36 | B |
| Example 9 | 10 μm | 11% | 130 | 120 | TMAHaq | 36 | B |
| Example 10 | 10 μm | 11% | 130 | 120 | TMAHaq | 36 | B |
| Example 11 | 10 μm | 11% | 130 | 120 | TMAHaq | 36 | B |
| Example 12 | 10 μm | 11% | 130 | 120 | TMAHaq | 36 | B |
| Example 13 | 10 μm | 11% | 130 | 120 | TMAHaq | 36 | B |
| Example 14 | 10 μm | 11% | 130 | 120 | TMAHaq | 35 | B |
| Example 15 | 10 μm | 11% | 130 | 120 | TMAHaq | 37 | B |
| Example 16 | 10 μm | 11% | 130 | 120 | TMAHaq | 35 | B |
| Example 17 | 10 μm | 11% | 130 | 120 | TMAHaq | 36 | B |
| Example 18 | 10 μm | 11% | 130 | 120 | TMAHaq | 35 | B |
| Example 19 | 10 μm | 11% | 130 | 120 | TMAHaq | 35 | B |
| Example 20 | 10 μm | 11% | 130 | 120 | TMAHaq | 37 | B |
| Example 21 | 10 μm | 11% | 130 | 120 | TMAHaq | 36 | B |
| Example 22 | 10 μm | 11% | 130 | 120 | TMAHaq | 37 | B |
| Example 23 | 10 μm | 11% | 130 | 120 | TMAHaq | 34 | B |
| Example 24 | 10 μm | 11% | 130 | 120 | TMAHaq | 36 | B |
| Example 25 | 10 μm | 11% | 130 | 120 | TMAHaq | 38 | B |
| Example 26 | 10 μm | 11% | 130 | 120 | TMAHaq | 34 | B |
| Example 27 | 10 μm | 11% | 130 | 120 | TMAHaq | 35 | B |
| Example 28 | 10 μm | 11% | 130 | 120 | TMAHaq | 35 | B |
| Example 29 | 10 μm | 11% | 130 | 120 | TMAHaq | 30 | A |
| Example 30 | 10 μm | 11% | 130 | 120 | TMAHaq | 33 | A |
| Example 31 | 10 μm | 11% | 130 | 120 | TMAHaq | 30 | A |
| Example 32 | 10 μm | 11% | 130 | 120 | TMAHaq | 33 | A |
| Example 33 | 10 μm | 11% | 130 | 120 | TMAHaq | 33 | A |
| Example 34 | 10 μm | 11% | 130 | 120 | TMAHaq | 33 | A |
| Example 35 | 10 μm | 11% | 130 | 120 | TMAHaq | 33 | A |
| Example 36 | 10 μm | 10% | 130 | 120 | TMAHaq | 42 | B |
| Example 37 | 10 μm | 10% | 130 | 120 | TMAHaq | 42 | B |
| Example 38 | 10 μm | 11% | 130 | 120 | TMAHaq | 48 | A |
| Example 39 | 10 μm | 10% | 130 | 120 | TMAHaq | 42 | B |
| Example 40 | 10 μm | 11% | 130 | 120 | TMAHaq | 48 | A |

TABLE 6

|  | Film thickness | Transmittance of film with respect to light at wavelength of 248 nm | PB | PEB | Developer | Sensitivity (mJ/cm$^2$) | Isolated space cross-sectional shape |
|---|---|---|---|---|---|---|---|
| Example 41 | 10 μm | 11% | 130 | 120 | TMAHaq | 33 | A |
| Example 42 | 10 μm | 11% | 130 | 120 | TMAHaq | 35 | B |
| Example 43 | 10 μm | 11% | 130 | 120 | TMAHaq | 36 | B |
| Example 44 | 10 μm | 11% | 130 | 120 | TMAHaq | 38 | B |
| Example 45 | 10 μm | 11% | 130 | 120 | TMAHaq | 34 | B |
| Example 46 | 10 μm | 11% | 130 | 120 | TMAHaq | 36 | B |
| Example 47 | 10 μm | 11% | 130 | 120 | TMAHaq | 36 | B |
| Example 48 | 10 μm | 11% | 130 | 120 | TMAHaq | 37 | B |
| Example 49 | 10 μm | 11% | 130 | 120 | TMAHaq | 35 | B |
| Example 50 | 10 μm | 11% | 130 | 120 | TMAHaq | 35 | B |
| Example 51 | 10 μm | 11% | 130 | 120 | TMAHaq | 35 | B |
| Example 52 | 10 μm | 11% | 130 | 120 | TMAHaq | 35 | B |
| Example 53 | 10 μm | 11% | 130 | 120 | TMAHaq | 35 | B |
| Example 54 | 10 μm | 11% | 130 | 120 | TMAHaq | 38 | B |
| Example 55 | 10 μm | 11% | 130 | 120 | TMAHaq | 34 | B |
| Example 56 | 10 μm | 11% | 130 | 120 | TMAHaq | 36 | B |
| Example 57 | 10 μm | 11% | 130 | 120 | TMAHaq | 35 | B |
| Example 58 | 10 μm | 11% | 130 | 120 | TMAHaq | 35 | B |
| Example 59 | 10 μm | 11% | 130 | 120 | TMAHaq | 35 | B |
| Example 60 | 10 μm | 11% | 130 | 120 | TMAHaq | 35 | B |
| Example 61 | 10 μm | 11% | 130 | 120 | nBA | 58 | B |
| Example 62 | 10 μm | 11% | 130 | 120 | MAK | 75 | B |
| Example 63 | 10 μm | 11% | 130 | 120 | TMAHaq | 35 | B |
| Example 64 | 10 μm | 11% | 130 | 120 | nBA | 35 | B |
| Example 65 | 10 μm | 11% | 130 | 120 | TMAHaq | 35 | B |
| Example 66 | 10 μm | 11% | 130 | 120 | nBA | 35 | B |
| Example 67 | 10 μm | 11% | 130 | 120 | TMAHaq | 35 | B |
| Example 68 | 10 μm | 11% | 130 | 120 | nBA | 35 | B |
| Example 69 | 10 μm | 11% | 130 | 110 | TMAHaq | 35 | B |
| Example 70 | 10 μm | 11% | 130 | 110 | nBA | 58 | B |
| Example 71 | 10 μm | 11% | 130 | 110 | TMAHaq | 35 | B |
| Example 72 | 10 μm | 11% | 130 | 110 | nBA | 58 | B |
| Example 73 | 10 μm | 11% | 130 | 110 | TMAHaq | 35 | B |
| Example 74 | 10 μm | 11% | 130 | 110 | nBA | 58 | B |
| Example 75 | 10 μm | 11% | 130 | 110 | TMAHaq | 35 | B |
| Example 76 | 10 μm | 11% | 130 | 110 | nBA | 58 | B |
| Example 77 | 10 μm | 11% | 130 | 110 | TMAHaq | 35 | B |
| Example 78 | 10 μm | 11% | 130 | 110 | nBA | 58 | B |

TABLE 7

|  | Film thickness | Transmittance of film with respect to light at wavelength of 248 nm | PB | PEB | Developer | Sensitivity (mJ/cm$^2$) | Isolated space cross-sectional shape |
|---|---|---|---|---|---|---|---|
| Example 79 | 10 μm | 11% | 130 | 100 | TMAHaq | 36 | B |
| Example 80 | 10 μm | 11% | 130 | 100 | TMAHaq | 35 | B |
| Example 81 | 10 μm | 11% | 130 | 100 | TMAHaq | 34 | B |
| Example 82 | 10 μm | 11% | 130 | 100 | TMAHaq | 36 | B |
| Example 83 | 10 μm | 11% | 130 | 100 | TMAHaq | 36 | B |
| Example 84 | 10 μm | 11% | 130 | 100 | TMAHaq | 35 | B |
| Example 85 | 10 μm | 11% | 130 | 100 | TMAHaq | 34 | B |
| Example 86 | 10 μm | 11% | 130 | 110 | TMAHaq | 34 | B |
| Example 87 | 10 μm | 11% | 130 | 120 | TMAHaq | 34 | B |
| Example 88 | 10 μm | 11% | 130 | 120 | TMAHaq | 35 | B |
| Example 89 | 10 μm | 11% | 130 | 120 | TMAHaq | 35 | B |
| Example 90 | 10 μm | 11% | 130 | 120 | TMAHaq | 30 | B |
| Example 91 | 10 μm | 11% | 130 | 120 | TMAHaq | 33 | B |
| Example 92 | 10 μm | 11% | 130 | 120 | TMAHaq | 36 | B |
| Example 93 | 10 μm | 11% | 130 | 120 | TMAHaq | 35 | B |
| Example 94 | 10 μm | 11% | 130 | 120 | TMAHaq | 36 | B |
| Example 95 | 10 μm | 11% | 130 | 120 | TMAHaq | 34 | B |
| Example 96 | 10 μm | 11% | 130 | 120 | TMAHaq | 33 | B |
| Example 97 | 10 μm | 11% | 130 | 120 | TMAHaq | 33 | B |
| Example 98 | 10 μm | 11% | 130 | 120 | TMAHaq | 35 | B |
| Example 99 | 10 μm | 11% | 130 | 120 | TMAHaq | 35 | B |
| Example 100 | 10 μm | 11% | 130 | 120 | TMAHaq | 35 | B |
| Example 101 | 10 μm | 11% | 130 | 120 | TMAHaq | 35 | B |
| Example 102 | 10 μm | 11% | 130 | 120 | TMAHaq | 34 | B |
| Example 103 | 10 μm | 11% | 130 | 120 | TMAHaq | 38 | B |
| Example 104 | 10 μm | 11% | 130 | 120 | TMAHaq | 38 | B |
| Example 105 | 10 μm | 11% | 130 | 120 | TMAHaq | 38 | B |
| Example 106 | 10 μm | 11% | 130 | 120 | TMAHaq | 37 | B |

TABLE 7-continued

| | Film thickness | Transmittance of film with respect to light at wavelength of 248 nm | PB | PEB | Developer | Sensitivity (mJ/cm$^2$) | Isolated space cross-sectional shape |
|---|---|---|---|---|---|---|---|
| Example 107 | 10 μm | 11% | 130 | 120 | TMAHaq | 37 | B |
| Example 108 | 12 μm | 9% | 130 | 120 | TMAHaq | 52 | B |
| Example 109 | 8 μm | 14% | 130 | 120 | TMAHaq | 27 | A |
| Example 110 | 6 μm | 24% | 130 | 120 | TMAHaq | 27 | A |
| Example 111 | 10 μm | 11% | 140 | 120 | TMAHaq | 35 | B |
| Example 112 | 10 μm | 11% | 150 | 120 | TMAHaq | 35 | B |
| Example 113 | 10 μm | 11% | 150 | 130 | TMAHaq | 35 | B |
| Example 114 | 10 μm | 11% | 120 | 120 | TMAHaq | 35 | B |
| Example 115 | 10 μm | 11% | 110 | 120 | TMAHaq | 35 | B |
| Example 116 | 10 μm | 11% | 130 | 100 | TMAHaq | 35 | B |
| Example 117 | 10 μm | 11% | 130 | 110 | TMAHaq | 35 | B |
| Example 118 | 10 μm | 11% | 130 | 130 | TMAHaq | 35 | B |
| Comparative Example 1 | 10 μm | 5% | 130 | 120 | TMAHaq | >100 | C |
| Comparative Example 2 | 10 μm | 5% | 130 | 120 | TMAHaq | >100 | C |
| Comparative Example 3 | 10 μm | 5% | 130 | 120 | TMAHaq | >100 | C |

From the above results, it could be seen that Examples 1 to 117 using an actinic ray-sensitive or radiation-sensitive resin composition, in which a transmittance with respect to light at a wavelength of 248 nm in the actinic ray-sensitive or radiation-sensitive film having a film thickness of 12 μm is 5% or more, an excellent sensitivity and an excellent cross-sectional shape of an isolated space pattern can be satisfied at the same time in a case where an actinic ray-sensitive or radiation-sensitive film having a film thickness of 1 μm or more is formed, as compared with Comparative Examples 1 to 3 not satisfying the requirements, In addition, according to Examples 1 to 117, even in the formation of a dense pattern having a ratio of a line width to a space width of about 1:1, an excellent sensitivity and an excellent cross-sectional shape can be satisfied at the same time.

According to the present invention, it is possible to provide an actinic ray-sensitive or radiation-sensitive resin composition capable of forming a pattern having an excellent sensitivity as well as an excellent cross-sectional shape in a case where an actinic ray-sensitive or radiation-sensitive film having a film thickness of 1 μm or more is exposed to light at a wavelength of 200 to 300 nm, as well as a pattern forming method and a method for manufacturing an electronic device, each using the same.

Although the present invention has been described in detail and with reference to specific embodiments, it is obvious to those skilled in the art that various changes or modifications can be made without departing from the spirit and scope of the present invention.

What is claimed is:

1. An actinic ray-sensitive or radiation-sensitive resin composition for forming an actinic ray-sensitive or radiation-sensitive film having a film thickness of 1 μm or more to be exposed to actinic rays having a wavelength of 200 to 300 nm or radiation, comprising:
   a resin (A); and
   a compound (B) that generates an acid upon irradiation with actinic rays or radiation,
   wherein a compound represented by General Formula (ZI-3) is contained as the compound (B),

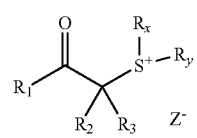

(ZI-3)

in General Formula (ZI-3), $R_1$ represents an alkyl group, a cycloalkyl group, a cycloalkoxy group, an aryl group, or an alkenyl group, $R_2$ and $R_3$ each independently represents a hydrogen atom, an alkyl group, a cycloalkyl group, or an aryl group, $R_2$ and $R_3$ may be linked to each other to form a ring, and $R_1$ and $R_2$ may be linked to each other to form a ring, $R_x$ and $R_y$ each independently represents an alkyl group, a cycloalkyl group, an alkenyl group, or an aryl group, $R_x$ and $R_y$ may be linked to each other to form a ring, and this ring structure may include an oxygen atom, a nitrogen atom, a sulfur atom, a ketone group, an ether bond, an ester bond, or an amide bond, and $Z^-$ represents a non-nucleophilic anion represented by any one of General Formulae (2) to (4),

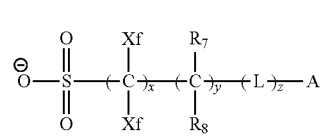

(2)

in the general formula,

Xf's each independently represent a fluorine atom, or an alkyl group substituted with at least one fluorine atom, and Xf's that are present in plural numbers may be the same as or different from each other, $R_7$ and $R_8$ each independently represents a hydrogen atom, a fluorine atom, an alkyl group, or an alkyl group substituted with at least one fluorine atom, and in a case where $R_7$'s and $R_8$'s are present in plural numbers, they may be the same as or different from each other, L represents a divalent linking group selected from the group consisting of —COO—, —OCO—, —O—, —S—, —SO—, —SO$_2$—, —N(Ri)- (in which Ri represents a hydrogen atom or an alkyl group), an alkylene group, a cycloalkylene group, an alkenylene group, and a divalent linking group obtained by combining a plurality of the groups, A represents an organic group including a cyclic structure, and x represents an integer of 1 to 20, y represents an integer of 0 to 10; z represents an integer of 0 to 10; provided that in a case where L of General Formula (2) is —COO—, x represents 1, and R$_7$ and R$_8$ each independently represents a hydrogen atom, an alkyl group, or an alkyl group substituted with at least one fluorine atom, and in a case where R$_7$'s and R$_8$'s are present in plural numbers, they may be the same as or different from each other,

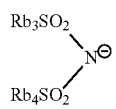

(3)

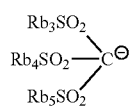

(4)

in the formulae, Rb$_3$ to Rb$_5$ each independently represents an alkyl group, a cycloalkyl group, or an aryl group, and Rb$_3$ and Rb$_4$ may be bonded to each other to form a ring structure, wherein a transmittance of the actinic ray-sensitive or radiation-sensitive film which is formed by the actinic ray-sensitive or radiation-sensitive resin composition and has a film thickness of 12 μm, with respect to light at a wavelength of 248 nm, is 5% or more.

2. The actinic ray-sensitive or radiation-sensitive resin composition according to claim 1, further comprising a resin having a repeating unit represented by General Formula (AI) or (A),

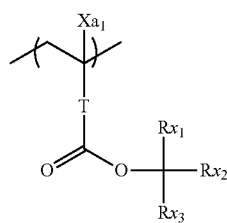

(AI)

in the formula, Xa$_1$ represents a hydrogen atom or an alkyl group,

T represents a single bond or a divalent linking group,

Rx$_1$ to Rx$_3$ each independently represents an alkyl group or a cycloalkyl group, and two of Rx$_1$ to Rx$_3$ may be bonded to each other to form a cycloalkyl group,

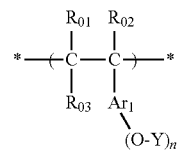

(A)

in the formula, R$_{01}$, R$_{02}$, and R$_{03}$ each independently represents a hydrogen atom, an alkyl group, a cycloalkyl group, a halogen atom, a cyano group, or an alkoxycarbonyl group, Ar$_1$ represents an aromatic ring group, and R$_{03}$ may represent an alkylene group and be bonded to Ar$_1$ to form a 5- or 6-membered ring together with a —C—C— chain, n Y's each independently represent a hydrogen atom or a group that leaves by the action of an acid, provided that at least one of Y's represents a group that leaves by the action of an acid, and n represents an integer of 1 to 4.

3. The actinic ray-sensitive or radiation-sensitive resin composition according to claim 2, wherein the group that leaves by the action of an acid as at least one of Y's is a structure represented by General Formula (B),

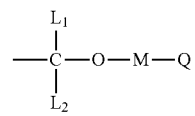

(B)

in the formula, L$_1$ and L$_2$ each independently represents a hydrogen atom, an alkyl group, a cycloalkyl group, an aryl group, or an aralkyl group, M represents a single bond or a divalent linking group, Q represents an alkyl group, a cycloalkyl group, a cyclic aliphatic group, an aromatic ring group, an amino group, an ammonium group, a mercapto group, a cyano group, or an aldehyde group, and the cyclic aliphatic group and the aromatic ring group may include a heteroatom, and at least two of Q, M, and L$_1$ may be bonded to each other to form a 5- or 6-membered ring.

4. The actinic ray-sensitive or radiation-sensitive resin composition of claim 1, wherein R$_x$ and R$_y$ in General Formula (ZI-3) represent an alkyl group, R$_x$ and R$_y$ are linked to each other to form a ring, and this ring structure includes an oxygen atom, a nitrogen atom, a sulfur atom, a ketone group, an ether bond, an ester bond, or an amide bond.

5. A pattern forming method comprising:
(i) a step of forming an actinic ray-sensitive or radiation-sensitive film having a film thickness of 1 μm or more on a substrate, using an actinic ray-sensitive or radiation-sensitive resin composition;
(ii) a step of irradiating the actinic ray-sensitive or radiation-sensitive film with actinic rays having a wavelength of 200 to 300 nm or radiation; and
(iii) a step of developing the actinic ray-sensitive or radiation-sensitive film irradiated with actinic rays or radiation with a developer, wherein the actinic ray-sensitive or radiation-sensitive resin composition is an actinic ray-sensitive or radiation-sensitive resin composition comprising:

a resin (A); and a compound (B) that generates an acid upon irradiation with actinic rays or radiation, wherein a compound represented by General Formula (ZI-3) is contained as the compound (B),

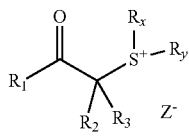
(ZI-3)

in General Formula (ZI-3), $R_1$ represents an alkyl group, a cycloalkyl group, a cycloalkoxy group, an aryl group, or an alkenyl group, $R_2$ and $R_3$ each independently represents a hydrogen atom, an alkyl group, a cycloalkyl group, or an aryl group, $R_2$ and $R_3$ may be linked to each other to form a ring, and $R_1$ and $R_2$ may be linked to each other to form a ring, $R_x$ and $R_y$ each independently represents an alkyl group, a cycloalkyl group, an alkenyl group, or an aryl group, $R_x$ and $R_y$ may be linked to each other to form a ring, and this ring structure may include an oxygen atom, a nitrogen atom, a sulfur atom, a ketone group, an ether bond, an ester bond, or an amide bond, and $Z^-$ represents a non-nucleophilic anion represented by any one of General Formulae (2) to (4),

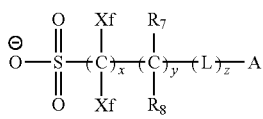
(2)

in the general formula,

Xf's each independently represent a fluorine atom, or an alkyl group substituted with at least one fluorine atom, and Xf's that are present in plural numbers may be the same as or different from each other, $R_7$ and $R_8$ each independently represents a hydrogen atom, a fluorine atom, an alkyl group, or an alkyl group substituted with at least one fluorine atom, and in a case where $R_7$'s and $R_8$'s are present in plural numbers, they may be the same as or different from each other, L represents a divalent linking group selected from the group consisting of —COO—, —OCO—, —O—, —S—, —SO—, —SO$_2$—, —N(Ri)- (in which Ri represents a hydrogen atom or an alkyl group), an alkylene group, a cycloalkylene group, an alkenylene group, and a divalent linking group obtained by combining a plurality of the groups, A represents an organic group including a cyclic structure, and x represents an integer of 1 to 20, y represents an integer of 0 to 10; z represents an integer of 0 to 10; provided that in a case where L of General Formula (2) is —COO—, x represents 1, and $R_7$ and $R_8$ each independently represents a hydrogen atom, an alkyl group, or an alkyl group substituted with at least one fluorine atom, and in a case where $R_7$'s and $R_8$'s are present in plural numbers, they may be the same as or different from each other,

(3)

(4)

in the formulae, $Rb_3$ to $Rb_5$ each independently represents an alkyl group, a cycloalkyl group, or an aryl group, and $Rb_3$ and $Rb_4$ may be bonded to each other to form a ring structure, wherein a transmittance of the actinic ray-sensitive or radiation-sensitive film which is formed by the actinic ray-sensitive or radiation-sensitive resin composition and has a film thickness of 12 μm, with respect to light at a wavelength of 248 nm, is 5% or more.

6. The pattern forming method of claim 5, wherein $R_x$ and $R_y$ in General Formula (ZI-3) represent an alkyl group, $R_x$ and $R_y$ are linked to each other to form a ring, and this ring structure includes an oxygen atom, a nitrogen atom, a sulfur atom, a ketone group, an ether bond, an ester bond, or an amide bond.

7. A method for manufacturing an electronic device, comprising the pattern forming method according to claim 5.

* * * * *